United States Patent [19]

Imamura

[11] Patent Number: 5,432,356
[45] Date of Patent: Jul. 11, 1995

[54] SEMICONDUCTOR HETEROJUNCTION FLOATING LAYER MEMORY DEVICE AND METHOD FOR STORING INFORMATION IN THE SAME

[75] Inventor: Kenichi Imamura, Kawasaki, Japan
[73] Assignee: Fujitsu Limited, Kawasaki, Japan
[21] Appl. No.: 222,634
[22] Filed: Apr. 4, 1994

[30] Foreign Application Priority Data

Apr. 2, 1993 [JP] Japan .................. 5-076935
Sep. 16, 1993 [JP] Japan .................. 5-229786
Oct. 26, 1993 [JP] Japan .................. 5-267336

[51] Int. Cl.⁶ .............................. H01L 29/205
[52] U.S. Cl. .............................. 257/24; 257/191; 257/194
[58] Field of Search ............. 257/191, 194, 192, 24, 257/25

[56] References Cited

U.S. PATENT DOCUMENTS 4,905,063 2/1990 Beltram ...................... 257/191
5,254,863 10/1993 Battersby .................. 257/194

Primary Examiner—Robert P. Limanek
Attorney, Agent, or Firm—Armstrong, Westerman, Hattori, McLeland & Naughton

[57] ABSTRACT

A semiconductor memory device comprises a non-doped thick barrier layer formed on the semiconductor substrate, an impurity doped floating conducting layer formed on the thick barrier layer, a thin barrier layer formed on the floating conducting layer and having an asymmetric barrier whose barrier height is higher on the side of the floating conducting layer, a channel layer formed on the thin barrier layer, and a first electrode and a second electrode formed on the channel layer. A write bias voltage which makes a potential of the second electrode higher than that of the first electrode is applied so as to inject electrons from the first electrode to the floating conducting layer through the thin barrier layer, thereby writing information in the floating conducting layer. A read bias voltage lower than the write bias voltage is applied between the first and the second electrodes, and the information stored in the floating conducting layer is read based on whether or not a current flows in the channel layer.

21 Claims, 45 Drawing Sheets

THIN BARRIER LAYER 16
(i-In$_{0.52}$(Al$_x$Ga$_{1-x}$)$_{0.48}$As)

x=0.5 (0.27eV)

x=1.0 (0.53eV)

FIG. 2A
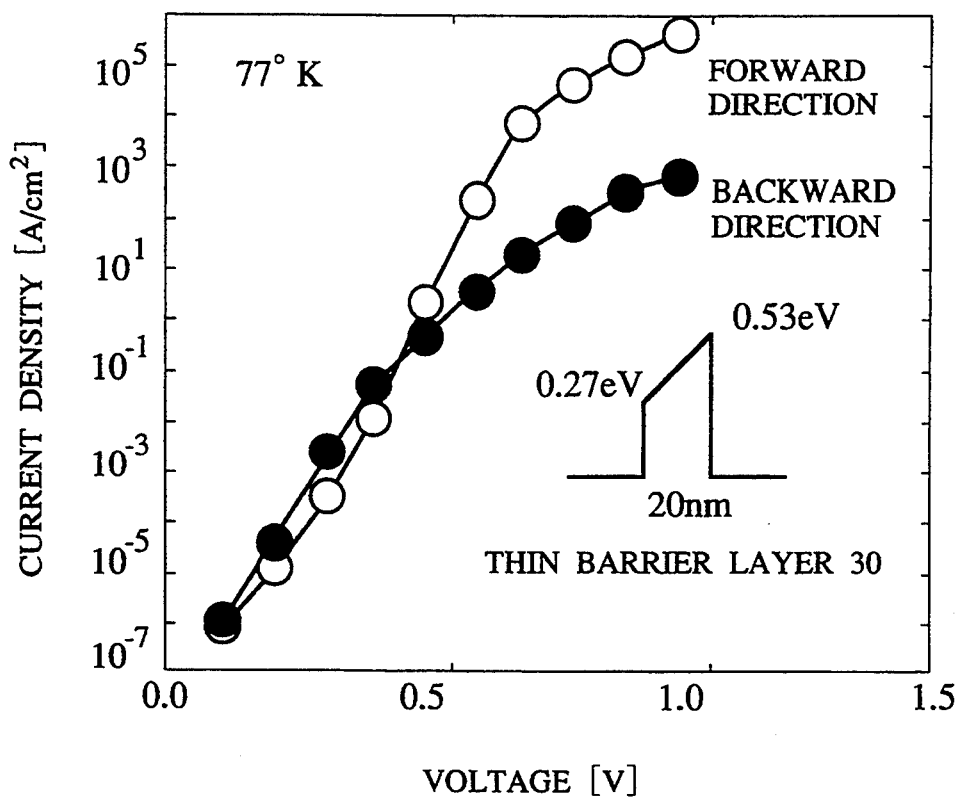
FIG. 2B  FIG. 2C  FIG. 2D
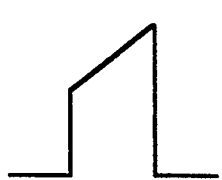 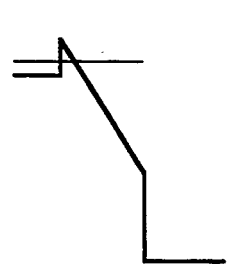 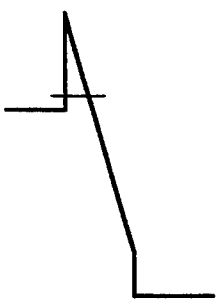
FORWARD DIRECTION   BACKWARD DIRECTION THIN BARRIER LAYER 16
(i-In$_{0.52}$(Al$_x$Ga$_{1-x}$)$_{0.48}$As)

x=0.5 (0.27eV)  x=1.0 (0.53eV)

Si DOPE

THIN BARRIER LAYER 50

0.53eV

INTERMEDIATE BARRIER LAYER 46
(i-In$_{0.52}$(Al$_x$Ga$_{1-x}$)$_{0.48}$As)

x=0.75     x=0.5
(0.41eV)     (0.27eV)

THIN BARRIER LAYER 70

INTERMEDIATE BARRIER LAYER 46
(i-In$_{0.52}$(Al$_x$Ga$_{1-x}$)$_{0.48}$As)

THIN BARRIER LAYER 80
(i-In$_{0.52}$(Al$_x$Ga$_{1-x}$)$_{0.48}$As)

FIG. 14A
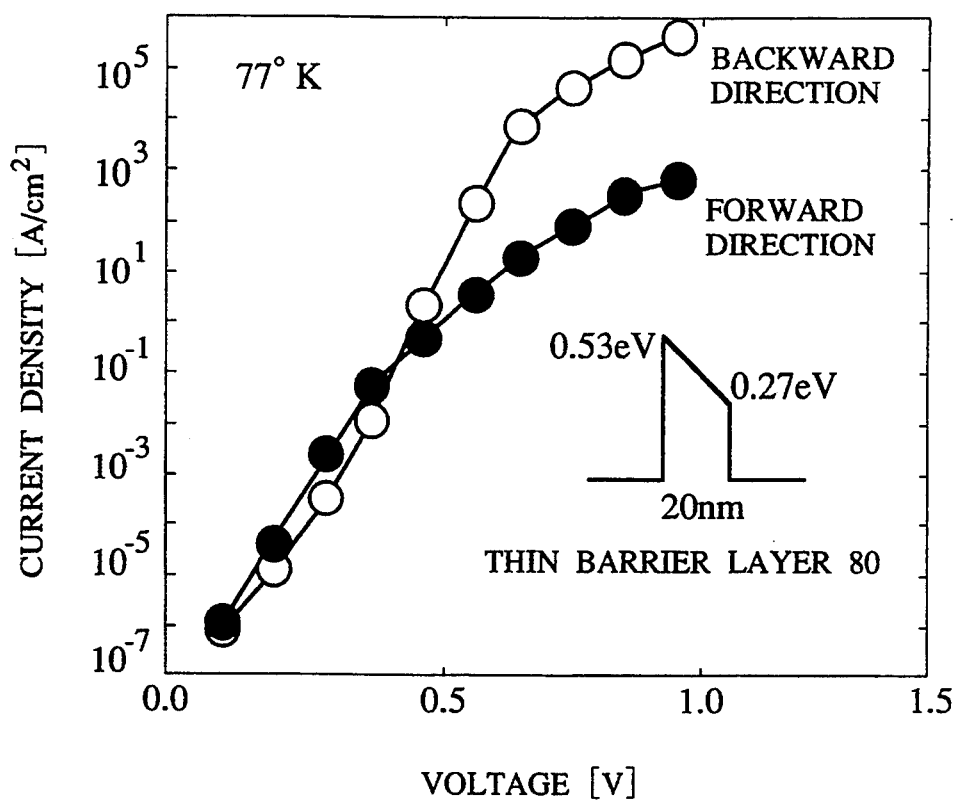
FIG. 14B  FIG. 14C  FIG. 14D
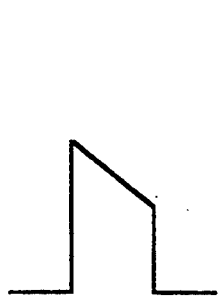 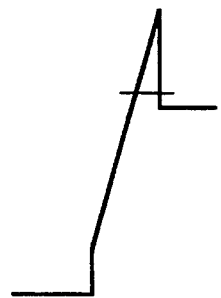 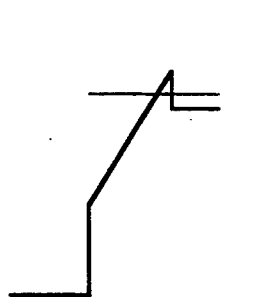
FORWARD DIRECTION   BACKWARD DIRECTION

FIG. 17A
| INPUT | $\overline{OE}$ | OE | OUTPUT |
|---|---|---|---|
| X | 1 | 0 | HiZ |
| 1 | 0 | 1 | 0 |
| 0 | 0 | 1 | 1 |
FIG. 17B
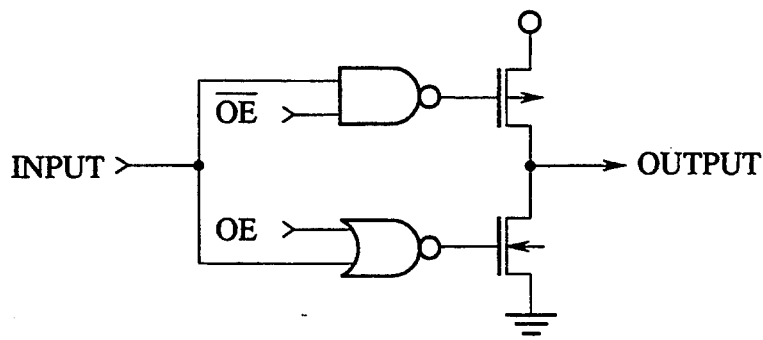
FIG. 17C
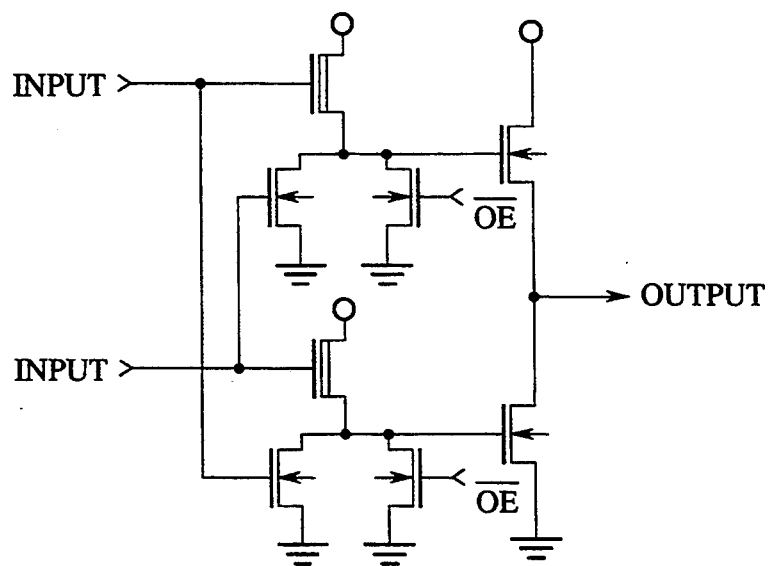

BARRIER LAYER 116
(i-In$_{0.52}$(Al$_x$Ga$_{1-x}$)$_{0.48}$As)

x=0.5
(0.27eV)
(50nm)

122  120  118  116  114  112

122  120  118  116  114  112

122  120  118  116  114  112

READ "0"

READ "1"

BARRIER LAYER 116
(i-In$_{0.52}$(Al$_x$Ga$_{1-x}$)$_{0.48}$As)

x=0.5
(0.27eV)
(50nm)

RESONANT TUNNELING BARRIER LAYER 130
( InAlAs / InGaAs / InAlAs )

130a 130b 130c i-In(Al$_x$Ga$_{1-x}$)As BARRIER LAYER 132 x=0.75, OR 0.50 x=0.50, OR 0.25

(50nm)

122  120  118   132   114   112

122  120  118   132   114   112

SUPERLATTICE BARRIER LAYER 134
(i-In$_{0.52}$Al$_{0.46}$As/i-In$_{0.53}$Ga$_{0.47}$As)
(1.465nm/1.465nm:50cycles)

0.53eV

SUPERLATTICE BARRIER LAYER 134
(i-In$_{0.52}$Al$_{0.46}$As/i-In$_{0.52}$(Al$_x$Ga$_{1-x}$)$_{0.46}$As)
(1.465nm/1.465nm:50cycles)

0.53eV
0.27eV

SEMICONDUCTOR HETEROJUNCTION FLOATING LAYER MEMORY DEVICE AND METHOD FOR STORING INFORMATION IN THE SAME

BACKGROUND OF THE INVENTION

The present invention relates to a semiconductor memory device and a method for storing information in the semiconductor memory device, based on innovational operational principle.

Recently semiconductor integrated circuits have made remarkable progress, and higher speed and higher integration are increasingly needed. Semiconductor devices using MOSFETs of silicon semiconductor are especially remarkably higher integrated. For example, dynamic memories (DRAMs) of 1 MOS memory cell type that uses one MOSFET as a memory cell are presently marketed in DRAMs of capacities as large as 1M to 4M bit. DRAMs of large capacities of 64M to 128M bit are in test fabrication.

Accompanying higher integration of DRAMs, transistors and condensers constituting the memory cells are increasingly micronized. The size of the memory cells has been down-sized to 2 $\mu$m square. In a DRAM of 1 MOS memory type, it is necessary to make a capacity of the condenser larger relative to external capacities, as of wires because memory states of 0 and 1 are discriminated by electric charge amounts accumulated in the condenser, and the condenser requires a large surface area. The condenser in a memory cell of a small area has the surface area increased by forming grooves in the semiconductor substrate or forming the condenser in a fin structure. But even these means have found it difficult to further micronize the condenser.

As semiconductor memory devices, in addition to DRAMs, electrically programmable ROMs (EPROMs) are known (S. M. Sze "Physics of Semiconductor Devices", p. 501, A Wiley-InterScience Publication, 1981). In an EPROM as well, one memory cell requires three lines which take time for electrical writing. Even in the case that two lines are used, very high voltages are required which is a serious obstacle to the higher integration.

In such circumstances, memory devices (static RAMs (SRAMs)) using differential negative resistance due to quantum effect, especially resonant tunnel effect is being studied (Federico Capasso (Ed.), "Physics of Quantum Electron Devices", pp. 207–208, Springer-Verlay, 1990; Y. Watanabe, et al. "Monolithic Integration of InGaAs/InAlAs Resonant Tunneling Diode and HEMT for Single-Transistor Cell SRAM Application", IEEE IEDM 92-475, 1992).

For example, a memory device which uses a resonant tunnel barrier (RTB) as a load device of a FET, an SRAM device which includes two resonant tunnel barriers serially connected to each other, and in which information is written by changing voltages at two ballast points of the resonant tunneling barriers by the gate electrode of an adjacent FET to write information, and this FET reads the stored information, an SRAM device in which a threshold diode provided below two resonant tunneling barriers reads and writes, and other devices are proposed.

But in these memory devices as well, 3 or more lines are provided per one memory cell, and accordingly an area of the memory cell cannot be much decreased. This is a problem.

These memory devices retain stored information by valley currents of the resonant tunnel barriers (RTBs), and to this end it is preferred that a valley current is sufficiently small with respect to a peak current. But presently a ratio of the peak current and the valley current is about 10–100. A problem is that the valley current cannot be made sufficiently small.

SUMMARY OF THE INVENTION

An object of the present invention is to provide a semiconductor memory device which has a simple structure and a small number of lines per one memory cell, which can read and write at high speed, and which is suitable to be micronized, and a method for storing information in the semiconductor memory device.

The above-described object can be achieved by a semiconductor memory device comprising: a semiconductor substrate; a non-doped thick barrier layer formed on the semiconductor substrate; an impurity doped floating conducting layer formed on the thick barrier layer; a thin barrier layer formed on the floating conducting layer and having an asymmetric barrier whose barrier height is higher on the side of the floating conducting layer; a channel layer formed on the thin barrier layer; and a first electrode and a second electrode formed on the channel layer.

The above-described object can be achieved by a semiconductor memory device comprising: a semiconductor substrate; a non-doped thick barrier layer formed on the semiconductor substrate; an impurity doped floating conducting layer formed on the thick barrier layer; a thin barrier layer formed on the floating conducting layer and having an asymmetric resonant tunneling barrier whose resonance level is higher on the side of the floating conducting layer; a channel layer formed on the thin barrier layer; and a first electrode and a second electrode formed on the channel layer.

The above-described object can be achieved by a semiconductor memory device comprising: a semiconductor substrate; a non-doped thick barrier layer formed on the semiconductor substrate; an impurity doped floating conducting layer formed on the thick barrier layer; an intermediate barrier layer formed on the floating conducting layer and having an asymmetric barrier whose barrier height is lower on the side of the floating conducting layer; a channel layer formed on the intermediate barrier layer; a thin barrier layer formed on the channel layer and having a symmetric barrier whose barrier height is substantially constant; and a first electrode and a second electrode formed on the thin barrier layer.

The above-described object can be achieved by a semiconductor memory device comprising: a semiconductor substrate; a non-doped thick barrier layer formed on the semiconductor substrate; an impurity doped floating conducting layer formed on the thick barrier layer; an intermediate barrier layer formed on the floating conducting layer and having an asymmetric barrier whose barrier height is lower on the side of the floating conducting layer; a channel layer formed on the intermediate barrier layer; a thin barrier layer formed on the channel layer and having a resonant tunneling barrier; and a first electrode and a second electrode formed on the thin barrier layer.

The above-described object can be achieved by a semiconductor memory device comprising: a semiconductor substrate; a non-doped thick barrier layer formed on the semiconductor substrate; an impurity doped floating conducting layer formed on the thick barrier layer; a thin barrier layer formed on the floating conducting layer and having an asymmetric barrier whose barrier height is lower on the side of the floating conducting layer; a channel layer formed on the intermediate barrier layer; and a first electrode and a second electrode formed on the thin barrier layer.

The above-described object can be achieved by a semiconductor memory device comprising: a semiconductor substrate; a floating conducting layer formed on the semiconductor substrate, and doped with an impurity; a non-doped barrier layer formed on the floating conducting layer; a channel layer formed on the barrier layer; a non-doped thin barrier layer formed on the channel layer; a conducting layer formed on the thin barrier layer; a first electrode formed on the conducting layer; and a second electrode formed on the channel layer.

The above-described object can be achieved by a semiconductor memory device comprising: a semiconductor substrate; a conducting layer formed on the semiconductor substrate; a non-doped thin barrier layer formed on the conducting layer; a channel layer formed on the thin barrier layer; a non-doped barrier layer formed on the channel layer; a floating conducting layer formed on the barrier layer, and doped with an impurity; a first electrode formed on the channel layer; and a second electrode formed on the channel layer.

The above-described object can be achieved by a semiconductor memory device comprising: a semiconductor substrate; a barrier layer formed on the semiconductor substrate, and accumulating electrons; a channel layer formed on the barrier layer; a non-doped thin barrier layer formed on the channel layer; a conducting layer formed on the thin barrier layer; a first electrode formed on the conducting layer; and a second electrode formed on the channel layer.

According to the present invention, a non-doped thick barrier layer formed on the semiconductor substrate; an impurity doped floating conducting layer formed on the thick barrier layer; a thin barrier layer formed on the floating conducting layer and having an asymmetric barrier whose barrier height is higher on the side of the floating conducting layer; a channel layer formed on the thin barrier layer; and a first electrode and a second electrode formed on the channel layer are formed on a semiconductor substrate, whereby a write bias voltage which makes a potential of the second electrode higher than that of the first electrode is applied so as to inject electrons from the first electrode to the floating conducting layer through the thin barrier layer to write information in the floating conducting layer; and a read bias voltage lower than the write bias voltage is applied between the first and the second electrodes, and the information stored in the floating conducting layer is read based on whether or not a current flows in the channel layer.

According to the present invention, a non-doped thick barrier layer; an impurity doped floating conducting layer formed on the thick barrier layer; a thin barrier layer formed on the floating conducting layer and having an asymmetric resonant tunneling barrier whose resonance level is higher on the side of the floating conducting layer; a channel layer formed on the thin barrier layer; and a first electrode and a second electrode formed on the channel layer are formed on a semiconductor substrate, whereby a write bias voltage which makes a potential of the second electrode higher than that of the first electrode is applied so as to inject electrons from the first electrode to the floating conducting layer through the thin barrier layer to write information in the floating conducting layer; a read bias voltage lower than the write bias voltage is applied to between the first and the second electrodes, and the information stored in the floating conducting layer is read based on whether or not a current flows in the channel layer; and an erase bias voltage higher than the write bias voltage is applied between the first and the second electrodes, and the electrons accumulated in the floating conducting layer are discharged from the second electrode through the thin barrier layer so as to erase the information stored in the floating conducting layer.

According to the present invention, a non-doped thick barrier layer; an impurity doped floating conducting layer formed on the thick barrier layer; an intermediate barrier layer formed on the floating conducting layer and having an asymmetric barrier whose barrier height is lower on the side of the floating conducting layer; a channel layer formed on the intermediate barrier layer; a thin barrier layer formed on the channel layer and having a symmetric barrier whose barrier height is substantially constant; and a first electrode and a second electrode formed on the thin barrier layer are formed on a semiconductor substrate, whereby a write bias voltage which makes a potential of the second electrode higher than that of the first electrode is applied so as to inject electrons from the first electrode to the floating conducting layer through the thin barrier layer to write information in the floating conducting layer; a read bias voltage lower than the write bias voltage is applied between the first and the second electrodes, and the information stored in the floating conducting layer is read based on whether or not a current flows in the channel layer; and an erase bias voltage higher than the write bias voltage is applied between the first and the second electrodes, and the electrons accumulated in the floating conducting layer are discharged from the second electrode through the thin barrier layer to erase the information stored in the floating conducting layer.

According to the present invention, a non-doped thick barrier layer, an impurity-doped floating conducting layer, an intermediate barrier layer having a symmetric barrier whose barrier height is substantially constant, a channel layer, and a thin barrier layer having a resonant tunneling barrier are formed on a semiconductor substrate, and a first and a second electrodes are formed on the thin barrier layer, whereby a write bias voltage which makes a potential of the second electrode higher than that of the first electrode is applied so as to inject electrons from the first electrode into the floating conducting layer through the thin barrier layer and the intermediate barrier layer to write information in the floating conducting layer by using that a quantity of electrons injected into the floating conducting layer from the first electrode through the thin barrier layer and the intermediate barrier layer is larger than a quantity of electrons discharged from the floating conducting layer to the second electrode through the intermediate barrier layer and the thin barrier layer, a read bias voltage lower than the write bias voltage is applied between the first and the second electrodes so as to read the stored information based on whether a current flows in the channel layer, an erase bias voltage higher than the write bias voltage is applied between the first and the second electrodes, and the electrons accumulated in the floating conducting layer from the second electrode through the thin barrier layer and the intermediate barrier layer are discharged to erase the stored information in the floating conducting layer based on that a quantity of electrons discharged from the floating conducting layer to the second electrode through the thin barrier layer and the intermediate barrier layer is larger than a quantity of electrons injected into the floating conducting layer from the first electrode through the thin barrier layer and the intermediate barrier layer.

According to the present invention, a non-doped thick barrier layer, an impurity-doped floating conducting layer, a thin barrier layer having an asymmetric barrier whose barrier height is higher on he side of the floating conducting layer, and a channel layer are formed on a semiconductor substrate, and a first and a second electrodes are formed on the channel layer, whereby a write bias voltage which makes a potential of the second electrode higher than that of the first electrode is applied so as to discharge electrons from the floating conducting layer to write information based on that a quantity of electrons discharged from the floating conducting layer to the second electrode through the thin barrier layer is larger than a quantity of electrons injected from the first electrode into the floating conducting layer through the thin barrier layer, and a read bias voltage which is lower than the write bias voltage is applied between the first and the second electrodes to read the stored information based on whether or not a current flows in the channel layer, an erase bias voltage lower than the write bias voltage and higher than the read bias voltage to inject electrons from the floating conducting layer from an electron accumulated layer in the channel layer through the thin barrier layer to erase the information stored in the floating conducting layer.

According to the present invention, an impurity-doped floating conducting layer, a non-doped barrier layer, a channel layer, a non-doped thin barrier layer and a conducting layer are formed on a semiconductor substrate, and a first electrode is formed on the conducting layer, and a second electrode is formed on the channel layer, whereby a write bias voltage which makes a potential of the second electrode higher than that of the first electrode is applied so as to inject electrons into the barrier layer and/or the floating conducting layer from the first electrode through the thin barrier layer to write information in the barrier layer and/or the floating conducting layer; a read bias voltage which makes a potential of the second electrode lower than that of the first electrode is applied to read the stored information in the floating conducting layer based on whether or not a current flows in the channel layer; and an erase bias voltage which makes a potential of the second electrode than that of the first electrode and whose absolute value is larger than the read bias voltage is applied to so as to discharge the electrons accumulated in the barrier layer and/or floating conducting layer from the first electrode through the thin barrier layer to erase the information stored in the barrier layer and/or floating conducting layer.

BRIEF DESCRIPTION OF THE DRAWINGS

FIGS. 2A to 2D are graphs of forward and reverse current characteristics of the semiconductor memory device according to the first embodiment.

FIGS. 14A to 14D are graphs of current and reverse current-voltage characteristics of a thin barrier layer of the tenth embodiment.

FIGS. 17A to 17C are views of a tristate buffer used in the semiconductor memory device according to the twelfth embodiment.

DETAILED DESCRIPTION OF THE INVENTION

The semiconductor memory device according to a first embodiment of the present invention will be explained with reference to FIGS. 1A and 1B and 2A to 2C.

An about 300 nm-thickness non-doped thick barrier layer 12 of i-In$_{0.52}$Al$_{0.48}$As is formed on a semi-insulating InP substrate 10, An about 200 nm-thickness floating conducting layer 14 of n-In$_{0.53}$Ga$_{0.47}$As doped with a $5 \times 10^{17}$ cm$^{-3}$ dose of silicon is formed on the thick barrier layer 12.

Figure 1A:
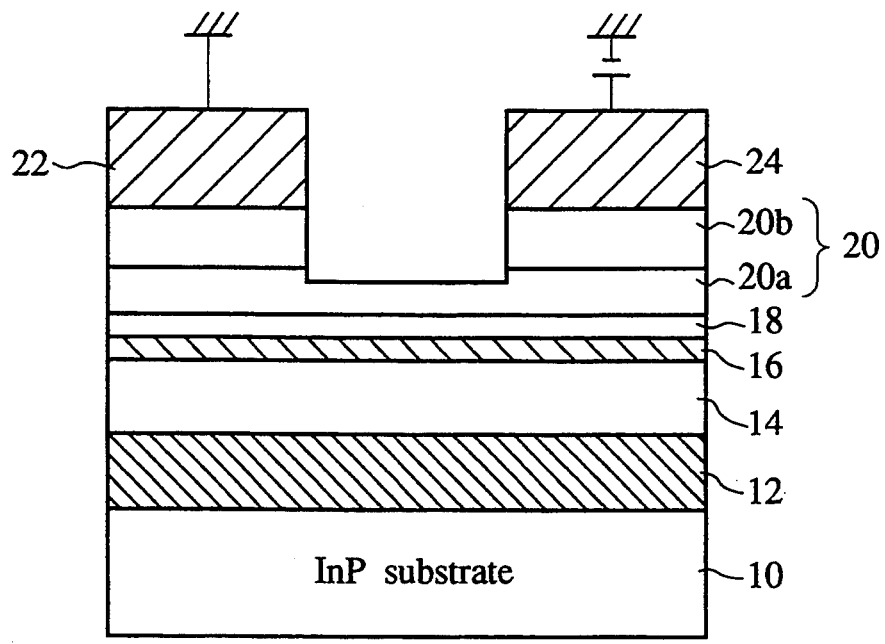
FIGS. 1A and 1B are views of the semiconductor memory device according to a first embodiment of the present invention.
Figure 1B:
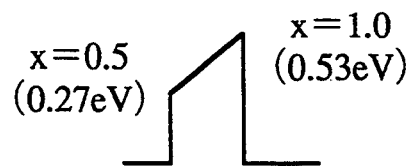

An about 20 nm-thickness non-doped thin barrier layer 16 of i-In$_{0.52}$(Al$_x$Ga$_{1-x}$)$_{0.48}$As is formed on the floating conducting layer 14. An aluminium composition ratio (value of x) of i-In$_{0.52}$(Al$_x$Ga$_{1-x}$)$_{0.48}$As of the thin barrier layer 16 changes linearly from $x=1$ to 0.5 from the semi-insulating InP substrate 10 to the surface. As shown in FIG. 1B, The thin barrier layer 16 has barrier which is as high as 0.53 eV on the side of the floating conducting layer 14 and gradually lowers to 0.27 eV on the upper surface.

An about 30 nm-thickness channel layer 18 of n-In$_{0.53}$Ga$_{0.47}$As doped with a $5 \times 10^{17}$ cm$^{-3}$ dose of silicon is formed of the thin barrier layer 16. A contact layer 20 is formed on the thin barrier layer 16. The contact layer 20 includes an about 20-nm thickness channel layer of n-In$_{0.53}$Ga$_{0.47}$As layer 20a doped with doses of silicon changed from $5 \times 10^{17}$ cm$^{-3}$ to $5 \times 10^{19}$ cm$^{-3}$, and an about 50 nm-thickness n-In$_{0.53}$Ga$_{0.47}$As layer 20b doped with a $5 \times 10^{19}$ cm$^{-3}$ dose of silicon. The contact layer 20 has convexities for two electrodes to be formed on.

A first electrode 22 and a second electrode 24 are formed of an about 200 nm-thickness tungsten silicide (WSi) layer on the two convexities of the contact layer 20. The first electrode 22 and the second electrode 24 may be formed of, in place of the tungsten silicide layer, a Cr/Au layer of an about 20 nm-thickness chrome layer and an about 190 nm-thickness gold layer laid one on another, or a Pd/Ge layer of an about 60 nm-thickness paradium layer ad an about 80 nm-thickness germanium layer.

The method for storing information in the semiconductor memory device according to the first embodiment will be explained with reference to FIGS. 2A to 2D. FIGS. 2A to 2D are graphs of forward and reverse current-voltage characteristics of the thin barrier layer of the first embodiment.

First, the method of writing information will be explained.

When information is written in this semiconductor memory device, one of the first and the second electrodes 22, 24, e.g., the first electrode 22, is grounded, and a write bias voltage is applied to the second electrode 24 for giving the second electrode a positive potential. When such write bias potential is applied to, electrons travel from the first electrode 22 to the second electrode 24 through the channel layer 18 while they are injected from the channel layer 18 to the floating conducting layer 14 through the thin barrier layer 16 and again tunnel the thin barrier layer 16 to the channel layer 18 to finally arrive at the second electrode 24.

As shown in FIG. 2B, the thin barrier layer 16 has a barrier height inlined from 0.53 eV to 0.27 eV from the side of the floating conducting layer 14 to the side of the channel layer 18. The forward barrier for electrons traveling from the first electrode 22 to the floating conducting layer 14 has, as shown in FIG. 2C, a band structure which facilitate the travel of the electrons. The reverse barrier for electrons traveling from the floating conducting layer 14 to the second electrode 24 has, as shown in FIG. 2D, a band structure which makes their tunneling difficult.

FIG. 2A shows values of forward and reverse currents for bias voltages applied at 77K to the thin barrier layer 16 with the inclined band structure. No substantial differences are found between the forward and reverse currents up to about 0.5 V, and their values are as small as about 0.5 A/cm$^2$. But at about 0.9 V, values of forward and reverse currents are $10^5$ A/cm$^2$ and $10^2$ A/cm$^2$, and the difference between the currents is about 1000 times.

When the first electrode 22 is grounded, and an about 1.8 V voltage is applied to, substantially equal forward and reverse bias voltages (about 0.9 V) are applied to the thin barrier layer 16 at the time of the application, electrons corresponding to a $10^{-6}$ C/cm$^2$ electric charge amount is accumulated in the floating conducting layer 14 in a very short period of time of about 1 pico second.

Consequently a potential of the floating conducting layer 14 rises by about 0.2 V and reaches an equilibrium state at a voltage where a forward current value and a reverse current value are substantially equal to each other (in this case, about 0.7 V forward in the thin barrier layer 16, and about 0.7 V reverse in the thin barrier layer 16), and electrons are accumulated in the floating conducting layer 14. Thus information can be written.

At this time, when the voltage of the second electrode 24 is made 0, the potential of the floating conducting layer 14 rises by about 0.2 V. But, even though the voltage of the floating conducting layer 14 has risen by about 0.2 V, both the forward current value and the reverse current value are about $10^{-5}$ A/cm$^2$ as shown in FIG. 2A, and electrons accumulated in the floating conducting layer 14 are slowly discharged. This state is retained in about 10 ms. When electrons are discharged from the floating conducting layer 14, a potential of the floating conducting layer 14 is lowered, and electrons are further discharged. When a potential of the floating conducting layer 14 becomes about 0.1 V, its state is retained for about 1 second.

Then, the method for reading information will be explained.

A current flowing from the first electrode 22 to the second electrode through the channel layer 18 is influenced by only a surface depletion layer in a state where no electric charge is accumulated in the floating conducting layer 14, and when a read bias voltage of about 1 V lower than a write bias voltage is applied between the first and the second electrodes 22, 24, a current of about $10^3$ A/cm$^2$ flows.

But in a state where an electric charge is accumulated in the floating conducting layer 14, a depletion layer is extended from the floating conducting layer 14 to substantially empty the channel layer 18, and substantially no current flows between the first and the second electrodes 22, 24.

Thus a read bias voltage is applied to, and presence of a current flowing between the first and the second electrodes 22, 24 is detected, whereby stored information can be read based on whether an electric charge is accumulated in the floating conducting layer 14.

When a read bias voltage of about 1 V is applied to between the first and the second electrodes 22, 24, a current flowing from the first electrodes 22 to the second electrode 24, tunneling the thin barrier layer 16 is about $10^{-4}$ A/cm$^2$, which does not influence reading of stored information.

In the first embodiment, electrons accumulated in the floating conducting layer 14 are discharged in about 1 second, and stored information is lost. But the stored information can be retained for about 24 hours by thickening the thin barrier layer 16 from an about 20 nm to about 30 nm.

Electrons accumulated in the floating conducting layer 14 are discharged by applying UV rays, whereby information can be erased in blocks. In the first embodiment, the barrier height is so low that information can be erased by visible light.

It is preferable that the semiconductor memory device according to the first embodiment is operated at a low temperature below 77 K so that thermonic current components are suppressed.

Thus, according to the first embodiment, a high-speed electrically programmable ROM can be realized. Only two lines are provided, so that accordingly higher integration is possible, and shorter writing times can be realized. A write voltage which is as low as about 1/10 of that of the conventional DRAM devices can be realized.

The process for fabricating the semiconductor memory device according to the first embodiment will be explained.

First, the following layers are continuously crystal-grown on the semi-insulating InP substrate 10 by electron beam epitaxy in the order to be next stated. The about 300 nm-thickness thick barrier layer (buffer layer) 12 of non-doped i-In$_{0.52}$Al$_{0.48}$As is formed on the substrate 10, and then the about 200 nm-thickness floating conducting layer 14 of n-In$_{0.53}$Ga$_{0.47}$As doped with a $5 \times 10^{17}$ cm$^{-3}$ dose of silicon, the about 20 nm-thickness thin barrier layer 16 of non-doped i-In$_{0.52}$(Al$_x$Ga$_{1-x}$)$_{0.48}$As, the about 30 nm-thickness channel layer 18 of n-In$_{0.53}$Ga$_{0.47}$As doped with a $5 \times 10^{17}$ cm$^{-3}$ dose of silicon, the about 20 nm-thickness n-In$_{0.53}$Ga$_{0.47}$As layer 20a doped with silicon of does varied from $5 \times 10^{17}$ cm$^{-3}$ to $5 \times 10^{19}$ cm$^{-3}$, and the about 50 nm-thickness n-In$_{0.53}$Ga$_{0.47}$As layer 20b dped with a $5 \times 10^{19}$ cm$^{-3}$ dose of silicon are formed.

Then on the contact layer 20, the Cr/Au layer of about 200 nm-thickness tungsten silicide (WSi) layer, and the 20 nm-thickness chrome layer and the about 190 nm-thickness Au layer laid one on another, or the Pd/Ge layer of the about 60 nm-thickness paradium layer and the about 80 nm-thickness germanium layer laid one on another is formed. Subsequently the layer is pattern-etched by the usual photolithography, and the first and the second electrodes 22, 24 are formed.

Then with the first and the second electrodes 22, 24 as a mask, parts of the n-In$_{0.53}$Ga$_{0.47}$As layer 20b and the n-In$_{0.53}$Ga$_{0.47}$As 20a between the first and the second electrodes 22, 24 are etched off, and the etching is conducted down to the thick barrier layer 12 so as to surround the first and the second electrodes 22, 24. And the semiconductor memory device according to the first embodiment is completed.

Next, the semiconductor memory device according to a second embodiment of the present invention will be explained with reference to FIG. 3. Common members of the second embodiment with the first embodiment are represented by common reference numerals not to repeat their explanation.

Figure 3:
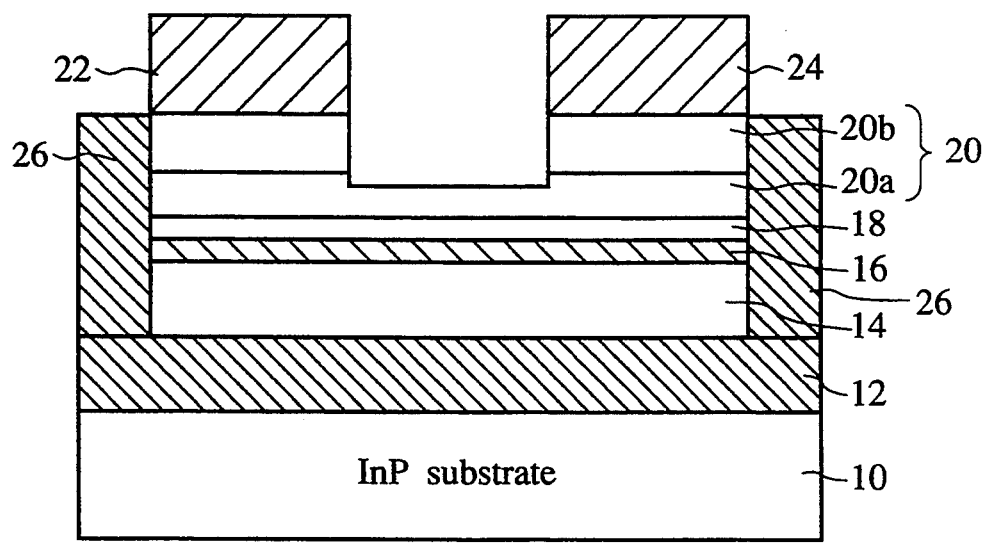
FIG. 3 is a view of the semiconductor memory device according to a second embodiment of the present invention FIGS. 4A and 4B views of the semiconductor memory device according to a third embodiment of the present invention.

As shown in FIG. 3, in the second embodiment an about 300 nm-thickness protecting layer 26 of non-doped i-In$_{0.52}$Al$_{0.48}$As is formed on the side surfaces for the prevention of surface leak currents between the floating conducting layer 14 and the channel layer 18.

The about 300 nm-thickness protecting layer 26 of non-doped i-In$_{0.52}$Al$_{0.48}$As is formed on the entire surface of a mesa formed by etching the surrounding of a first and a second electrodes 22, 24 by MBE or MOCVD.

According to the second embodiment, the side surfaces are covered with the protecting layer, so that surface leak currents can be prevented, and stored information can be retained longer by electrons accumulated in the floating conducting layer.

Figure 4A:
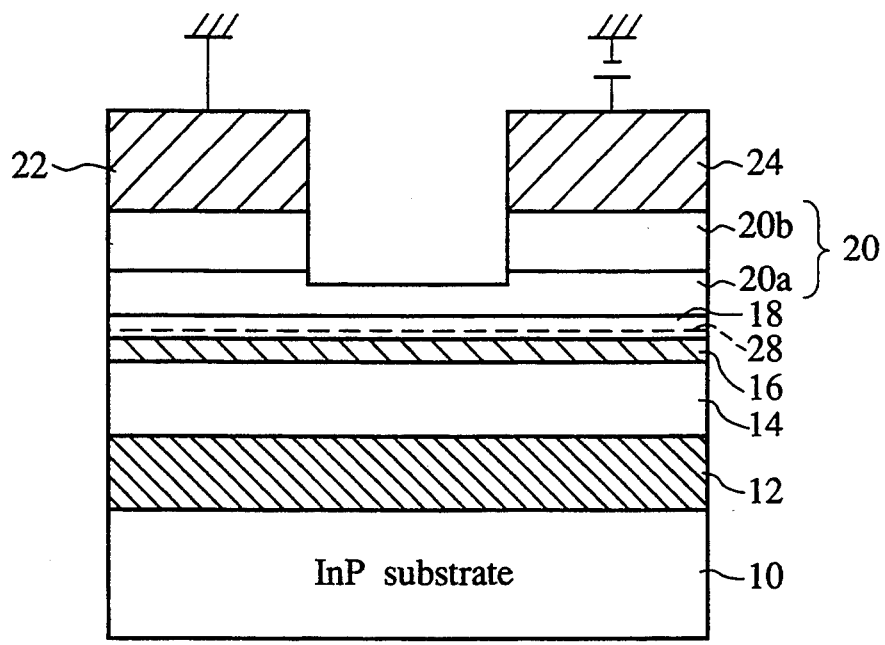
Figure 4B:
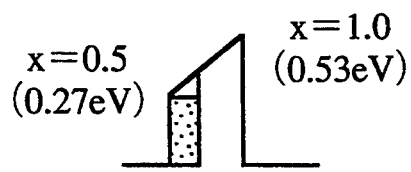

The semiconductor memory device according to a third embodiment of the present invention will be explained with reference to FIGS. 4A and 4B. Common members of the third embodiment with the first embodiment are represented by common reference numerals not to repeat their explanation.

As in the first embodiment, on a semi-insulting InP substrate 10, an about 300 nm-thickness barrier layer 12 of non-doped i-In$_{0.52}$Al$_{0.48}$As, an about 200 nm-thickness floating conducting layer of n-In$_{0.53}$Ga$_{0.47}$As doped with a $5 \times 10^{17}$ cm$^{-3}$ dose of silicon, and an about 30 nm-thickness thin barrier layer 16 are formed one on another in the stated order.

An aluminium composition ratio (value of x) of i-In$_{0.52}$(Al$_x$Ga$_{1-x}$)$_{0.48}$As of the thin barrier layer 16 changes linearly from x=1 to 0.5 from the semi-insulating InP substrate 10 to the surface. As shown in FIG. 1B, The thin barrier layer 16 has barrier which is as high as 0.53 eV on the side of the floating conducting layer 14 and gradually lowers to 0.27 eV on the upper surface. As shown in FIG. 4B, a part or the entire of the surface of the thin barrier layer 16 is doped with a $1 \times 10^{18}$ cm$^{-3}$ does of silicon.

An about 30 nm-thickness channel layer 18 of non-doped i-In$_{0.53}$Ga$_{0.47}$As is formed on the thin barrier layer 16. Electrons supply from the thin barrier layer 16 into the channel layer 18 to form a two-dimensional electron channel 28 in the channel layer 18. The thin barrier layer 16, from which electron have supplied and is depleted, have the same function as the thin barrier layer 16 of non-doped In$_{0.54}$(Al$_x$Ga$_{1-x}$)$_{0.48}$As.

The third embodiment has the same structure and operation as the first embodiment except that a two-dimensional electron channel is formed in the channel layer, and the structure and operation of the second embodiment are omitted.

In the third embodiment, information is read and written by currents flowing through the two-dimensional electron channel in the channel layer. Read and write of information is very speedy.

Figure 5A:
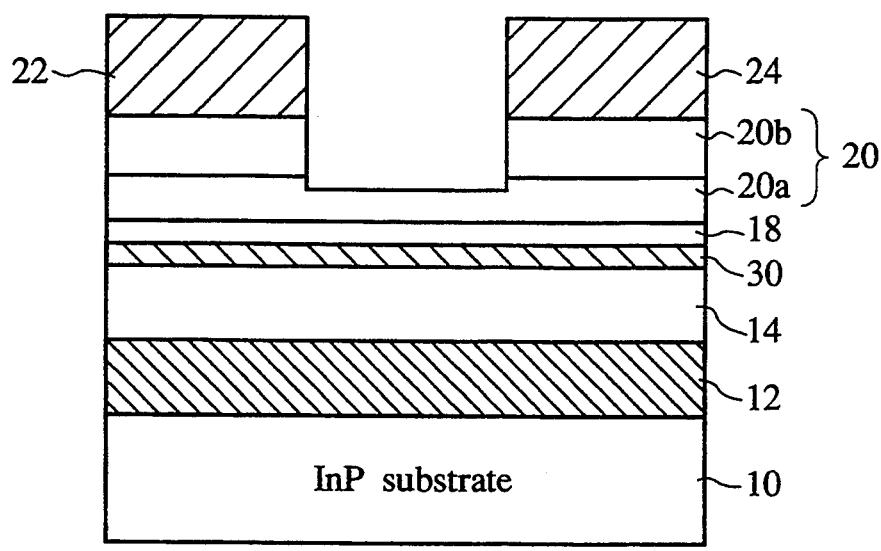
FIGS. 5A and 5B are views of the semiconductor memory device according to a fourth embodiment of the present invention.

Next, the semiconductor memory device according to a fourth embodiment will be explained with reference to FIGS. 5A and 5B, and 6. Common members of the fourth embodiment with the first embodiment of FIGS. 1A and 1B are represented by common reference numerals not to repeat their explanation.

On a semi-insulating InP substrate 10, as in the first embodiment, an about 300 nm-thickness thick barrier layer 12 of non-doped i-In$_{0.52}$Al$_{0.48}$As, and an about 200 nm-thickness floating conducting layer 14 of n-In$_{0.53}$Ga$_{0.47}$As doped with a $5 \times 10^{17}$ cm$^{-3}$ dose of silicon are formed one on another in the stated order.

A thin barrier layer 30 having asymmetrical resonant tunneling barrier (RTB) in place of the thin barrier layers 16 having the asymmetrical barriers of the first to the third embodiments is formed on the floating conducting layer 14.

Figure 5B:
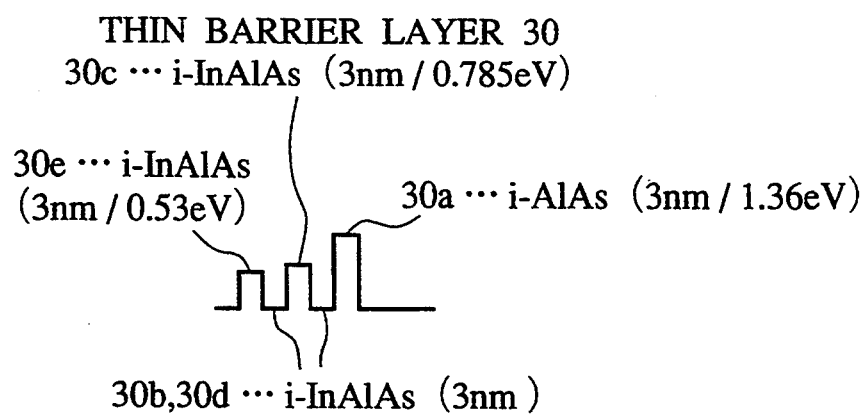

As shown in FIG. 5B, the thin barrier layer 30 incudes an about 3 nm-thickness i-AlAs barrier layer of a 1.36 eV barrier eight, an about 3 nm-thickness i-InGaAs well layer 30b, an about 3 nm-thickness i-In$_{0.53}$Al$_{0.65}$As barrier layer 30c having a 0.785 eV-barrier height, an about 3 nm-thickness i-InGaAs well layer 30d, and an about 3 nm-thickness i-In$_{0.52}$Al$_{0.48}$As barrier layer 30e having a 0.53 eV-barrier height formed one on another.

A contact layer 20 including an about 30 nm-thickness channel layer 18 of n-In$_{0.53}$Ga$_{0.47}$As doped with a $5 \times 10^{17}$ cm$^{-3}$ dose of silicon, an about 20 nm-thickness n-In$_{0.53}$Ga$_{0.47}$As layer 20a doped with varied does from $5 \times 10^{17}$ cm$^{-3}$ to $5 \times 10^{19}$ cm$^{-3}$, and an about 50 nm-thickness n-In$_{0.53}$Ga$_{0.47}$As layer 20b doped with a $5 \times 10^{19}$ cm$^{-3}$ dose of silicon laid one on another is formed on the thin barrier layer 30. A first electrode 22 and a second electrode 24 are formed on the contact layer 20.

Then the method for storing information in the semiconductor memory device according to the fourth embodiment will be explained with reference to FIG. 6.

Figure 6:
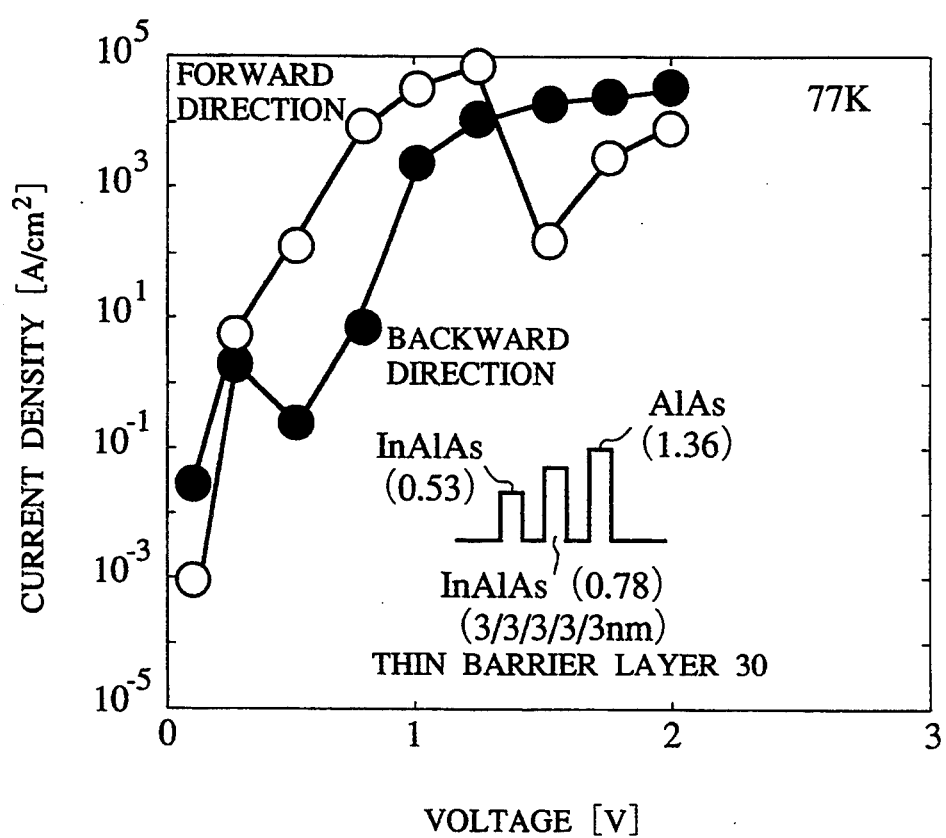
FIG. 6 is a graph of forward and reverse current characteristics of the semiconductor memory device according to the fourth embodiment.

FIG. 6 is a graph of forward and reverse current-voltage characteristics of the fourth embodiment. As shown in FIG. 6, substantially no forward and reverse current flows in the thin barrier layer 30 with a resonant tunneling barrier up to an about 0.5 V applied voltage. But at an 0.8 V-applied voltage the thin barrier layer 30 has a resonant tunneling state in the forward direction, and an bout $4 \times 10^4$ A/cm$^2$ current flows. But reversely the thin barrier layer 30 does not have the resonant tunneling state, and a current of only about $10^1$ A/cm$^2$ flows.

Reversely, when the applied voltage is 1.5 V, the thin barrier layer 30 has a non-resonant state in the forward direction, and a current of only about $10^2$ A/cm$^2$ flows. But in the reverse direction, a reversing phenomena that the thin barrier layer 30 has a resonant tunneling state, and a current of about $4 \times 10^4$ A/cm$^2$ flows.

The fourth embodiment uses this reversing phenomena to write and erase information.

One of the first and the second electrodes 22, 24, e.g., the first electrode 22, is grounded, and the second electrode 24 has an about 1.6 V potential. When such writing bias voltage is applied, since a forward current through the barrier layer 30 is much larger than a reverse current therethrough, electrons can be injected into the floating conducting layer 14 for a 1–10 pico second short period of time. when electrons are accumulated in the floating conducting layers 14, a potential of the floating conducting layer 14 rises by about 0.2 V.

In this state, the voltage applied to the second electrode 24 is reduced to 0 V, a potential of the floating conducting layer 14 is retained at about 0.2 V for a certain period of time, e.g., about 1 μsec.

Then, in the state where electrons are accumulated in the floating electrode layer 14, when an erase bias voltage of about 3 V which is higher than that for writ bias voltage is applied between the first and the second electrodes 22, 24, a current flowing reversely in the thin barrier layer 30 is larger than that flowing forward therein. Then electrons accumulated in the floating electrode layer 14 are discharged from the second electrode 24 through the thin barrier layer 30 to erase stored information.

Since the current flowing from the first electrode 22 to the second electrode 24 through the channel layer 18 is influenced by a surface depletion layer in a state where no electric charge is accumulated in the floating electrode layer 14, a current of about $10^{13}$ A/cm$^2$ flows when a read bias voltage of about 1 V which is lower than a write bias voltage is applied between the first and the second electrodes 22, 24.

In a state where an electric charge is accumulated in the floating conducting layer 14, a depletion layer is extended from the floating conducting layer 14 to substantially deplete the channel layer 18, and substantially no current flows between the first and the second electrodes 22, 24.

Thus, a read bias voltage is applied to detect presence of a current flowing between the first and the second electrodes 22, 24, whereby stored information can be read based on presence of an accumulated electric charge in the floating conducting layer 14.

The fourth embodiment does not use the so-called bistable circuit having two serially connected resonant tunnel barriers, and an applied voltage is determined based on respective forward bias characteristics and reverse bias characteristics so as to avoid bistable states.

According to the fourth embodiment, when a write bias voltage of bout 1.6 V is applied between the first and the second electrodes 22, 24, electrons are accumulated in the floating conducting layer 14 to write stored information "1". When an erase bias voltage of about 3 V is applied between the first and the second electrodes 22, 24, electrons accumulated in the floating conducting layer 14 are discharged to write stored information 0. A dynamic RAM (DRAM) can be realized by using such information writing and erasing operations.

But in the semiconductor memory device according to the fourth embodiment, since stored information vanishes after a certain period of time, refresh control for rewriting stored information in the period of time is necessary.

The barrier of the thin barrier layer 16 on the side of the substrate is more thickened or made higher effectively to elongate a holding time of stored information to about 1 second. When the barrier layer 30a on the side of the substrate is an about 20 nm-thickness i-In$_{0.52}$Al$_{0.48}$As layer 30a, an accumulating time is 1-10 second at 0.2 V. This is substantially the same as that of a DRAM using a silicon MOSFET and capacitor. To elongate a holding time it is preferable that the mesa is filled with i-InAlAs.

Figure 7A:
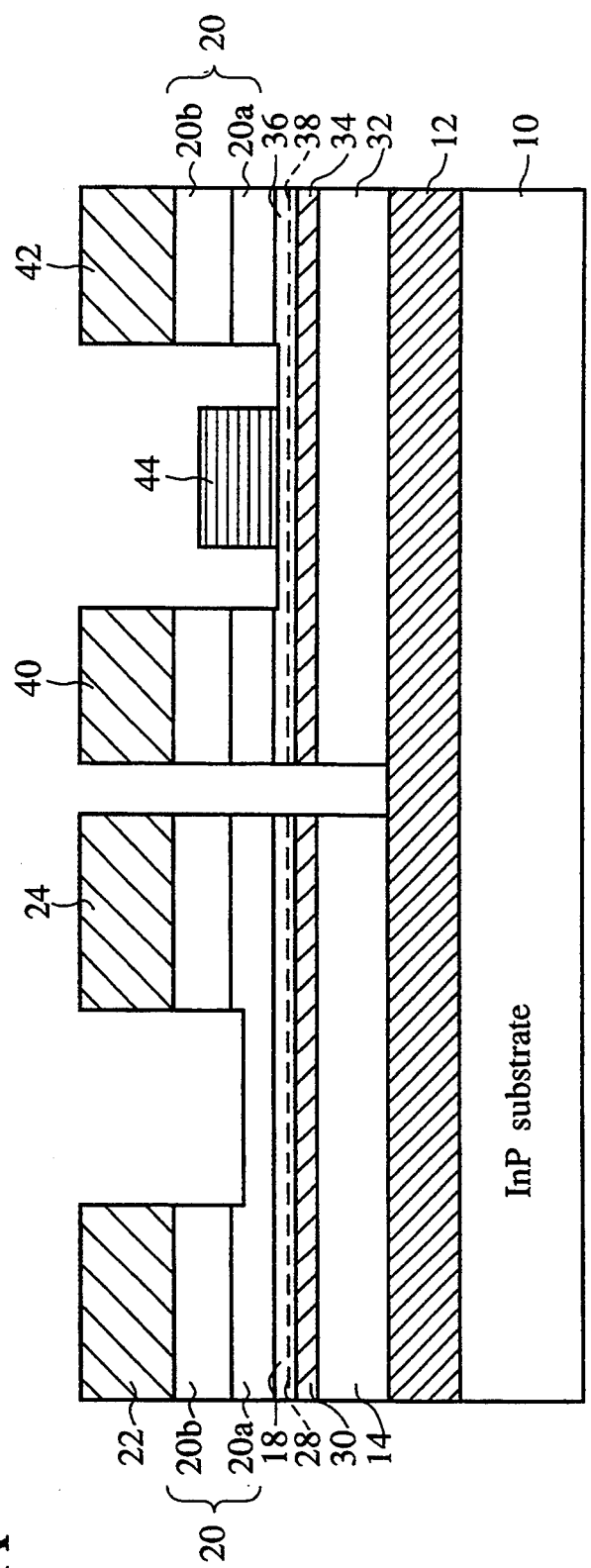
FIGS. 7A and 7B are views of the semiconductor memory device according to a fifth embodiment of the present invention.
Figure 7B:
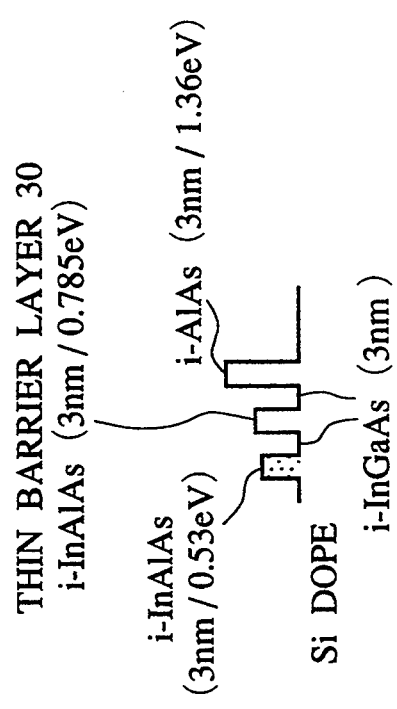

The semiconductor memory device according to a fifth embodiment of the present invention will be explained with reference to FIGS. 7A and 7B. Common members of the fifth embodiment with the semiconductor memory device according to the fourth embodiment ar represented by common reference numerals not to repeat their explanation.

An about 300 nm-thickness barrier layer 12 of non-doped i-In$_{0.52}$Al$_{0.48}$As is formed on a semi-insulating InP substrate 10. On the thick barrier layer 12, a thin barrier layer an about 200 nm-thickness floating conducting layer 14 doped with a $5 \times 10^{17}$ cm$^{-3}$ of silicon, and a thin barrier layer 30 having a symmetrical resonant tunneling barrier (RTB) whose resonance level is asymmetric are formed, device-isolated in the region on the left side of FIGS. 7A and 7B as in the fourth embodiment.

The thin barrier layer 30, as in the fourth embodiment, includes, from the side of the floating conducting layer 14, an about 3 nm-thickness i-AlAs barrier layer 30a of a 1.36 eV barrier height, an about 3 nm-thickness i-InGsAs well layer 30b, an about 3 nm-thickness i-In$_{0.35}$Al$_{0.65}$As barrier layer 30c of a 0.785 eV-barrier height; an about 3 nm-thickness i-InGaAs well layer 30d, an about 3 nm-thickness i-In$_{0.52}$Al$_{0.48}$As barrier layer 30e of a 0.53 eV barrier height laid one on another. In the fifth embodiment a part or the entire of the surface of the thin barrier layer 30 has the uppermost i-In$_{0.52}$Al$_{0.48}$As barrier layer 30e doped with a $1 \times 10^{18}$ cm$^{-3}$ dose of silicon.

On the thin barrier layer 30, a contact layer 20 including an about 30 nm-thickness channel layer 18 of non-doped i-In$_{0.53}$Ga$_{0.47}$As, an about 20 nm-thickness n-In$_{0.53}$Ga$_{0.47}$As layer 20a doped with varied doses of silicon from $5 \times 10^{17}$ cm$^{-3}$ to $5 \times 10^{19}$ cm$^{-3}$ and an about 50 nm-thickness n-In$_{0.53}$Ga$_{0.47}$As layer 20b laid one on another in the stated order. A first electrode 22 and a second electrode 24 are formed on the contact layer 20. Thus the semiconductor memory device according to the fifth embodiment is formed in the region on the left side of the semi-insulating InP substrate 10.

In the fifth embodiment, electrons supply from the thin barrier layer 30 to the channel layer 18, and a two-dimensional electron channel 28 is formed in the channel layer 18. The operation of the fifth embodiment is the same as the fourth embodiment except that a two-dimensional electron channel is formed in the channel layer, and its explanation is omitted.

In the region on the right side of the semi-insulating InP substrate as well a HEMT of the same laminar structure is formed. That is, on the thick barrier layer 12 an about 200 nm-thickness n-In$_{0.53}$Ga$_{0.47}$As layer 32 doped with a $5 \times 10^{17}$ cm$^{-3}$ dose of silicon, a donor layer 34, an active layer 36 and a contact layer 20 are lid one on another in the stated order.

The donor layer 34 has a structure having a resonant tunneling barrier (RTB) with an asymmetric resonance level as does the thin barrier layer 30 of the semiconductor memory device. That is, from the side of the n-In$_{0.53}$Ga$_{0.47}$As layer 32, an about 3 nm-thickness i-AlAs barrier layer 30a of a 1.36 eV barrier height, an about 3 nm-thickness i-InGaAs well layer 30b, an about 3 nm-thickness i-In$_{0.35}$Al$_{0.65}$As barrier layer 30c of a 0,785 eV barrier height, an about 3 nm-thickness i-InGaAs well layer 30d, and an about 3 nm-thickness i-In$_{0.52}$Al$_{0.48}$As barrier layer 30e of a 0.53 eV barrier height are formed. A part or the entire of the surface of the barrier layer 30, e.g., the uppermost i-In$_{0.52}$Al$_{0.48}$As barrier layer 30e doped with a $1 \times 10^{18}$ cm$^{-3}$ dose of silicon.

The active layer 36 is formed of an about 30 nm-thickness non-doped i-In$_{0.53}$Ga$_{0.47}$As layer as is the channel layer 18. electrons supply from the donor layer 34 into the active layer 36 to form a two-dimensional electron channel in the active layer 34.

A source electrode 40 and a drain electrode 42 are formed on the contact layer 20. A gate electrode 44 is formed of tungsten silicide (WSi) or aluminum (Al) is formed in that of the active layer 36 between the source electrode 40 and the drain electrode 42.

The fifth embodiment reads information, based on flows of currents in a two-dimensional electron channel in the channel layer. Accordingly information can be read at very high speed. A HEMT can be formed on a common semi-insulating InP substrate with the semiconductor memory device. Accordingly peripheral circuits for amplification of stored information and memory elements can be easily formed.

Figure 8A:
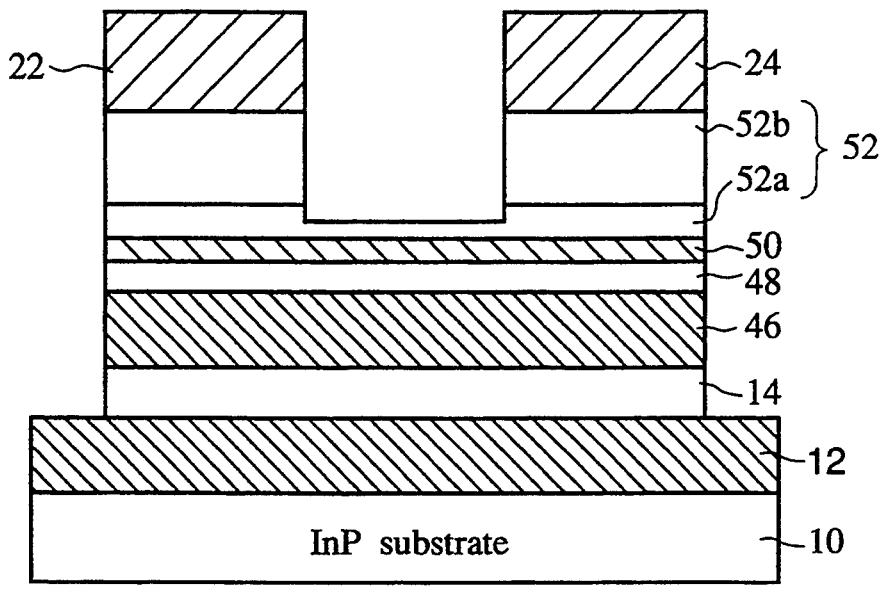
FIGS. 8A to 8C are views of the semiconductor memory device according to a sixth embodiment of the present invention.
Figure 8B:
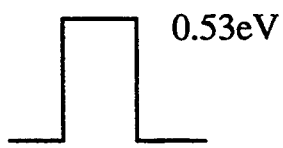
Figure 8C:
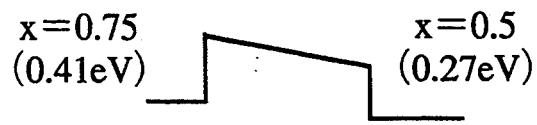

The semiconductor memory device according to a sixth embodiment of the present invention will be explained with reference to FIGS. 8A to 8C.

An about 300 nm-thickness thick barrier layer 12 of non-doped i-In$_{0.52}$Al$_{0.48}$As is formed on a semi-insulating InP substrate 10. An about 200 nm-thickness floating conducting layer 14 of n-In$_{0.53}$Ga$_{0.47}$As doped with a $1 \times 10^{18}$ cm$^{-3}$ dose of silicon is formed on the thick barrier layer 12.

An about 200 nm-thickness intermediate barrier layer 46 of non-doped i-In$_{0.52}$(Al$_x$Ga$_{1-x}$)$_{0.48}$As is formed on the floating conducting layer 14. An aluminium composition ratio (x value) of the i-In$_{0.52}$(Al$_x$Ga$_{1-x}$)$_{0.48}$As of the intermediate barrier layer 46 is linearly increased from the side of the substrate to the side of surface from x=0.5 to x=0.75. As shown in FIG. 8C, the intermediate barrier layer 46 has a barrier height as low as 0.27 eV on the side of the floating conducting layer 14, and the barrier gradually increases to a barrier height of 0.41 eV on the upper surface.

An about 30 nm-thickness channel layer 48 of n-In$_{0.53}$Ga$_{0.47}$As doped with a $1 \times 10^{18}$ cm$^{-3}$ dose of silicon is formed on the intermediate barrier layer 46. An about 20 nm-thickness thin barrier layer 50 of non-doped i-In$_{0.52}$Al$_{0.48}$As is formed on the channel layer 48. As shown in FIG. 8B, the thin barrier layer 50 has a symmetrical barrier of a constant 0.5 eV barrier height.

A contact layer 52 including an about 20 m-thickness n-In$_{0.53}$Ga$_{0.47}$As layer 52a doped with varied doses of silicon from $5 \times 10^{17}$ cm$^{-3}$ to $5 \times 10^{19}$ cm$^{-3}$ and an about 60 nm-thickness n-In$_{0.53}$Ga$_{0.47}$As layer 52b doped with a $5 \times 10^{19}$ cm$^{-3}$ dose of silicon is frmed on the thin barrier layer 50.

Two convexities are provided on the contact layer 52 for two electrodes to be formed on. A first and a second electrodes 22, 24 are formed respectively on the two convexities of the contact layer 52.

Then the method for storing information in the semiconductor memory device according to the sixth embodiment will be explained.

The method for writing information will be explained.

When information is written in the semiconductor memory device, one electrode, e.g., the first electrode 22, of the first and the second electrodes 22, 24 is grounded, and a write bias voltage is applied to the second electrode 24 so that the second electrode 24 has a 1.5-2.0 eV positive potential. When the write bias voltage is applied to the second electrode 24, electrons are injected from the first electrode 22 to the thin channel layer 48 through the thin barrier layer 50. The electrons injected into the thin channel layer 48 become hot electrons having 0.5-0.6 eV energy and pass through the intermediate barrier layer 46 to be injected into the thick floating conducting layer 14 and accumulated there.

When the electrons are accumulated in the thick floating conducting layer 14, a potential of the floating conducting layer 14 rises, and the channel layer 48 is depleted from the side of the semi-insulating InP substrate 10. When the channel layer 48 has been depleted, no electrons flow into the second electrode 24 through the channel layer 48, and no current flows from the second electrode 24 to the first electrode 22. Such state where electrons are accumulated in the floating conducting layer 14 can be written as stored information "1".

Then the method for reading information will be explained.

In the sate where no electric charge is accumulated in the floating conducting layer 14, the channel layer 48 is not depleted. Accordingly when a read bias voltage of about 1 V which is lower than the write bias voltage is applied between the first and the second electrodes 22, 24, an about $10^3$ A/cm$^2$ current flows.

When an electric charge is accumulated in the floating conducting layer 14, a depletion layer is extended from the floating conducting layer 14 to substantially deplete the channel layer 48. Substantially no current flows between the first and the second electrodes 22, 24.

Thus, a read bias voltage is applied, and presence of a current flowing between the first and the second electrodes 22, 24 is detected, whereby stored information can be read based on whether an electric charge has been accumulated in the floating conducting layer 14.

In the state where no electrons are accumulated in the floating conducting layer 14 (stored information "0"), even when an about 1 V bias voltage is applied to, the electrons injected into the channel layer 48 are reflected against the intermediate barrier layer 46 and fail to arrive at the floating conducting layer 14. Stored information is never changed by injected electrons into the floating conducting layer 14 by reading information.

In the state where electrons are accumulated in the floating conducting layer 14 (stored information "1"), the channel layer 48 has been depleted, and accordingly with an about 1 V read bias voltage, substantially no electrons are injected. Stored information is never changed by discharging electrons from the floating conducting layer 14 by reading information.

Next, the method for erasing written information will be explained.

When a 3-4 V voltage is applied between the first and the second electrodes 22, 24 with electrons accumulated in the floating conducting layer 14, a current begins to flow through the intermediate barrier layer 46 of i-In$_{0.52}$(Al$_x$Gs$_{1-x}$)$_{0.48}$As. At this time, since the intermediate barrier layer 46 has a barrier height lowered from the side of the surface to the side of the substrate, a current from the floating conducting layer 14 to the second electrode 24 is larger than that from the first electrode 22 to the floating conducting layer 14, and electrons accumulated in the floating conducting layer 14 are discharged. Thus information written in the floating conducting layer 14 is erased.

When electrons accumulated in the floating conducting layer 14 are discharged, a depletion layer in the channel layer 48 is shortened. When a read bias voltage is applied, a current flow between the first and the second electrodes 22, 24.

In the sixth embodiment, increasing the thickness of the intermediate barrier layer 46 can make discharge of accumulated electrons in the floating conducting layer 14 difficult. A holding time of stored information "1" can be much elongated to, e.g., about 10 minutes. The state where no electrons are accumulated in the floating conducting layer 14 (stored information "0") is held permanently unless a write is conducted.

Thus according to the sixth embodiment, high speed electrically programmable ROMS (EPROMs), memories which can read and write, and require rewrite (DRAMs) can be realized. Only two lines are provided, which enables higher integration and can shorten a writing time.

Figure 9:
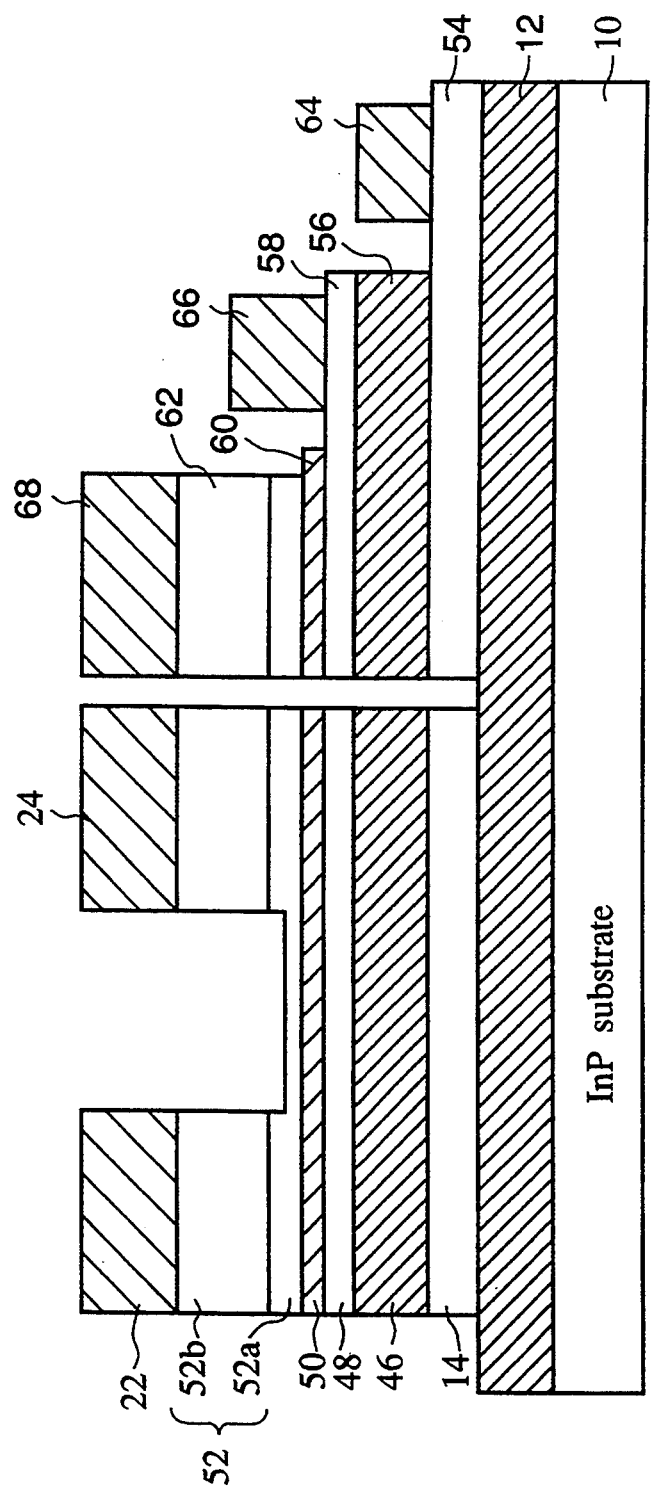
FIG. 9 is a view of the semiconductor memory device according to a seventh embodiment of the present invention.

Then, the semiconductor memory device according to a seventh embodiment of the represent invention will be explained with reference to FIG. 9.

Common members of the seventh embodiment with the sixth embodiment are represented by common reference numerals not to repeat their explanation.

An about 300 nm-thickness thick barrier layer 12 of non-doped i-$In_{0.52}Al_{0.48}As$ is formed on a semi-insulating InP substrate 10. On the thick barrier layer 12, as in the sixth embodiment, an about 200 nm-thickness floating conducting layer 14 of n-$In_{0.53}Ga_{0.47}As$, an about 200 nm-thickness thick intermediate barrier layer 46 of i-$In_{0.52}(Al_xGa_{1-x})_{0.48}As$ thick intermediate barrier layer 46, an about 30 nm-thickness channel layer 48 of n-$In_{0.53}Ga_{0.47}As$, an about 20 nm-thickness thin barrier layer 50 of i-$In_{0.52}Al_{0.48}As$, and a contact layer 50 of i-$In_{0.53}Ga_{0.47}As$ are formed in the stated order are formed on the thick barrier layer 12, device-isolated in the region on the left side of FIG. 9. A first and a second electrodes 22, 24 are formed on the contact layer 50. Thus the semiconductor memory device according to the seventh embodiment is formed in the region on the left side of the semi-insulating InP substrate 10.

In the region on the right side of the semi-insulating InP substrate 10 a HET or RHET having the same laminar structure as the semiconductor memory device is formed. That is, an about 200 nm-thickness n-$In_{0.53}Ga_{0.47}As$ collector layer 54, an about 200 nm-thickness i-$In_{0.52}(Al_xGa_{1-x})_{0.48}As$ barrier layer 56, an about 30 nm-thickness base leading layer 54 of i-$In_{0.53}Al_{0.48}As$, an about 20 nm-thickness thin base layer 60 of i-$In_{0.52}Ga_{0.48}As$, and an about 60 nm-thickness emitter layer 62 of n-$In_{0.53}Ga_{0.47}As$ are formed in steps, device-isolated on the thick barrier layer 12.

The collector layer 54 corresponds to the floating conducting layer 14, the barrier layer 56 corresponds to the intermediate barrier layer 46, the base leading layer 58 corresponds to the channel layer 48, the base layer 60 corresponds to the thin barrier layer 50, and the emitter layer 62 corresponds to the contact layer 52.

A collector electrode 64 is formed on the collector layer 54. A base electrode 66 is formed on the base leading layer 58. An emitter electrode 68 is formed on the emitter layer 62.

Thus, in the region on the right side of the semi-insulating InP substrate 10 a multi-emitter type InGaAs/In(AlGa)As hot electron transistor (HET) or a resonant tunneling hot electron transistor (RHET) can be formed.

The semiconductor memory device according to an eighth embodiment of the present invention will be explained with reference to FIGS. 10A to 10C and 11.

Common members of the eighth embodiment with that according to the sixth embodiment are represented by common reference numerals not to repeat their explanation.

A thick barrier layer 12 and a floating conducting layer 14 are formed on a semi-insulating InP substrate 10 in the stated order. An intermediate barrier layer 46 is formed on the floating conducting layer 14. The intermediate barrier layer 46 of the eighth embodiment is formed of i-$In_{0.52}(Al_{0.875}Ga_{0.125})_{0.48}As$ in an about 30 nm-thickness and, as shown in FIG. 10C, has a constant symmetrical barrier of a 0.46 eV height.

A channel layer 48 is formed on the intermediate barrier layer 46. A thin barrier layer 70 having a resonant tunneling barrier (RTB) is formed on the channel layer 48.

Figure 10A:
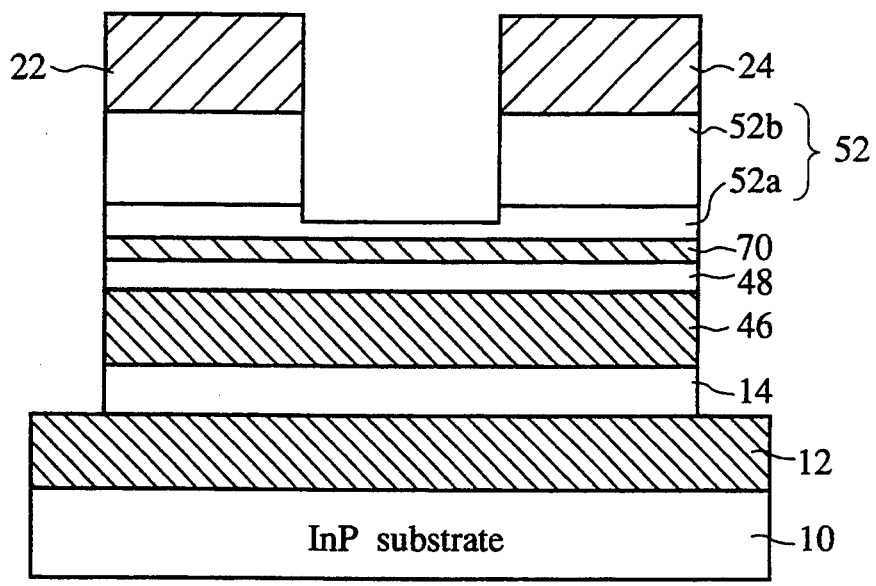
FIGS. 10A to 10C are views of the semiconductor memory device according to an eighth embodiment of the present invention.
Figure 10B:
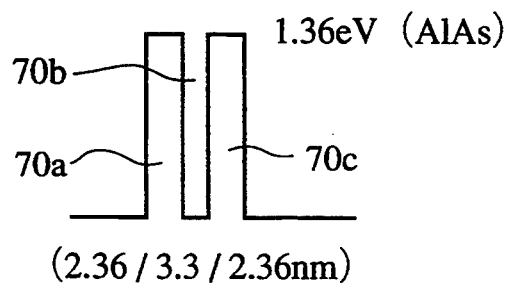
Figure 10C:
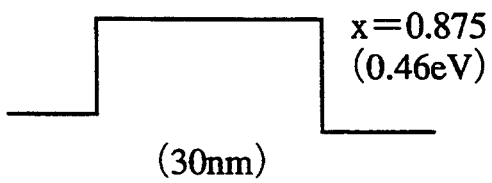

As shown in FIG. 10A, the thin barrier layer 70 includes, from the side of the floating conducting layer 14, an about 2.36 nm-thickness i-AlAs barrier layer 70a of a 1.36 eV barrier height, an about 3.3 nm-thickness i-InGaAs well layer 70b, and an about 2.36 nm-thickness i-AlAs barrier layer 70c of a 1.36 eV barrier height laid one on another.

A contact layer 52 is formed on the thin barrier layer 70, and a first and a second electrodes 22, 24 ar formed on the contact layer 52.

Figure 11:
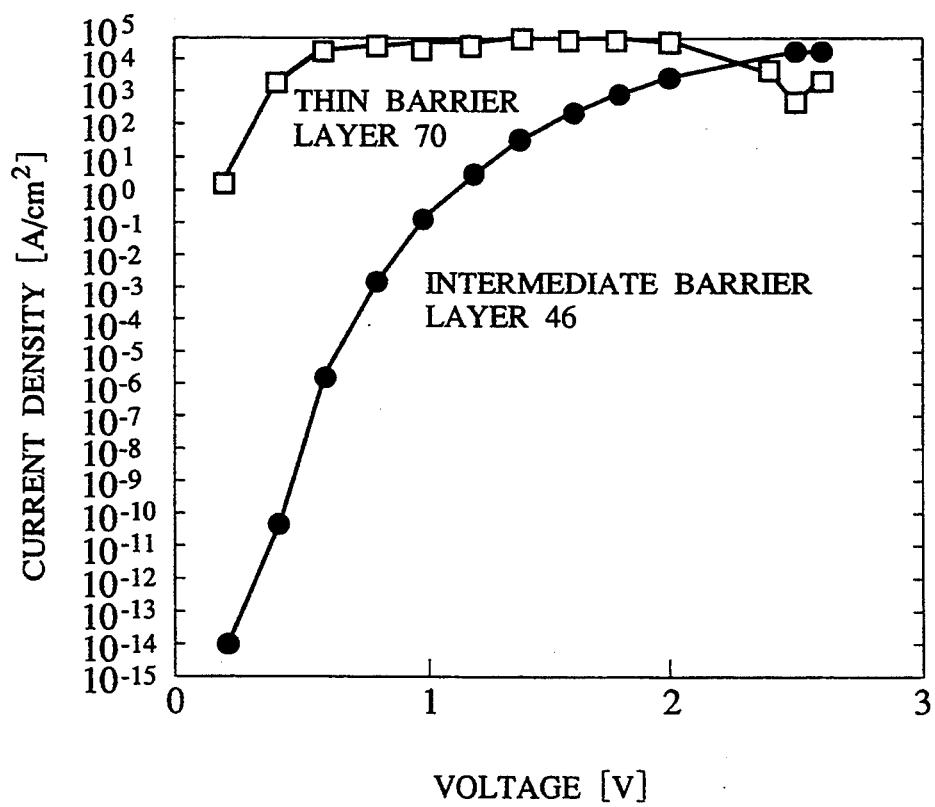
FIG. 11 is a graph of current-voltage characteristics of an intermediate barrier layer and a thin barrier layer of the semiconductor memory device according to the eighth embodiment.

The, the method for storing information in the semiconductor memory device according to the eighth embodiment will be explained with reference to FIG. 11. FIG. 11 is a graph of current-voltage characteristics of the intermediate barrier layer 46 and the thin barrier layer 70 at 77 K.

The method for writing information will be explained.

When an about 1.6 V bias voltage is applied between the first an the second electrodes 22, 24, first an about 0.8 V voltage is applied to both the thin barrier layer 70 and the intermediate barrier layer 46. As shown in FIG. 11, a current as large as about $5 \times 10^4$ A/cm$^2$ flows through the thin barrier layer 70, and electrons are injected into the channel layer 48. Electrons injected into the channel layer 48 have such high energy of 0.7 eV that they arrive at the floating conducting layer 14 beyond the intermediate barrier layer 46. As shown in FIG. 11, even when an about 0.8 V voltage is applied, only an about $1 \times 10^{-3}$ A/cm$^2$ current flows in the intermediate barrier layer 46. Accordingly electrons are accumulated in the floating conducting layer 14, and stored information "1" is written.

When stored information "1" is written, and electrons are accumulated in the floating conducting layer 14, a potential thereof rises, and a depletion layer is extended to the channel layer 48. In this state, when the bias voltage between the first and the second electrodes 22, 24 is made 0 V, the channel layer 48 is depleted due to a potential of the floating conducting layer 14.

Next the method for reading information will be explained.

Since the channel layer 48 is not depleted in the state where no electric charge is accumulated in the floating conducting layer, an about $10^4$ A/cm$^2$ current flows in the channel layer 48 through the thin barrier layer 70 when an about 0.7 V read bias voltage lower than a write bias voltage is applied between the first and the second electrodes 22, 24.

But in the sate where an electric charge is accumulated in the floating conducting layer 14, the depletion layer is extended from the floating conducting layer 14, and the channel layer 48 is substantially depleted. Substantially no current flows between the first and the second electrodes 22, 24.

Thus, a read bias voltage is applied, and presence of a current flow between the first and the second electrodes 22, 24, whereby stored information can be read based on whether an electric charge is accumulated in the floating conducting layer 14.

When an about 0.7 V bias voltage is applied between the first and the second electrodes 22, 24, electrons are injected into the channel layer 48 through the thin barrier layer 70, but the electron injection energy is as low as about 0.35 eV and accordingly cannot clear the thick intermediate barrier layer 46. No electrons are injected into the floating conducting layer 14, and an electron accumulated state is held.

In this state, when an about 1.6 bias voltage which is the same as a write bias voltage is applied between the first and the second electrodes 22, 24, no voltage is applied to the thin barrier layer 70, and no electrons are injected. At this time, an about 0.7 V voltage is applied to the intermediate barrier layer 46, but as shown in FIG. 11, because of a low current density of about $10^{-6}$ A/cm$^2$, accumulated electrons take time to be discharged, and stored information can be held for about 1 second. The stored information can be continuously held by making the bias voltage a short pulse of below 1 second.

Next, the method for erasing information will be explained.

When an erase bias voltage as high as about 4 V is applied between the first and the second electrodes 22, 24, an about 2 V voltage is applied to the intermediate barrier layer 46. As shown in FIG. 11, a current density through the intermediate barrier layer 46 is about $10^4$ A/cm$^2$, and electrons accumulated in the floating conducting layer 14 are rapidly discharged in a period of time of about 10 pico second. And stored information "1" is erased, and stored information "0" is written.

In the sate where electrons have been discharged from the floating conducting layer 14, even when an erase bias voltage as high as about 4 V continuously applied between the first and the second electrodes 22, 24, most of a voltage (about 2.5 V) is applied to the thin barrier layer 70 with a resonant tunneling barrier. But as shown in FIG. 11, the thin barrier layer 70 has a valley state at 2.5 V and has a current density as low as about $10^2$ A/cm$^2$. Accordingly injected electrons do not arrive at the floating conducting layer 14. Most injected electrons are diffused into the L valley to flow in the channel layer 48. Accordingly substantially no electrons are accumulated in the floating conducting layer 14. Thus even when an erase bias voltage higher than a write bias voltage is applied to, stored information "1" in the electron accumulated state cannot be written.

Figure 12:
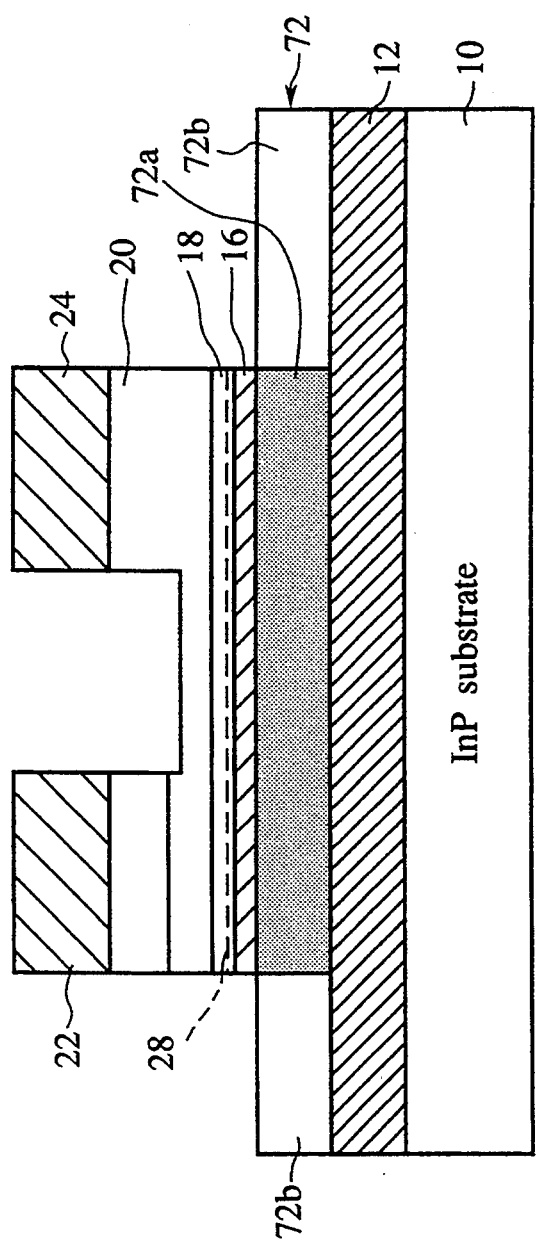
FIG. 12 is a view of the semiconductor memory device according to a ninth embodiment of the present invention.

The semiconductor memory device according to a ninth embodiment of the present invention will be explained with reference to FIG. 12. In the ninth embodiment, the semiconductor memory device is formed on a selected region. In the ninth embodiment, the semiconductor memory device according to the fifth embodiment, for example, is formed.

An about 300 nm-thickness thick barrier layer 12 of non-doped i-In$_{0.52}$Al$_{0.48}$As is formed on a semi-insulating InP substrate 10. An about 200 nm-thickness In$_{0.53}$Ga$_{0.47}$As layer 72 is formed on the entire surface of the thick barrier layer 12. The In$_{0.53}$Ga$_{0.47}$As layer 72 has only the central region for the semiconductor memory device to be formed in doped with a $5 \times 10^{17}$ cm$^{-3}$ dose of silicon, and a floating conducting layer 72a of n-In$_{0.53}$Ga$_{0.47}$As is formed. A device isolation layer 72b of non-doped n-In$_{0.53}$Ga$_{0.47}$As is formed around the floating conducting layer 72a.

A thin barrier layer 30 having a resonant tunneling barrier (RTB) of an asymmetric resonance level height is formed on the floating conducting layer 72a. The thin barrier layer 30 includes, from the side of the floating conducting layer 14, an i-AlAs barrier layer 30a of a 0.53 eV barrier height, an i-InGaAs well layer 30b, an i-In$_{0.35}$Al$_{0.65}$As barrier layer 30c of a 0.785 eV barrier height, an i-InGAs well layer 30d, and an i-In$_{0.52}$Al$_{0.48}$As barrier layer 30c of a 0.53 eV barrier height laid one on another. In the ninth embodiment, the uppermost i-In$_{0.52}$Al$_{0.48}$As barrier layer 30e is doped with a $1 \times 10^{18}$ cm$^{-3}$ dose of silicon.

A channel layer 18, a contact layer 20 are laid on the thin barrier layer 30 one on another in the stated order. A first and a second electrodes 22, 24 are formed on the contact layer 20. Electrons supply from the barrier layer 30e into the channel layer 18, and a two-dimensional electron channel 28 is formed in the channel layer 18.

Thus the semiconductor memory device according to the ninth embodiment is formed in a selected region on the semi-insulating InP substrate 10.

In place of the non-doped In$_{0.53}$Ga$_{0.47}$As layer 72, an p-In$_{0.53}$Ga$_{0.47}$As layer or a p-In$_{0.52}$Ga$_{0.48}$As layer, doped with an about $5 \times 10^{17}$ cm$^{-3}$ dose of silicon may be used. The resultant semiconductor memory device has small leak currents and long holding times.

Then, the process for fabricating the semiconductor memory device according to the ninth embodiment will be explained.

First, the about 300 nm-thickness non-doped i-In$_{0.52}$Al$_{0.48}$As thick barrier layer 12 and the about 200 nm-thickness non-doped In$_{0.53}$Ga$_{0.47}$As layer 72 are deposited on the semi-insulating InP substrate 10 by electron beam epitaxy (MBE).

Then a resist layer (not shown) is applied onto the In$_{0.53}$Ga$_{0.47}$As layer 72 and is patterned so that a region for the semiconductor memory device to be formed in opened. Then, with the patterned resist layer as a mask, a $5 \times 10^{12}$ cm$^{-2}$ dose of silicon, an impurity, is selectively ion-implanted at injection energy of about 100 KeV. Subsequently the In$_{0.53}$Ga$_{0.47}$As layer 72 is annealed at 900° C. for about 5 seconds by flush lamp annealing to be activated so that a floating conducting layer 72a of n-In$_{0.53}$Ga$_{0.47}$As doped with a $5 \times 10^{17}$ cm$^{-3}$ dose is formed selectively in the In$_{0.53}$Ga$_{0.47}$As layer 72.

In place of the non-doped In$_{0.53}$Ga$_{0.47}$As layer 72, an p-In$_{0.53}$Ga$_{0.47}$As layer or a p-In$_{0.52}$Ga$_{0.48}$As layer, doped with an about $5 \times 10^{17}$ cm$^{-3}$ dose of silicon is deposited. Silicon is ion-implanted into this layer, whereby the floating conducting layer in the form of an n-semiconductor layer in a p-semiconductor layer.

Then an about 20 nm-thickness non-doped i-In$_{0.52}$(Al$_x$Ga$_{1-x}$)$_{0.48}$As thin barrier layer 16, an about 300 nm-thickness channel layer 18 of n-In$_{0.53}$Ga$_{0.47}$As doped with a $5 \times 10^{17}$ cm$^{-3}$ dose of silicon, and an about 70 nm-thickness n-In$_{0.53}$Ga$_{0.47}$As doped with varied doses of silicon from $5 \times 10^{17}$ cm$^{-3}$ to $5 \times 10^{19}$ cm$^{-3}$ are continuously crystal grown.

Then, an about 200 nm-thickness tungsten silicide (WSi) layer, for example, is formed on the contact layer 20. Subsequently a first and a second electrodes 22, 24 are formed by the usual photolithography.

Then with the first and the second electrodes 22, 24 as a mask, a part of the contact layer 20 between the first and the second electrodes 22, 24 is etched off by RIE technique using $CH_4$ and $H_2$ under the etching conditions of a 4 Pa gas pressure and a 60 W RF power, while etched off down to the $In_{0.52}Ga_{0.47}As$ layer 72 around the first and the second electrode 22, 24. And the semiconductor memory device according to a ninth embodiment is completed.

The semiconductor memory device according to a tenth embodiment of the present invention will be explained with reference to FIGS. 13A and 13B, and 14A to 14D.

An about 300 nm-thickness thick barrier layer 12 of non-doped $i\text{-}In_{0.52}Al_{0.48}As$ is formed on a semi-insulating InP substrate 10. An about 200 nm-thickness floating conducting layer 14 of $n\text{-}In_{0.53}Ga_{0.47}As$ doped with a $1 \times 10^{18}$ cm$^{-3}$ dose of silicon (Si) is formed on the thick barrier layer 12.

Figure 13A:
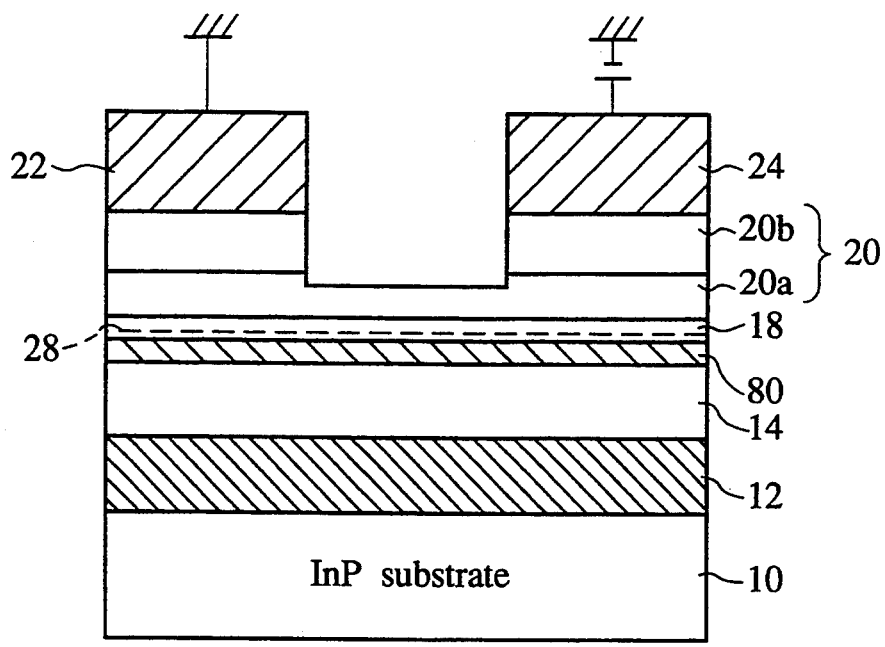
FIGS. 13A and 13B are views of the semiconductor memory device according to a tenth embodiment of the present invention.
Figure 13B:
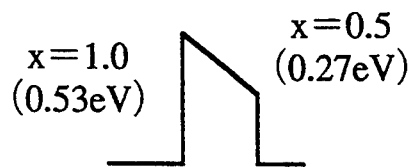

An about 20 nm-thickness thin barrier layer 80 of non-doped $i\text{-}In_{0.52}(Al_xGa_{1-x})_{0.48}As$ is formed on the floating conducting layer 14. An aluminium composition ratio (x value) of $i\text{-}In_{0.52}(Al_xGa_{1-x})_{0.48}As$ of the thin barrier layer 80 is changed linearly from the side of the semi-insulating InP substrate 10 to the side of the surface from x=0.5 to x=1.0. As shown in FIG. 13B, the thin barrier layer 80 has a barrier height as low as 0.27 eV on the side of the floating conducting layer 14, the barrier height is gradually increased up to 0.53 eV on the upper surface thereof.

An about 30 nm-thickness channel layer 18 of non-doped $i\text{-}In_{0.53}Ga_{0.47}As$ is formed on the thin barrier layer 80. A contact layer 20 including an about 20 nm-thickness-n-$In_{0.53}Ga_{0.47}As$ layer 20a doped with varied doses of silicon from $1 \times 10^{18}$ cm$^{-3}$ to $5 \times 10^{19}$ cm$^{-3}$ and an about 50 nm-thickness n-$In_{0.53}Ga_{0.47}As$ layer 20b s formed on the channel layer 18. two convexities are provided on the contact layer 20 for two electrodes to be formed on.

A fist electrode 22 and a second electrode 24 of an about 200 nm-thickness tungsten silicide (WSi) layer are formed on the two convexities of the contact layer 20. The first and the second electrodes 22, 24 may be formed of, in place of the tungsten silicide layer, a Cr/Au layer of an about 20 nm-thickness chrome layer and an about 190 nm-thickness metal laid one on another, or a Pd/Ge layer of an about 60 nm-thickness paradium layer and an about 80 nm-thickness germanium layer laid one on another.

Then the method for storing information in the semiconductor memory device according to the tenth embodiment will be explained with reference to FIGS. 14A to 14D. FIGS. 14A to 14D aer a graph of forward and reverse current-voltage characteristics of a thin barrier layer of the tenth embodiment.

First, the method for writing information will be explained.

When information is written in the semiconductor memory device, one, e.g., the first electrode 22 of the first and the second electrodes 22, 24 is grounded, and a write bias voltage is applied to the second electrode 24 so that the second electrode 24 has a positive potential. When such write bias voltage is applied to, electrons stored in the floating conducting layer 14 tunnel the thin barrier layer 80 and flows into the channel layer 18 to be discharged from the second electrode 24 while electrons tunnel the thin barrier layer 80 from the first electrode 22 t be injected into the floating conducting layer 14.

As shown in FIG. 14B, the thin barrier layer 80 has inclined barrier heights from the side of the floating conducting layer to the side of the channel layer 18 from 0.27 eV to 0.53 eV. A forward barrier for electrons flowing from the first electrode 22 to the floating conducting layer 14 has a band structure as shown in FIG. 14C which is difficult for electrons to tunnel. A reverse barrier for electrons flowing from the floating conducting layer 14 to the second electrode 24 has a band structure as shown in FIG. 14D which is easy for electron to tunnel.

FIG. 14A shows forward and reverse current values to bias voltages applied at 77 K to the thin bias layer 80 of the inclined band structure. There is no substantial difference in current value between forward and reverse currents up to about 0.5 V bias voltage. The currents values are so small as about 0.5 A/cm$^2$. But at about 0.9 V a forward current value is $10^2$ A/cm$^2$, and a reverse current value is $10^5$ A/cm$^2$. A difference between the current values is even about 1000 times.

When the first electrode 22 is grounded, and an bout 1.8 V voltage is applied to the second electrode 24, at the time of the application, substantially equal forward and reverse bias voltages (about 0.9 V) are applied to the thin barrier layer 80. Electrons corresponding to an about $10^{-6}$ C/cm$^2$ electric charge is discharged from the floating conducting layer 14 for a very short period of time of about 1 ps.

Consequently a potential of the floating conducting layer 14 is lowered by about 0.2 V. An equilibrium state is obtained at a voltage at which forward and reverse current values are substantially equal to each other (in this case about 1.2 V to the thin barrier layer in the forward direction, and about 0.7 V to the thin barrier layer 80 in the reverse direction), and electrons are discharged from the floating conducting layer 14. When electrons are discharged from the floating conducting layer 14, a two-dimensional electron channel 28 is formed in the channel layer 18, and a current flows between the first and the second electrodes 22, 24. Information can be written.

At this time when a voltage of the second electrode 24 is made 0 V, a potential of the floating conducting layer 14 is lowered by about 0.2 V. But as shown in FIG. 14A, even when a potential of the floating conducting layer 14 is lowered by about 0.2 V, a forward and a reverse current values are about $10^{-5}$ A/cm$^2$. and electrons are slowly injected into the floating conducting layer 14. This state is held for about 10 ms. When electrons are further injected into the floating conducting layer 14, a potential of the floating conducting layer 14 is increased, and electrons are more slowly injected. For example, in a state where a potential of the floating conducting layer 14 is lower by about 0.1 V, the state is held for about 1 second.

Then the method for reading information will be explained.

In a state where electrons are not discharged from the floating conducting layer 14, substantially no current flows between the first and the second electrodes 22, 24 even when an about 0.5 V voltage is applied between the first and the second electrodes 22, 24.

In contrast to this, in a state where electrons are discharged from the floating conducting layer 14, a two-dimensional electron channel 28 is formed in the channel layer 18, and a large current flows between the first and the second electrodes 22, 24.

Thus, a read bias voltage is applied to, and presence of a current flowing between the first and the second electrodes 22, 24 is detected, whereby stored information can be read based on whether or not electrons are discharged from the floating conducting layer 14.

A current flowing through the thin barrier layer 80 is only about $10^{-4}$ A/cm$^2$ when a 0.5 V read bias voltage is applied between the first and the second electrodes 22, 24 uninfluentially to reading stored information.

In the tenth embodiment, electrons accumulated in the floating conducting layer 14 are discharged in about 1 second, and stored information is lost. A thickness of the thin barrier layer 80 is increased to about 20 nm—about 30 nm, whereby stored information can be retained for about 24 hours.

Then the method for erasing information will be explained.

In the state in which electrons are discharged from the floating conducting layer 14, and a two-dimensional electron channel 28 is formed in the channel layer 18, when an about 1.0 V erase voltage is applied between the first and the second electrodes 22, 24, the electrons in the two-dimensional electron channel 28 become hot electrons and are injected into the floating conducting layer 14 beyond the thin barrier layer 80. In this case, since the thin barrier layer 80 has a barrier height lowered from the side of the surface to the side of the substrate, the hot electrons tend to return to the floating conducting layer 14. When an about 1.0 V voltage is continuously applied between the first and the second electrodes 22, 24, the two-dimensional electron channel 28 in the channel layer 18 vanishes, and information written in the floating conducting layer 14 is erased.

UV radiation is irradiated to inject electrons into the floating conducting layer 14, whereby information can be erased in blocks.

It is preferable that the semiconductor memory device according to the tenth embodiment is operated at a low temperature below 77K so as to suppress thermonic current components.

The semiconductor memory device according to the tenth embodiment is an electrically programmable ROM. Only 2 lines are provided, which enables higher integration and shorten a writing period of time.

The process for fabricating the semiconductor memory device according to the tenth embodiment will be explained.

First, the following layers are continuously crystal-grown on the semi-insulating InP substrate 10 by electron beam epitaxy in the order to be next stated. The about 300 nm-thickness thick barrier layer (buffer layer) 12 of non-doped i-In$_{0.52}$Al$_{0.48}$As is formed on the substrate 10, and then the about 200 nm-thickness floating conducting layer 14 of n-In$_{0.53}$Ga$_{0.47}$As doped with a $1 \times 10^{18}$ cm$^{-3}$ dose of silicon (Si), an bout 200 nm-thickness thin barrier layer 80 of non-doped i-In$_{0.52}$(Al$_x$Ga$_{1-x}$)$_{0.48}$As, the about 30 nm-thickness channel layer 18 of non-doped In$_{0.53}$Ga$_{0.47}$As, an about 20 nm-thickness n-In$_{0.53}$Ga$_{0.47}$As layer 20a doped with a $5 \times 10^{19}$ cm$^{-3}$ dose of silicon, and the about 50 nm-thickness n-In$_{0.53}$Ga$_{0.47}$As layer 20b doped with a $5 \times 10^{19}$ cm$^{-3}$ dose of silicon are formed.

Then on the contact layer 20, an about 200 nm-thickness tungsten silicide (WSi) layer, a Cr/Au layer of an about 20 nm-thickness chrome layer and an about 10 nm-thickness gold layer laid one on another, or a Pd/Ge layer of an about 60 nm-thickness paradium layer and an about 80 nm-thickness germanium layer is formed. Subsequently a first and a second electrode 22, 24 are pattern-etched by the usual photolithography.

Then with the first and the second electrodes 22, 24 with a mask, that of the n-In$_{0.53}$Ga$_{0.47}$As layer 20b and the n-In$_{0.53}$Ga$_{0.47}$As layer 20a between the first and the second electrodes 22, 24 is etched off by RIE using CH$_4$ and H$_2$ under etching conditions of 4 Pa gas pressure and a 60 W RF power down to the thick barrier layer 12 around the firs and the second electrodes 22, 24. And the semiconductor memory device according to the tenth embodiment is completed.

Figure 15:
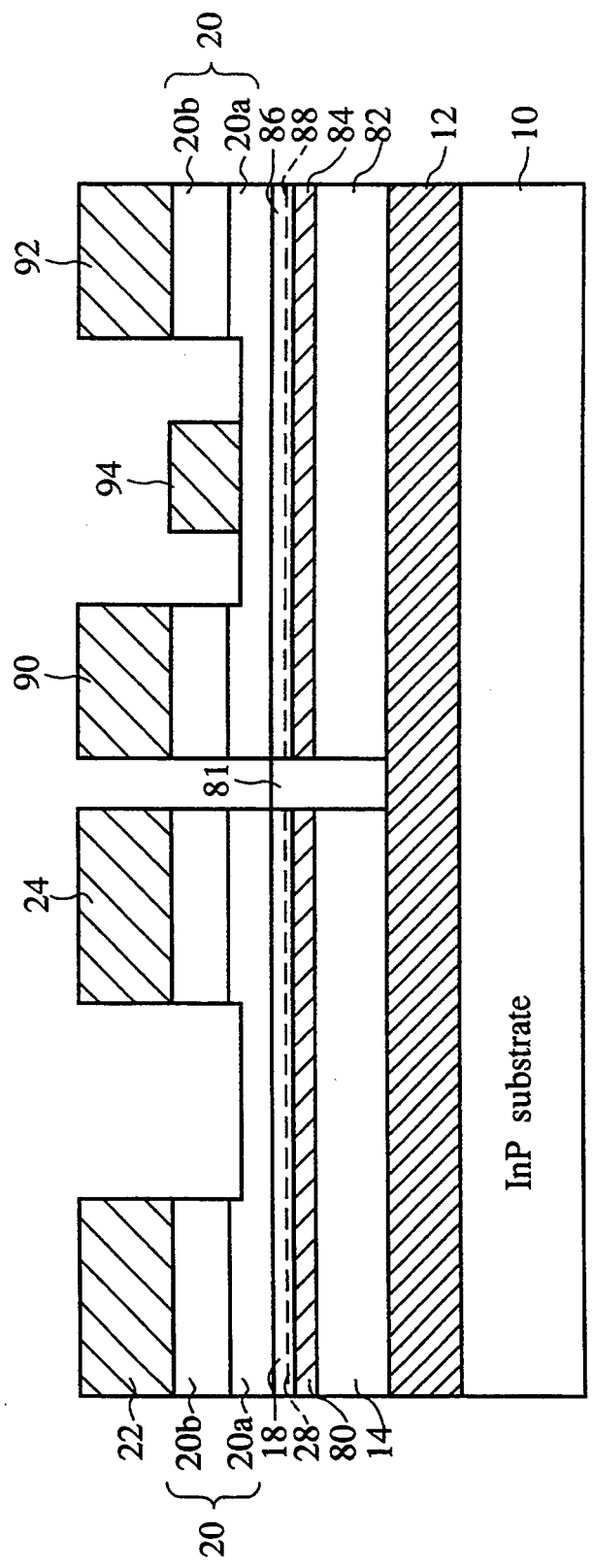
FIG. 15 is a view of the semiconductor memory device according to an eleventh embodiment of the present invention.
Figure 16:
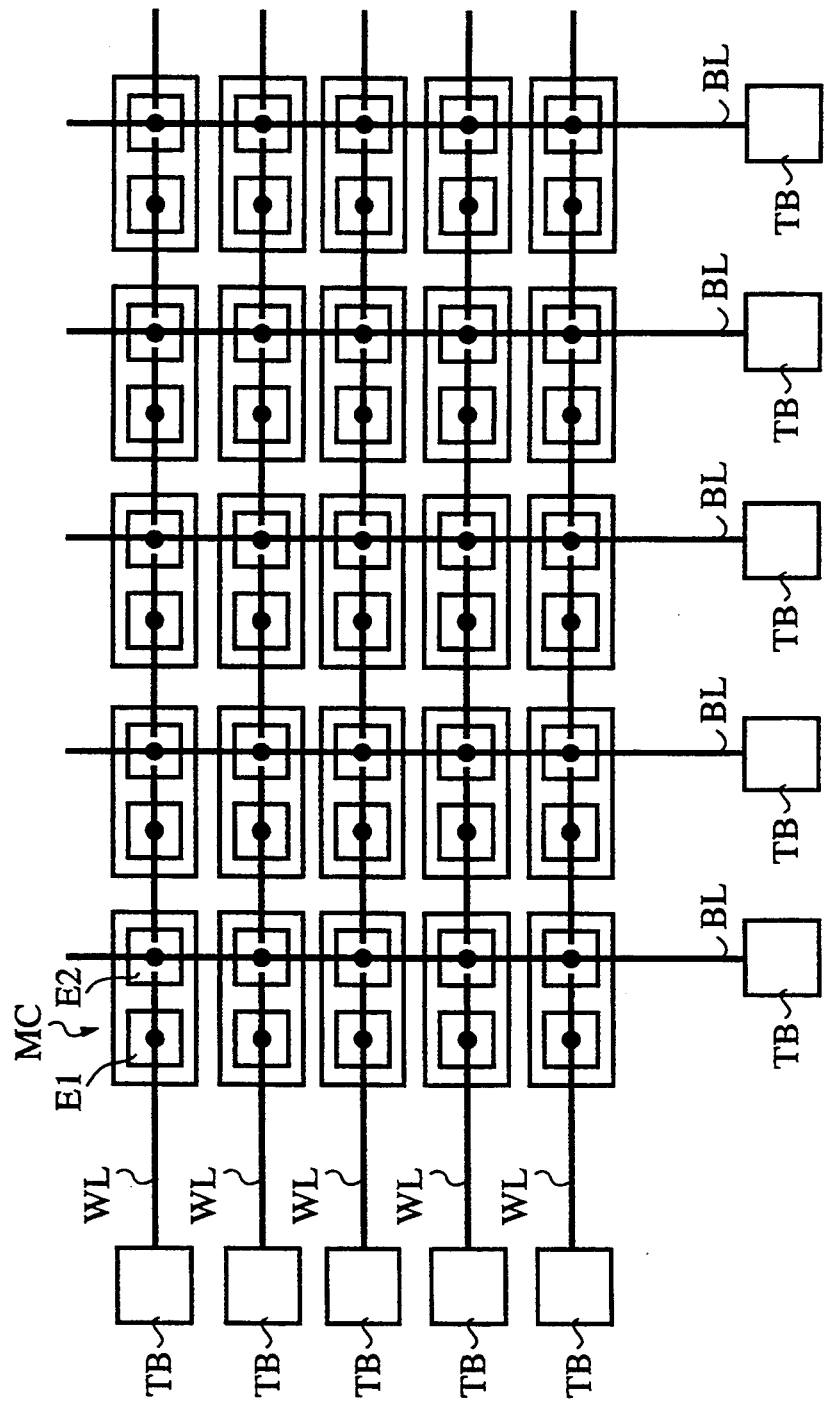
FIG. 16 is a view of the semiconductor memory device according to a twelfth embodiment of the present invention.

Then the semiconductor memory device according to an eleventh embodiment of the present invention will be explained with reference to FIG. 15. Common members of the semiconductor memory device according to the tenth embodiment are represented by common reference numerals not to repeat their explanation.

An about 300 nm-thickness thick barrier layer 12 of non-doped i-In$_{0.52}$Al$_{0.48}$As is formed on a semi-insulating InP substrate 10. On the thick barrier layer 12, as in the tenth embodiment, an about 200 nm-thickness thick floating conducting layer 14 n-In$_{0.53}$Ga$_{0.47}$As doped with a $5 \times 10^{17}$ cm$^{-3}$ dose of silicon, and an about 20 nm-thickness thin barrier layer 80 of non-doped i-In$_{0.52}$(Al$_x$Ga$_{1-x}$)$_{0.48}$As are formed, device-isolated in the region on the left side in FIG. 15.

As in the tenth embodiment, the thin barrier layer 80 has an aluminium composition ratio of i-In$_{0.52}$(Al$_x$Ga$_{1-x}$)$_{0.48}$As linearly changed from the side of the semi-insulating InP substrate to the side of surface from $x = 0.5$ to $x = 1.0$. The thin barrier layer 80 has a barrier height which is as low as 0.27 eV on the side of the floating conducting layer 14 and gradually rises up to a 0.53 eV at the upper surface.

An about 30 nm-thickness channel layer 18 of non-doped i-In$_{0.53}$Ga$_{0.47}$As is formed on the thin barrier layer 80. A contact layer 20 including an about 20 nm-thickness n-In$_{0.53}$Ga$_{0.47}$As layer 20a doped with varied doses of silicon from $1 \times 10^{18}$ cm$^{-3}$ to $5 \times 10^{19}$ cm$^{-3}$, and an about 50 nm-thickness n-In$_{0.53}$Ga$_{0.47}$As layer 20b doped with a $5 \times 10^{19}$ cm$^{-3}$ dose of silicon is formed on the channel layer 18. Convexities are provided on the contact layer 20 for forming two electrodes.

On the two convexities of the contact layer 20 a first electrode 22 and a second electrode of an about 200 nm-thickness tungsten silicide (WSi). Thus, as in the tenth embodiment, the semiconductor memory device is formed in the region of the semi-insulating InP substrate 10 on the left side.

In the region of the semi-insulating InP substrate 10 on the right side as well, a HEMT of the same laminar structure as the semiconductor memory device is formed. That is, on the thick barrier layer 12 an about 200 nm-thickness n-In$_{0.53}$Ga$_{0.47}$As layer 82 doped with a $5 \times 10^{17}$ cm$^{-3}$ dose of silicon, a donor layer 84, an active layer 86 and a contact layer 20 are laid one on another in the stated order, device-isolated by a device isolation layer 81.

The donor layer 84 is formed of an about 20 nm-thickness non-doped i-In$_{0.52}$(Al$_x$Ga$_{1-x}$)$_{0.48}$As as the thin barrier layer 80 of the semiconductor memory device.

The active layer 86 is formed of the same about 30 nm-thickness non-doped i-In$_{0.53}$Ga$_{0.47}$As as the channel layer 18. Electrons supply from the donor layer 34 into the active layer 36, and a two-dimensional electron channel 88 is formed in the active layer 86.

A source electrode 90 and a drain electrode 92 are formed on the contact layer 20, and a gate electrode 94 of aluminium (Al) or platinum (Pt) is formed on that of the n-$In_{0.53}Ga_{0.47}As$ layer 20a between the source electrode 90 and the drain electrode 92.

In the eleventh embodiment, information i read based on presence of a current in the two-dimensional electron channel in the channel layer. Information can be read at accordingly high speed. A HEMT can be formed on the same semi-insulating InP substrate as the semiconductor memory device. Accordingly peripheral circuits for amplification of stored information and memory devices can be easily formed.

Next, a semiconductor memory device according to a twelfth embodiment of the present invention will be explained with reference to FIGS. 16 and 17A to 17C. In the eleventh embodiment, a number of the memory cells according to the above-described first to the eleventh embodiments are arranged in matrices to form memories.

Each memory cell MC has a first electrode E1 and a second electrode E2. Word lines WL are formed of Ti/Pt/Au or others and connect the first electrodes E1 of the memory cells horizontally adjacent to each other. Bit lines BL normal to the word lines W1 are formed of Ti/Pt/Au or others and connect the second electrodes of the memory cells MC vertically adjacent to each other.

The respective word lines WL are connected to respective tristate buffers TB, and the respective bit lines are connected to respective tristate buffers TB.

The tristate buffers TB are circuits which do logic operations of the table of truth value of FIG. 17A. When a control signal OE is high level, a signal of low level is outputted for an input signal of high level, and a signal of high level is outputted for an input signal of low level. When a control signal OE is low level, an output signal has a high impedance whether an input signal is high or low level, and the word lines WL and the bit lines BL are disconnected from each other.

Examples of the circuit of the tristate buffers are shown in FIGS. 17B and 17C. FIG. 17B shows a circuit of a CMOS tristate buffer. FIG. 17C is a circuit of an E/D tristate buffer.

When information is written in a set memory cell MC of the memory cell array, the word line WL connected to the first electrode E1 of the set memory cell is made low level (0 V) by the tristate buffer TB, then the bit line BL connected to the second electrode E2 of the memory cell MC is made low level (0 V), and then the bit line BL connected to the second electrode of the memory cell MCs made high level (2 V). Thus information can be written in the set memory cell. The other word lines WL, and the bit lines BL have a high impedance because of the tristate buffer, so that even when one of the electrodes is high level or low level, information is not written.

When information stored in a set memory cell of the memory cell array is read, the bit line BL connected to the second electrode E2 of the set memory cell MC is made low level (0 V) by the tristate buffer BL, and then the word line WL connected to the first electrode E1 of the memory cell MC is made high level (1 V). Consequently information is selectively read from the set memory cell MC. The other word lines WL and the bit lines BL are caused to have high impedance by the tristate buffers TB.

In a memory cell MC including an asymmetric barrier which higher on the side of the floating conducting layer as in the first, 2nd, 3rd, 6th, 7th and 9th embodiments, as described above the low level of the word lines WL are set at 0 V, and the high level thereof is set at 1 V. The low level of the bit lines BL is set at 0 V, and the high level thereof is set at 2 V. Write, read and erase of information "0" and "1" are selectively conducted. But in the other embodiments levels of the word lines WL and the bit lines BL are set for the respective memory cells.

In a memory cell MC using the resonant tunneling barrier layer as in, e.g., the 4th, 5th and 8th embodiments, the low level of the word lines WL is set at 0 V, the high level there of is set at 1 V, the low level of the bit lines BL is set at 0.5 V, and the high level thereof is set at 2 V, whereby write, read and erase of information "0" and "1" can be selectively conducted.

In memory cell using the barrier layer having an asymmetric barrier which is higher on the side of the floating conducting layer as in the 10th and the 11th embodiments, the low level and high level of the word lines WL and the bit lines BL are so set that an about 1.8 V write bias voltage, an about 0.5 V read bias voltage and an bout 1.0 erase bias voltage are selectively applied to.

In the eleventh embodiments, two lines are provided for one memory cell. Stored information can be accordingly written or read at high speed. In a conventional semiconductor memory device, e.g., a DRAM of 1 MOS cell including a silicon MOSFET and capacitor, a cell area is about 2 $\mu m^2$ in a 0.6 $\mu m$ rule, but the eleventh embodiment can reduce the cell area to about 1 $\mu m^2$.

The eleventh embodiment does not require a capacitor which need a large special area. The process for fabricating the memory device can be much simplified.

When further micronization is required, DRMSs using silicon have a problem of noise margins due to capacities of the capacitor. But the semiconductor memory device according to the eleventh embodiment is free from substantial problems with micronization, and further micronization is accordingly possible.

The semiconductor memory device according to a thirteenth embodiment of the present invention will be explained with reference to FIGS. 18A to 26B.

An about 300 nm-thickness barrier layer 112 of non-doped i-$In_{0.52}Al_{0.48}As$ is formed on a semi-insulating InP substrate 110. An about 200 nm-thickness floating conducting layer 114 of n-$In_{0.53}Ga_{0.48}As$ doped with a $1 \times 10^{18} m^{-3}$ dose of silicon (Si) is formed on the thick barrier layer 112.

Figure 18A:
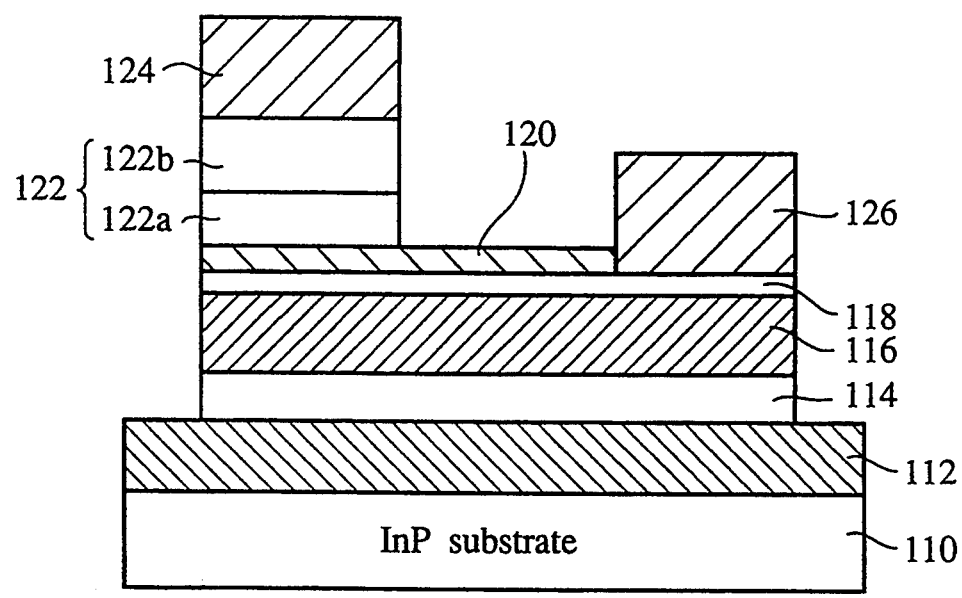
FIGS. 18A and 18B are views of the semiconductor memory device according to a thirteenth embodiment of the present invention.
Figure 18B:
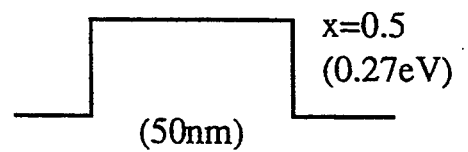

An about 50 nm-thickness barrier layer 116 of non-doped i-$In_{0.52}(Al_xGa_{1-x})_{0.48}As$ is formed on the floating conducting layer 114. An aluminium composition ratio (x value) of i-$In_{0.52}(Al_xGa_{1-x})_{0.48}As$ of the barrier layer 116 is constantly x=0.5. As shown in FIG. 18B, a barrier layer of the floating conducting layer is constantly 0.27 eV.

An about 30 nm-thickness channel layer 118 of n-$In_{0.53}Ga_{0.47}As$ doped with a $5 \times 10^{17} cm^{-3}$ dose of silicon is formed on the barrier layer 116. An about 5 nm-thickness thin barrier layer 120 of non-doped i-$In_{0.52}Al_{0.48}As$ is formed in the region on the channel layer 118 on the left side in FIGS. 18A and 18B. In the region on the thin barrier layer 120 on the left side in FIG. 18A, a contact layer 122 including an about 20 nm-thickness n-$In_{0.53}Ga_{0.47}As$ layer 122a doped with varied doses of silicon from $1 \times 10^{18}$ cm$^{-3}$ to $5 \times 10^{19}$ cm$^{-3}$, and an about 50 nm-thickness of n-In$_{0.53}$Ga$_{0.47}$As layer 122b doped with a $5 \times 10^{19}$ cm$^{-3}$ dose of silicon.

A first electrode 124 of an about 200 nm-thickness tungsten silicide (WSi) layer is formed on the contact layer 122. A second electrode 126 of an about 200 nm-thickness tungsten silicide (WSi) layer is formed in the region on the channel layer 118 on the right side in FIG. 18A.

The first and the second electrodes 124, 126 may be formed of, in place of the tungsten silicide layer, a Cr/Au layer including an about 200 nm-thickness chrome layer and an about 190 nm-thickness gold layer laid one on another, or a Pd/Ge including an about 60 nm-thickness paradium layer and an about 80 nm-thickness germanium layer laid one on another.

The method for storing information in the semiconductor memory device according to the thirteenth embodiment will be explained with reference to FIGS. 19A to 24.

Figure 19A:
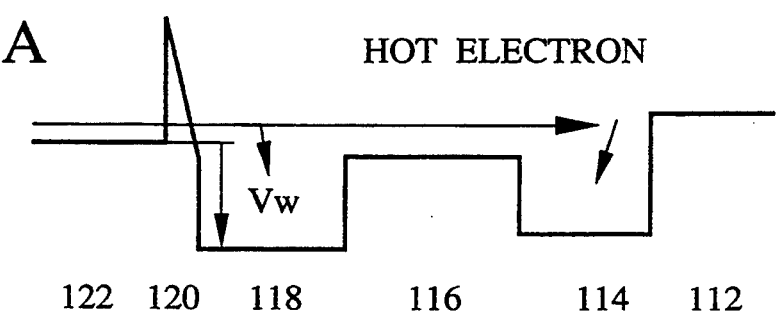
FIGS. 19A to 19C are views of energy bands explaining a method for writing information "1" in the semiconductor memory device according to the thirteenth embodiment.
Figure 19B:
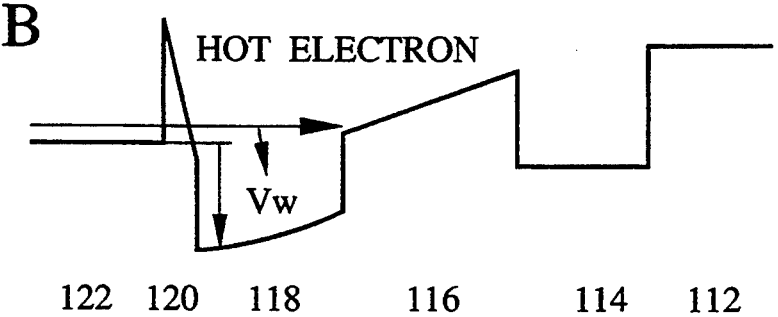

The method for writing information "1" will be explained with reference to the energy band views of FIGS. 19A to 19C.

When information "1" is written in this semiconductor memory device, one of the first and the second electrode 24, 126, i.e. the first electrode 124 is grounded, and an about 1 V write bias voltage Vw which makes a potential of the second electrode 126 positive is applied. When such write bias voltage Vw is applied, most of electrons injected into the first electrode 124 tunnel the thin barrier layer 120 from the contact layer 122 and arrives as hot electrons at the floating conducting layer 114 beyond the barrier layer 116. A part of the electrons which have failed to go beyond the barrier layer 116 arrive as cold electrons at the channel layer 118 as shown in FIG. 19A.

Most of electrons which have tunneled the thin barrier layer 120 arrive as hot electrons at the floating conducting layer 114 to be accumulated there and raise a potential of the floating conducting layer 114. When a potential of the floating conducting layer 114 rises, a potential of the barrier layer 116 also rises, and as shown in FIG. 19B, injection of hot electrons into the floating conducting layer 114 is prohibited by the barrier layer 116. Consequently a set charge amount (about $5 \times 10^{-9}$ C/cm$^2$) of electrons is accumulated in the floating conducting layer 114, and information "1" is written.

Figure 19C:
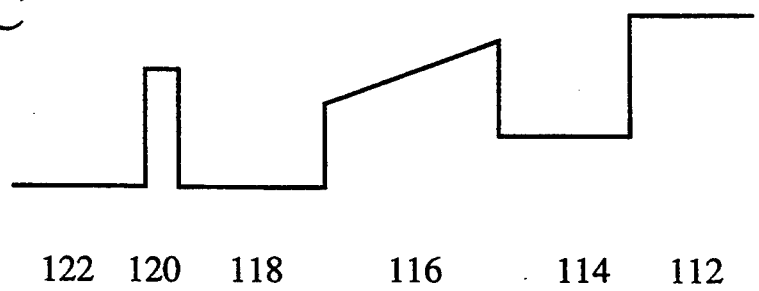

At this time, when voltage of the second electrode is made 0 V, and a write bias voltage Vw is removed, as shown in FIG. 19C, a potential of the floating conducting layer 114 rises by about 0.2 V because of accumulated electrons. Electrons accumulated in the floating conducting layer 114 are slowly discharged, but because of the thick barrier layer 116, they are held for more than about 10 sec. at 77 K.

Then the method for reading information will be explained with reference to the energy band views of FIGS. 20A and 20B, and the graphs of FIGS. 21A and 21B.

Figure 20A:
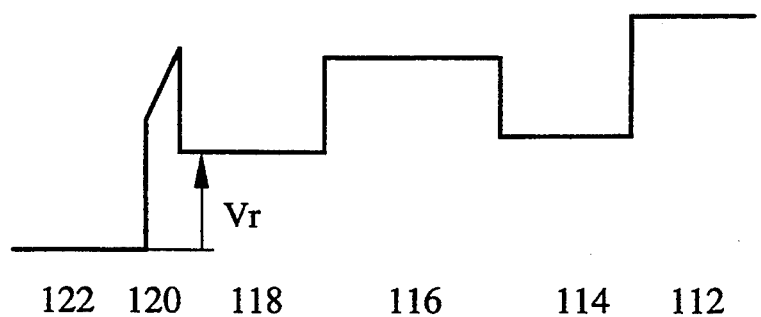
FIGS. 20A and 20B are views of energy bands explaining a method of reading information from the semiconductor memory device according to the thirteenth embodiment.
Figure 20B:
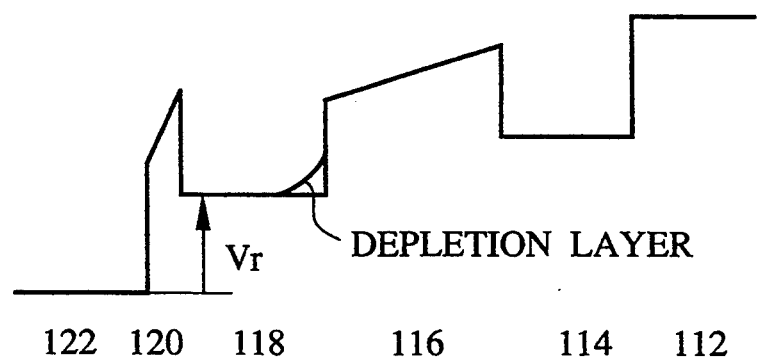
Figure 21A:
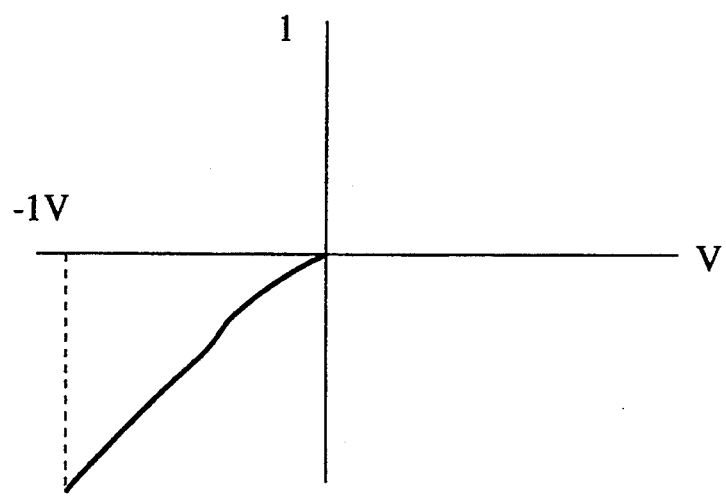
FIGS. 21A and 21B are graphs explaining a method for reading information from the semiconductor memory device according to the thirteenth embodiment.
Figure 21B:
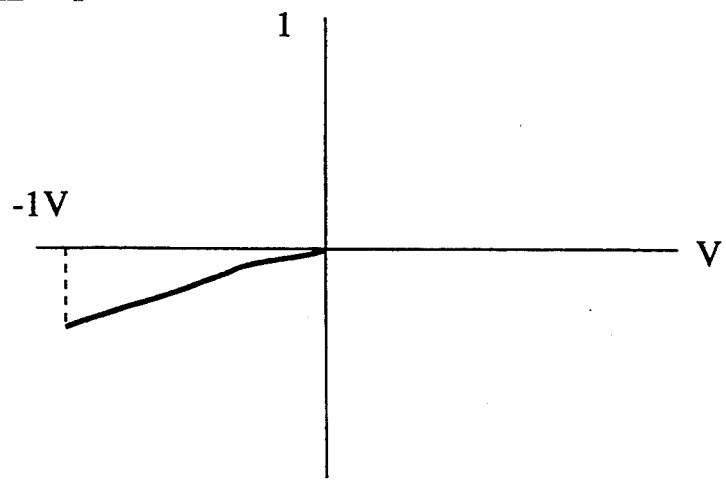

In the state in which no charge is accumulated in the floating conducting layer 114, the channel layer 118 is influenced only by a surface depletion layer, and is not depleted (FIG. 20A). With the first electrode 124 grounded, even when an about 1 V read bias voltage Vr which makes a potential of the second electrode 126 negative, an about $5 \times 10^3$ A/cm$^2$ current flows (FIG. 21A).

But in the state where a charge is accumulated in the floating conducting layer 114, a depletion layer is extended from the floating conducting layer 114 to substantially deplete the channel layer 118. Accordingly when the first electrode 124 is grounded, and a read bias voltage Vr of about 1 V which makes a potential of the second electrode 126 negative, only an about $1 \times 10^3$ A/cm$^2$ current flows (FIG. 21B).

Thus, presence of a current flowing between the first and the second electrodes with a read bias voltage Vr applied is detected, whereby stored information can be read based on whether a charge is accumulated in the floating conducting layer 114.

Then, the method for erasing written information "1" (for writing information "0") will be explained with reference to the energy band views of FIGS. 22A and 22B.

When written information "1" is erased (information "0" is written), one of the first and the second electrodes 124, 126, e.g., the first electrode 124 is grounded, a potential of the second electrode 126 is made negative, and an about erase bias voltage Ve having an absolute value larger than a read bias voltage Vr is applied.

In the state in which electron are accumulated in the floating conducting layer 114, and information "1" is written, a depletion layer is extended from the floating conducting layer 114 to deplete the channel layer 118. Accordingly the first and the second electrodes 124, 126 are not electrically connected by the channel layer 118. When an erase bias voltage Ve is applied, a current path from the first electrode 124 to the floating conducting layer 114 through the contact layer 122, the thin barrier layer 120, the channel layer 118 and the barrier layer 116, and a current path from the floating conducting layer 114 to the second electrode 126 through the barrier layer 116 and the channel layer 118 are formed.

Figure 22A:
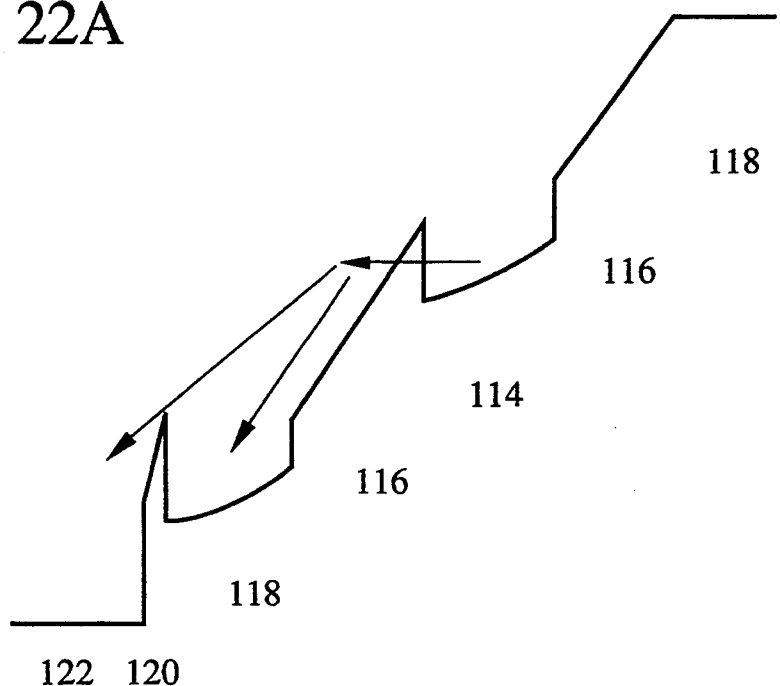
FIGS. 22A and 22B are views of energy bands explaining a method for erasing information "1" in the semiconductor memory device according to the thirteenth embodiment.
Figure 22B:
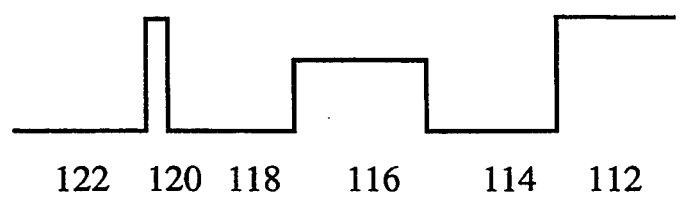

FIGS. 22A and 22B show views of energy bands along the current paths. As shown in FIG. 22A, since a high erase voltage of about 3 V is applied, electrons accumulated in the floating conducting layer 114 are discharged into the channel layer 118 beyond the barrier layer 116, and into the first electrode 124 beyond the thin barrier layer 120 and through the contact layer 122. Written information "1" is erased (information "0" is written).

In the state where no electrons are accumulated in the floating conducting layer 114, and information "1" is not written (information "0" is written), since the channel layer 118 is not depleted, a current path form the first electrode 124 directly to the second electrode 126 through the contact layer 122, the thin barrier layer 120 and the channel layer 118. A view of the energy bands at this time is shown in FIG. 22B.

Figure 23:
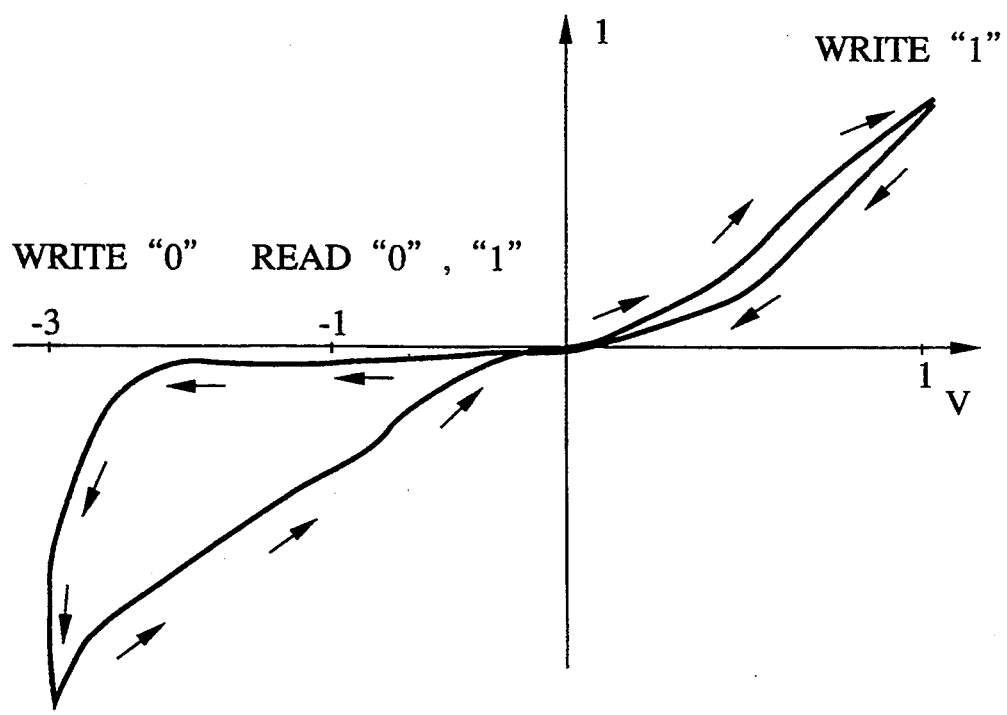
FIG. 23 is a graph of current-voltage characteristics of the semiconductor memory device according to the thirteenth embodiments.

FIG. 23 shows current-voltage characteristics of the semiconductor memory device according to the thirteenth embodiment in the above-described write of information "1", read of information "0" and "1", erase of information "1" (write of information "0"). A voltage applied to the second electrode 126 with the first electrode grounded is represented by V, and a current flowing between the first and the second electrodes 124, 126 are represented by I.

As a voltage V is increased from 0 V to 1 V, a current I substantially proportionally increases, and information "1" is written. Then as a voltage V is decreased from 1 V to 0 V, a current I substantially proportionally decreases.

Then 0 V is decreased −1 V, and still no current flows. Information "1" is read. Subsequently when −1 V is further decreased to −3 V, a current I abruptly increases. Information "1" is erased (information "0" is written). Then when −3 V is raised to 0 V, a current I substantially proportionally decreases. Even when the voltage V is −1 V, a certain amount of current I flows, and information "0" is read.

Figure 24:
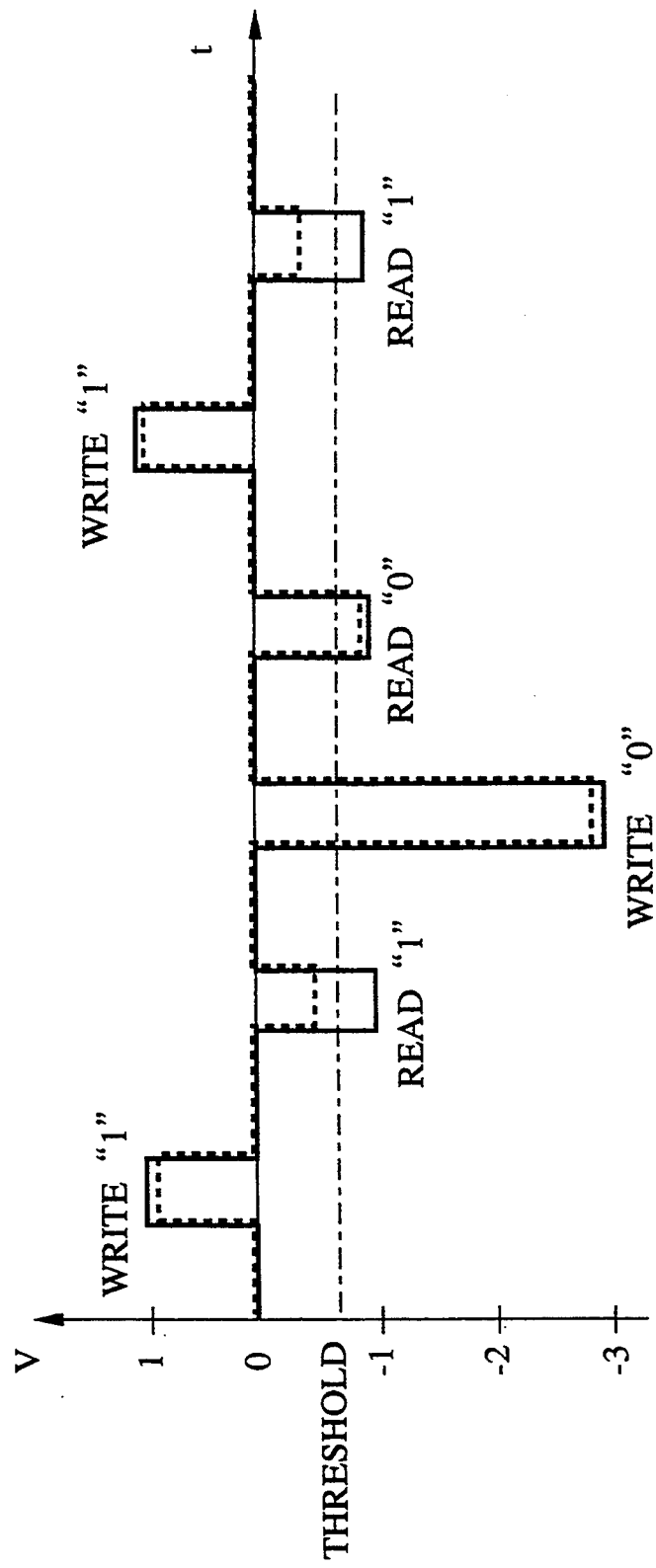
FIG. 24 is a time chart of the information storing operation of the semiconductor memory device according to the thirteenth embodiment.

FIG. 24 shows a time chart of input pulse signals and output pulse signals obtained when +1 V (write bias voltage Vw) pulse, −1 V (read bias voltage Vr) pulse, −3 V (erase bias voltage Ve) pulse, −1 V (read bias voltage Vr) pulse, . . . are sequentially applied. The input signals are indicated by the solid line, and the output signals are indicated by the broken line. A pulse width is 1 μsec, and pulse interval is 1 μsec.

As apparent in FIG. 24, when a read bias voltage Vr is applied, output pulses have different magnitudes between the cases where information "1" has been written and the case where information "0" has been written. A threshold value is set at the middle of the magnitudes of these output pulses, whereby written information can be discriminated.

Since the semiconductor memory device according to the thirteenth embodiment can write information "1" and "0" freely as described above, it is usually not so much necessary, but UV radiation is irradiated to discharge electrons accumulated in the floating conducting layer 114, whereby information can be erased in blocks.

It is preferable that the semiconductor memory device according to the thirteenth embodiment is operated at a low temperature below 77 K so as to suppress thermionic current components.

The mechanism for storing information by the semiconductor memory device according to the thirteenth embodiment was described above with reference to the energy band views of FIGS. 19A to 19C, 20A and 20B, and 22A and 22B. But it has been found that other information storing mechanisms are present. These mechanisms will be explained with reference to FIGS. 25A to 25D and 26A and 26B.

The method for writing information "1" will be explained with reference to the energy band view of FIGS. 25A to 25D.

Figure 25A:
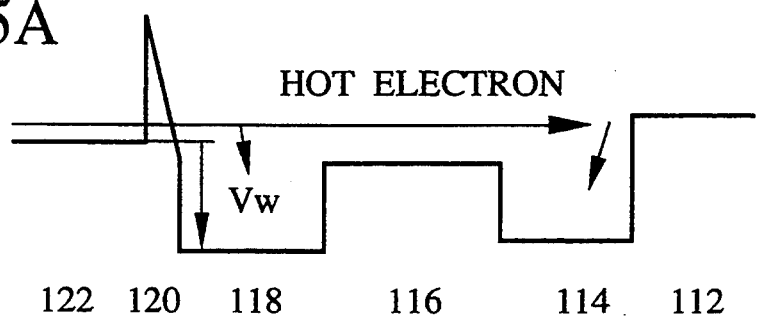
FIGS. 25A to 25D are views of energy bands explaining another method for writing information "1" in the semiconductor memory device according to the thirteenth embodiment.

When information "1" is written in the semiconductor memory device according to the thirteenth embodiment, one of the first and the second electrodes 124, 126, e.g., the first electrode 124 is grounded, and about 1 V write bias voltage Vw is applied so as to set the second electrode 126 at a positive potential. When such write bias voltage Vw is applied, as shown in FIG. 25A, electrons injected from the first electrode 124 first arrive as hot electrons at the floating conducting layer 114 beyond the barrier layer 116.

Figure 25B:
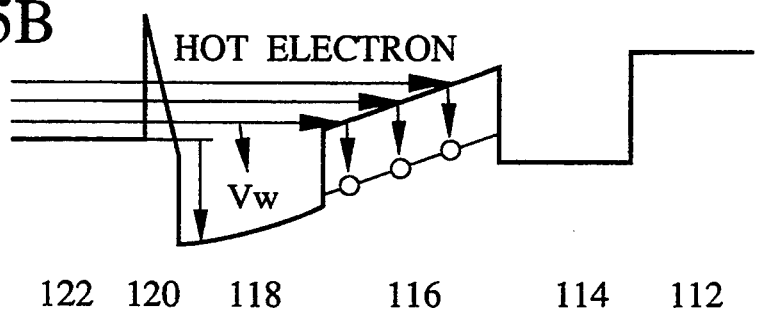

When electrons are accumulated in the floating conducting layer 114, as shown in FIG. 25B, a potential of the floating conducting layer 114 rises, and a potential of the barrier layer 116 also rises. Hot electrons injected from the first electrode 124 lose energy in the barrier layer 116 and trapped in deep levels of the barrier layer 116.

Figure 25C:
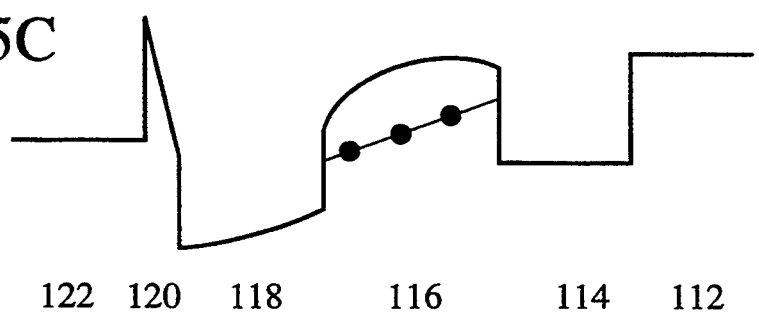

Most deep levels of the barrier layer 116 accumulate electrons and have accumulated a set charge amount (about $5\times10^{-9}$ C/cm$^2$), as shown in FIG. 25C, a potential of the barrier layer 116 rises and injection of hot electrons into the floating conducting layer 114 is prevented, and information "1" is written.

Figure 25D:
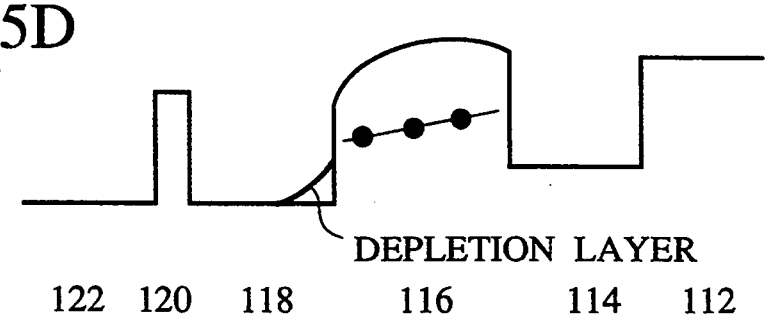

At this time, even when a voltage of the second electrode 126 is made 0 V to remove a write bias voltage Vw, as shown in FIG. 25D, a potential of the barrier layer 116 is as high as about 0.2 V due to accumulated electrons. Electrons accumulated in the barrier layer 116 are slowly discharged. But a level thereof is as deep as about 0.15 eV, and a capture cross section of the electrons is as small as about $10^{-22}$ cm$^{-2}$. Accordingly the electrons are held at 77 K for more than about $10^{19}$ sec. Even at 300 K they are held for about $3\times10^6$ sec, and the memory functions as a non-volatile memory.

Then the method for reading information will be explained.

The mechanism for this method is the same as described above. In the state where no charge is accumulated in the barrier layer 116, the channel layer 118 is only influenced by the surface depletion layer, and is not depleted. Accordingly when the first electrode 124 is grounded, and an about 1 V read bias voltage Vr which makes a potential of the second electrode 126 negative is applied, an about $5\times10^3$ A/cm$^2$ current flows.

But in the state where a charge is accumulated in the barrier layer, a depletion layer is extended from the barrier layer 116 to substantially deplete the channel layer 118. Accordingly when the first electrode 124 is grounded, and a read vias voltage Vr of about 1 V which makes a potential of the second electrode 126 negative, only an about $1\times10^3$ A/cm$^2$ current flows.

Thus a read vias voltage Vr is applied, and an amount of a current flowing between the first and the second electrodes 124, 126 is detected, whereby stored information can be read based on whether a charge is accumulated in the barrier layer 116.

Then, the method for erasing written information "1" (the method for writing information "0") will be explained with reference to the energy bans view of FIG. 26.

When written information "1" is erased (information "0" is written), one of the first and the second electrodes 124, 126, e.g., the first electrode 124 is grounded, and an erase bias voltage Ve which makes a potential of the second electrode 126 negative and which is about 3 V and larger than an absolute value of the read bias voltage Vr is applied.

In the state where electrons are accumulated in the barrier layer 116, and information "1" is written, a depletion layer is extended from the barrier layer 116 to deplete the channel layer 118. Accordingly the first and the second electrodes 124, 126 are electrically disconnected. Consequently when an erase bias voltage Ve is applied, a current path from the first electrode 124 to the floating conducting layer 114 through the contact layer 122, the thin barrier layer 120, the channel layer 118 and the barrier layer 116 and a current path from the floating conducting layer 114 to the second electrode 126 through the barrier layer 116 and the channel layer 118 are formed.

Figure 26A:
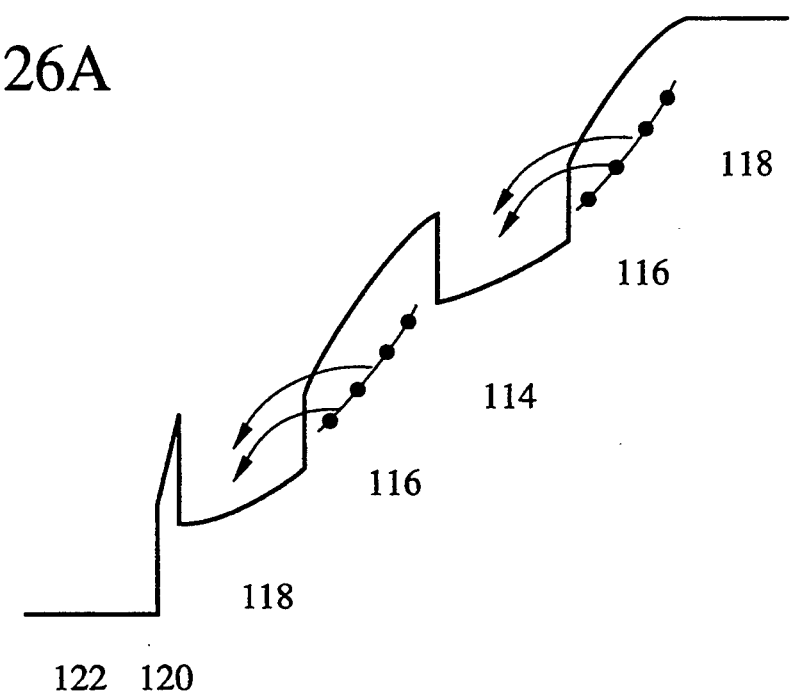
FIGS. 26A and 26B are views of energy bands explaining another method for erasing information "1" in the semiconductor memory device according to the thirteenth embodiment.

View of the energy bands along these current paths are shown in FIG. 26A. A high erase bias voltage of about 3 V is applied, and as shown in FIG. 26A, electrons accumulated in deep levels in the barrier layer 116 are discharged into the floating conducting layer 114 and the channel layer 118, and further to the first electrode 124 beyond the thin barrier layer 120 and through the contact layer 122, and written information "1" is erased (information "0" is written).

Figure 26B:
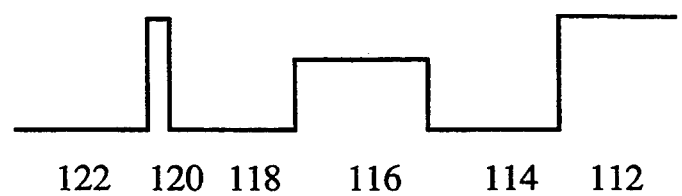

In the state where no electrons are accumulated in the barrier layer 116, and information "1" is not written (information "0" is written), the channel layer 118 is not depleted, and accordingly a current path from the first electrode 124 directly to the second electrode 126 through the contact layer 122, the thin barrier layer 120 and the channel layer 118 is formed. The energy band view at this time is shown in FIG. 26B.

The above-described mechanism in which electrons are trapped in deep levels in the barrier layer 116 and accumulated is considered also dominant.

Thus the semiconductor memory device according to the thirteenth embodiment can be a high speed electrically erasable programmable ROM (EEPROM) or a dynamic memory (DRAM). Only two lines are provided, which enables further integration and can shorten a writing time.

But stored information in the semiconductor memory device according to the thirteenth embodiment vanishes after a set period of time, and refresh control for rewriting stored information within the period of time is necessary.

Next, the process for fabricating the semiconductor memory device according to the thirteenth embodiment will be explained.

First, the following layers are continuously crystal grown on a semi-insulating InP substrate 110 by molecular beam epitaxy (MBE). That is, an about 300 nm-thickness thick barrier layer 112 (buffer layer) of non-doped i-$In_{0.52}Al_{0.48}As$, an about 200 nm-thickness floating conducting layer 114 of n-$In_{0.53}Ga_{0.47}As$ doped with a $1 \times 10^{18}$ cm$^{-3}$ dose of silicon, an about 50 nm-thickness barrier layer 116 of non-doped i-$In_{0.52}(Al_x Ga_{1-x})_{0.48}As$ (x=0.5), an about 30 nm-thickness channel layer 118 of n-$In_{0.53}Ga_{0.47}As$ doped with a $5 \times 10^{17}$ cm$^{-3}$ dose of silicon, an about 5 nm-thickness thin barrier layer 120 of non-doped i-$In_{0.52}Al_{0.48}As$, an about 20 nm-thickness n-$In_{0.53}Ga_{0.47}As$ layer 122a doped with varied doses from $1 \times 10^{18}$ cm$^{-3}$ to $5 \times 10^{19}$ cm$^{-3}$, and an about 50 nm-thickness n-$In_{0.53}Ga_{0.47}As$ layer 122b doped with a $5 \times 10^{19}$ cm$^{-3}$ dose of silicon are crystal grown.

Then the contact layer 122 is mesa-etched so that a region for the first electrode 124 is left, and the thin barrier layer 120, the channel layer 118, the barrier layer 116 and the floating conducting layer 114 are mesa-etched so that a device region is left, and the divide isolation is conducted.

Next, on the contact layer 122 and the channel layer 118, an about 200 nm-thickness tungsten silicide (WSi) layer, a Cr/Au layer of an about 200 nm-thickness chrome layer an d an about 190 nm-thickness gold layer laid one on another, or a Pd/Ge layer of an bout 60 nm-thickness paradium layer and an about 80 nm-thickness germanium layer laid one on another is formed. Then, pattern etching is conducted by the usual photolithography to form the first and the second electrodes 126.

The second electrode 124 of AuGe/Au layer may be formed on the barrier layer 120 and be alloyed, whereby second electrode 124 contacts with channel layer 118 through the barrier layer 120.

Figure 27A:
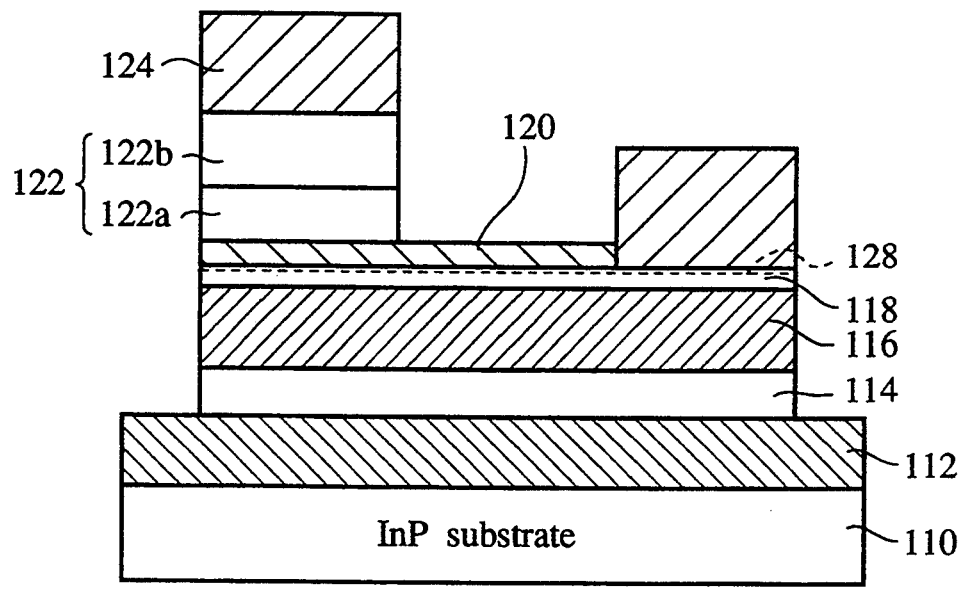
FIGS. 27A and 27B are views of the semiconductor memory device according to a fourteenth embodiment of the present invention.
Figure 27B:
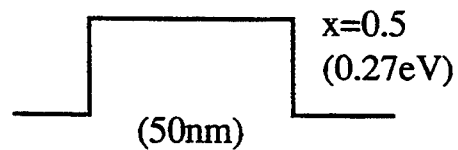

The semiconductor memory device according to a fourteenth embodiment of the present invention will be explained with reference to FIGS. 27A and 27B. Common members with the semiconductor memory device according to the thirteenth embodiment are represented by common reference numerals not to repeat their explanation.

As in the thirteenth embodiment, an about 300 nm-thickness barrier layer 112 of non-doped i-$In_{0.52}Al_{0.48}As$, and an about 200 nm-thickness floating conducting layer 114 of n-$In_{0.53}Ga_{0.47}As$ doped with a $1 \times 10^{18}$ cm$^{-3}$ dose of silicon are laid one on another on a semi-insulating InP substrate 110 in the stated order.

On the floating conducting layer 114, in place of the barrier layer 116 of non-doped i-$In_{0.52}(Al_x Ga_{1-x})_{0.48}As$ of the thirteenth embodiment, an about 50 nm-thickness barrier layer 116 having a part on the side of the channel layer 118 or the entire layer doped with a $1 \times 10^{18}$ cm$^{-3}$ dose of silicon is formed.

On the barrier layer 116, in place of the channel layer 118 of n-$In_{0.53}Ga_{0.47}As$ doped with a $5 \times 10^{17}$ cm$^{-3}$ dose of silicon of the thirteenth embodiment, an about 30 nm-thickness channel layer 118 of non-doped i-$In_{0.53}Ga_{0.47}As$ is formed.

On the channel layer 118 is formed an about 5 nm-thickness thin barrier layer 120 of non-doped i-$In_{0.52}Al_{0.48}As$, and a contact layer 122 of an about 20 nm-thickness n-$In_{0.53}Ga_{0.47}As$ layer 122a doped with varied doses of silicon from $1 \times 10^{18}$ cm$^{-3}$ to $5 \times 10^{19}$ cm$^{-3}$, and an about 50 nm-thickness n-$In_{0.53}Ga_{0.47}As$ layer 122b doped with a $5 \times 10^{19}$ cm$^{-3}$ dose of silicon.

Electrons supply from the barrier layer 116 into the channel layer 118 to form a two-dimensional electron channel 128 in the channel layer 118. The structure and operation of the fourteenth embodiment is the same as those of the thirteenth embodiment other than that a secondary electron channel is formed in the channel layer, and their explanation is not repeated.

In the fourteenth embodiment, information is read based on whether a current flows in the secondary electron channel in the channel layer. Accordingly information can be read at high speed.

Figure 28A:
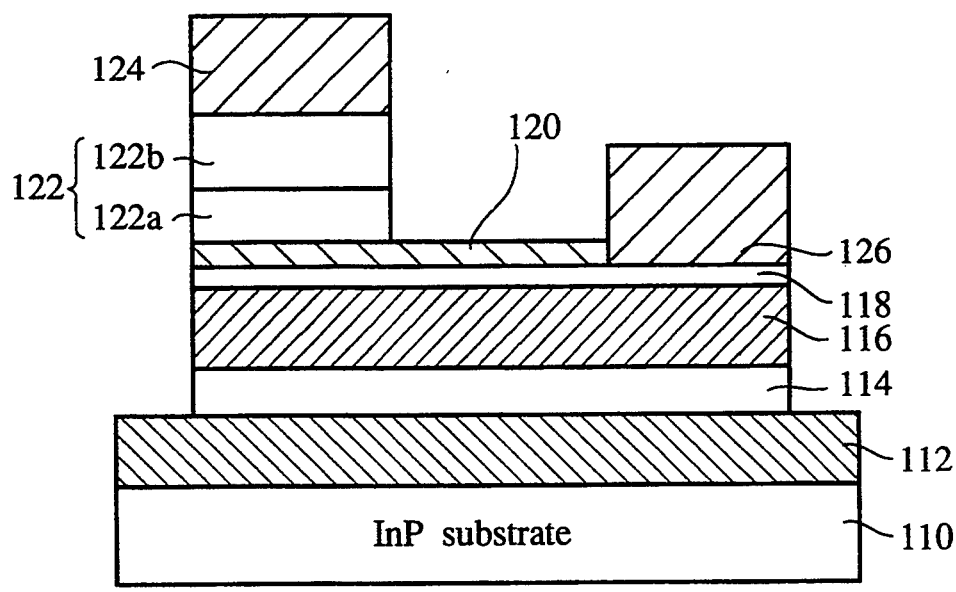
FIGS. 28A and 28B are views of the semiconductor memory device according to a fifteenth embodiment of the present invention.

Then the semiconductor memory device according to a fifteenth embodiment of the present invention will be explained with reference to FIGS. 28A and 28B, and 29. Common members with the semiconductor memory device according to the thirteenth embodiment of FIGS. 18A and 18B are represented by common reference numeral not to repeat their explanation.

As in the thirteenth embodiment, an about 300 nm-thickness thick barrier layer of non-doped i-$In_{0.52}Al_{0.48}As$, and an about 200 nm-thickness floating conducting layer of n-$In_{0.53}Ga_{0.47}As$ doped with a $1 \times 10^{18}$ cm$^{-3}$ dose of silicon are laid on a semi-insulating InP substrate 110 one on another in the stated order.

On the floating conducting layer 114, in place of the barrier layer 116 of non-doped i-$In_{0.52}(Al_x Ga_{1-x})_{0.48}As$, a resonant tunneling barrier layer 130 having a resonant tunneling barrier (RTB). An intrinsic peak voltage of the resonant tunneling barrier 130 is 0.5 V, and an intrinsic valley voltage thereof is 1.0 V.

Figure 28B:
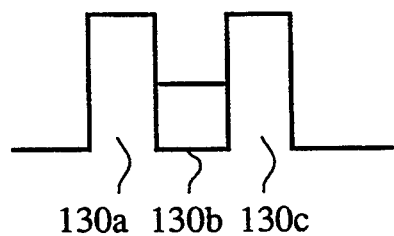

As shown in FIG. 28B, the resonant tunneling barrier layer 130 includes an about 3 nm-thickness barrier layer 130a of i-InAlAs barrier layer 130a having a 0.53 eV barrier height, an about 2 nm-thickness i-InGaAs well layer 130b and an about 3 nm-thickness i-InAlAs barrier layer 130c having a 0.53 eV barrier height laid one on another.

On the resonant tunneling barrier layer 130, as in the thirteenth embodiment, a channel layer 118 of n-$In_{0.53}Ga_{0.47}As$ doped with a $5 \times 10^{17}$ cm$^{-3}$ dose of silicon, an about 5 nm-thickness barrier layer 120 of non-doped i-$In_{0.52}Al_{0.48}As$, and a contact layer 122 of an about 20 nm-thickness n-$In_{0.53}Ga_{0.47}As$ layer 122a doped with varied doses of silicon from $1 \times 10^{18}$ cm$^{-3}$ to $5 \times 10^{19}$ cm$^{-3}$, an about 50 nm-thickness n-$In_{0.53}Ga_{0.47}As$ layer 122b doped with a $5 \times 10^{19}$ cm$^{-3}$ dose of silicon are formed one on another in the stated order.

A first electrode 124 is formed on the contact layer 122, and a second electrode 126 is formed on the channel layer 118.

The method for storing information in the semiconductor memory device according to the fourteenth embodiment will be explained with reference to FIG. 29.

Figure 29:
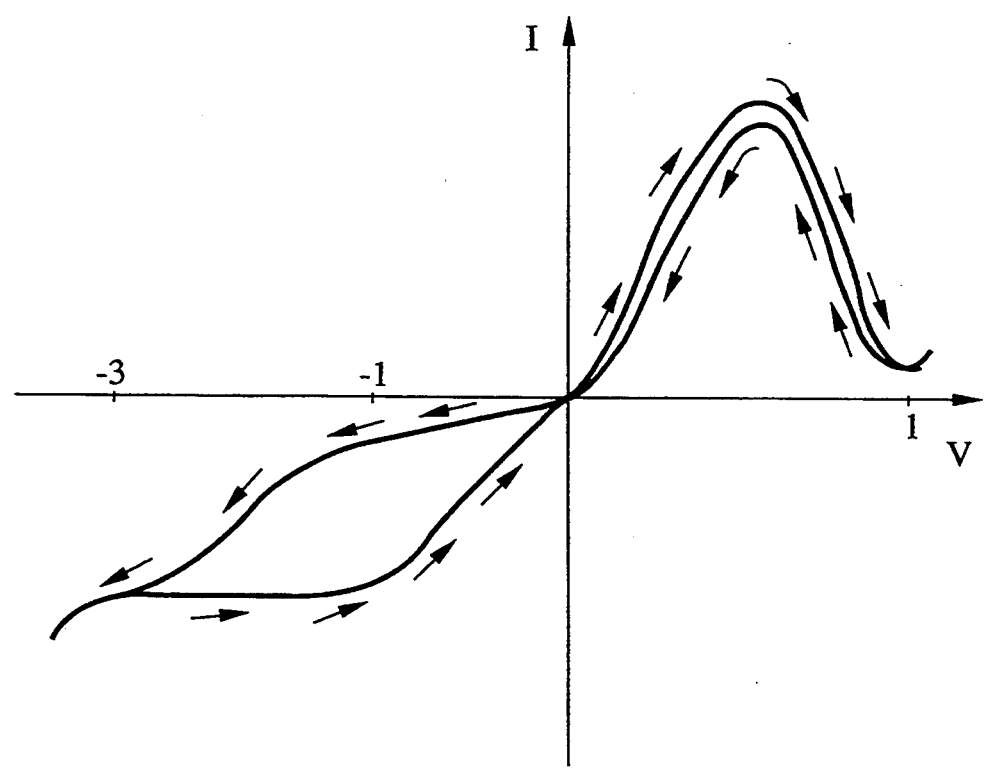
FIG. 29 is a graph of current-voltage characteristics of the semiconductor memory device according to the fifteenth embodiment.

FIG. 29 shows current-voltage characteristics of the semiconductor memory device according to the fourteenth embodiment. A voltage applied to the second electrode 126 with the first electrode grounded is represented by V, and a current flowing between the first and the second electrodes 124, 126 is represented by I.

When a voltage V is raised from 0 V to 1 V, a current I is at a peak voltage. A maximum current is obtained around 0.55 V and then decreases. Electrons injected, tunneling the thin barrier layer 120 resonant-tunnel the resonant tunneling barrier layer 130 to be injected into the floating conducting layer 114 and accumulated there. Thus information "1" is written. Electrons injected from the first electrode 124 take about 1 psec to arrive at the floating conducting layer 114 as hot electrons. Very speedy information writing is achieved. A current which effectively flows when voltages from 0 V to 1 V are applied can be less power consuming because of the valley region.

Subsequently when the voltage V is lowered from 1 V to 0 V, the current I changes as does when the voltage V is raised.

When electrons are accumulated in the floating conducting layer 114, a potential rises by about 0.2 V, whereby the channel layer 118 is depleted. When a voltage of the second electrode 126 is lowered to 0 V, electrons are not immediately discharged from the floating conducting layer 114 because of the presence of the resonant tunneling barrier layer 130, and a potential of the floating conducting layer 114 is held at about 0.2 V. In the fourteenth embodiment the potential is held for about $10^6$ sec.

Then while the potential of the floating conducting layer 114 is being held, the voltage V is lowered from 0 V to $-1$ V. Then since the channel layer 118 has been depleted by electrons accumulated in the floating conducting layer 114, the current I is as small as about $1 \times 10^3$ A/cm$^2$.

Subsequently when the voltage is lowered from $-1$ V to $-3$ V, the current I gradually increases, and a collect barrier is a reverse bias. Electrons accumulated in the floating conducting layer 114 are discharged, and information "1" is erased (information "0" is written). A tunneling time in which electrons accumulated in the floating conducting layer 114 are discharged to the first electrode through the resonant tunneling barrier layer 130 is about 10 psec. At this time, characteristics of the resonant tunneling barrier layer 130 are not much involved, but a channel current restricted by speed saturation from the second electrode 126 to the channel layer 118 immediately below the first electrode 124 is restrictive.

Then, when the voltage V is raised from $-3$ V to 0 V, since the channel layer 118 is electrically connected, the current I increase, and depicts a large hysteresis around $-1$ V. As a result, when the voltage V is $-1$ V, a large current I of about $1 \times 10^4$ A/cm$^2$ flows, and information "0" is read.

Thus the semiconductor memory according to the fourteenth embodiment can be a high speed electrically erasable programmable ROM (EEPROM) and a dynamic RAM. Only two lines are provided, which enables high integration and shorten a writing time.

In the semiconductor memory device according to the fourteenth embodiment, since stored information vanishes after a certain period time, refresh control for rewriting stored information within the period of time is necessary.

Figure 30A:
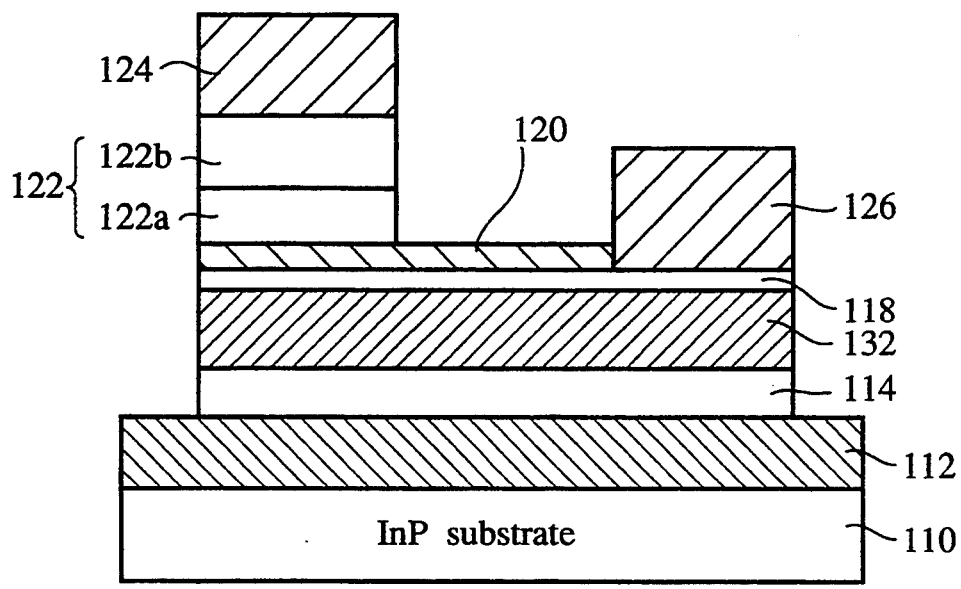
FIGS. 30A and 30B are views of the semiconductor memory device according to a sixteenth embodiment of the present invention.
Figure 30B:
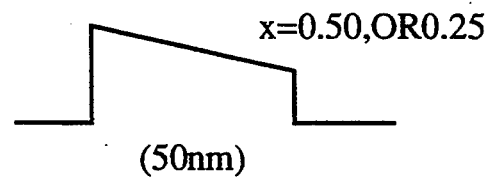

Then the semiconductor memory device according to a sixteenth embodiment of the present invention will be explained with reference to FIGS. 30A and 30B. Common members with the semiconductor memory device according to the thirteenth embodiment of FIGS. 18A and 18B are represented by common reference numeral not to repeat their explanation.

As in the thirteenth embodiment, an about 300 nm-thickness thick barrier layer 112 of non-doped i-$In_{0.52}Al_{0.48}As$, and an about 200 nm-thickness floating conducting layer 114 of n-$In0.53Ga_{0.47}As$ doped with a $1 \times 10^{18}$ cm$^{-3}$ dose of silicon are laid on a semi-insulating InP substrate 110 one on another in the stated order.

On the floating conducting layer 114, in place of the barrier layer 116 of non-doped i-$In_{0.52}(Al_{0.5}Ga_{0.5})_{0.48}As$, an about 50 nm-thickness barrier layer 130 of non-doped i-$In_{0.52}(Al_xGa_{1-x})_{0.48}As$ having aluminium composition ratios (x value) increased gradually to the side of the floating conducting layer 114 is formed. For example, as shown in FIG. 13B, when x=0.50 on the side of the floating conducting layer 114, x=0.75 on the opposite side, and when x=0.25 on the side of the floating conducting layer 114, x=0.50 on the opposite side.

On the barrier layer 130, as in the thirteenth embodiment, a channel layer 118 of n-$In_{0.53}Ga_{0.47}As$ doped with a $5 \times 10^{17}$ cm$^{-3}$ dose of silicon, an about 5 nm-thickness thin barrier layer 120 of non-doped i-$In_{0.52}Al_{0.48}As$, and contact layer 122 of an about 20 nm-thickness n-$In_{0.53}Ga_{0.47}As$ layer 122a doped with varied doses of silicon from $1 \times 10^{18}$ cm$^{-3}$ to $5 \times 10^{19}$ cm$^{-3}$, and an about 50 nm-thickness n-$In_{0.53}Ga_{0.47}As$ layer 122b doped with a $5 \times 10^{19}$ cm$^{-3}$ dose of silicon are formed laid one on another in the stated order.

The method for storing information in the semiconductor memory according to the sixteenth embodiment will be explained with reference to FIGS. 31A to 33B.

Figure 31A:
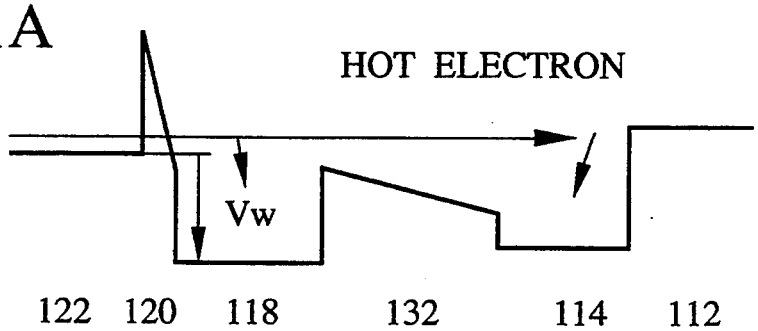
FIGS. 31A to 31C are views of energy bands explaining a method for writing information "1" in the semiconductor memory device according to the sixteenth embodiment.
Figure 31B:
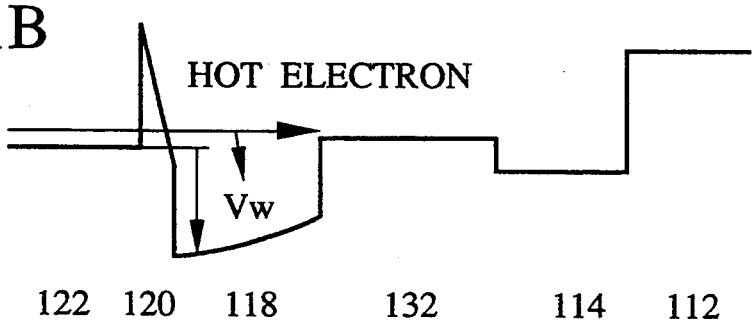

First, the method for writing information "1" will be explained with reference to the energy band view of FIGS. 31A to 31C.

When information "1" is written in the semiconductor memory device according to the sixteenth semiconductor memory device, one of the first and the second electrodes 124, 126, e.g., the first electrode 124 is grounded, and an about 1 V write bias voltage Vw which makes a potential of the second electrode 126 positive is applied. When this write bias voltage Vw is applied, most of electrons injected from the first electrode 124, as shown in FIG. 31A, tunnels the thin barrier layer 120 from the contact layer 122 and arrive as hot electrons at the floating conducting layer 114 beyond the barrier layer 132.

Electrons which have tunneled the thin barrier layer 120 are accumulated in the floating conducting layer 114 to increase a potential of the floating conducting layer 114. In the sixteenth embodiment, a barrier height on the side of the floating conducting layer 114 is low, and as shown in FIG. 31B, the injection of the hot electrons into the floating conducting layer 114 is not easily hindered by the barrier layer 132. Consequently a large amount of charge (about $5 \times 10^{-9}$ C/cm$^2$) of electrons is accumulated in the floating conducting layer 114.

Figure 31C:
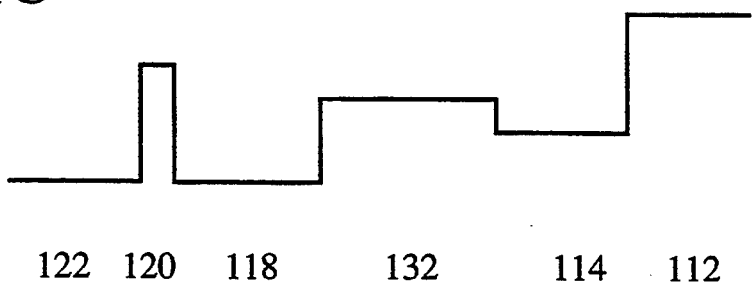

Then even when a voltage of the second electrode 126 is made 0 V to remove the write bias voltage Vw, as shown in FIG. 31C, a potential of the floating conducting layer 114 is increased by about 0.2 V due to electrons accumulated in the floating conducting layer 114.

Then the method for reading stored information will be explained with reference to the energy band views of FIGS. 32A and 32B.

Figure 32A:
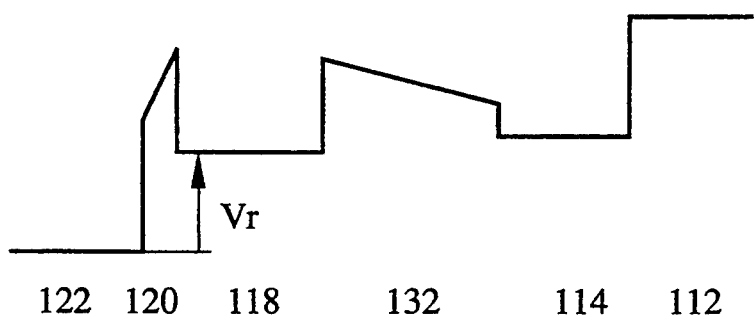
FIGS. 32A and 32B are views of energy bands explaining a method for reading information from the semiconductor memory device according to the sixteenth embodiment.

In the state where no charge is accumulated in the floating conducting layer 114, the channel layer 118 is influenced by only a surface depletion layer, and accordingly is not depleted (FIG. 32A). Here when the first electrode 124 is grounded, and an about 1 V read bias voltage Vr which makes a potential of the second electrode 126 negative is applied, an about $5 \times 10^{-3}$ A/cm$^2$ current flows.

Figure 32B:
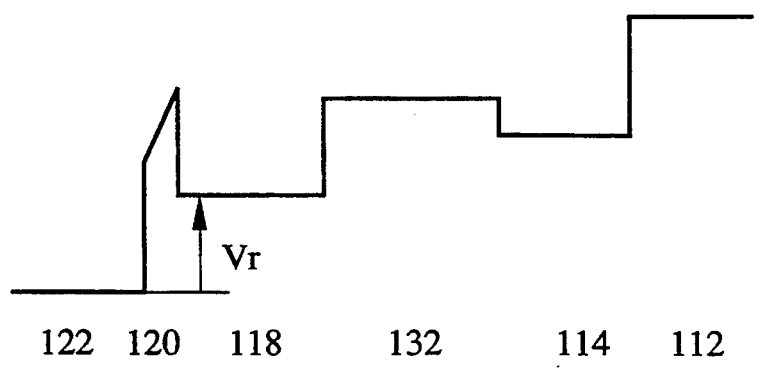

But in the state where a charge is accumulated in the floating conducting layer 114, a depletion layer is extended from the floating conducting layer 114 to substantially deplete the channel layer 118 (FIG. 32B). Accordingly when the first electrode 124 is grounded, and a read bias voltage Vr of about 1 V which makes a potential of the second electrode 126 negative, only an about $1 \times 10^3$ A/cm$^2$ current flows.

Thus a read bias voltage Vr is applied, and presence of a current flowing between the first and the second electrodes 124, 126 is detected, whereby stored information can be read based on whether a charge is accumulated in the floating conducting layer 114.

Next, the method for erasing written information "1" (the method for writing information "0") will be explained with reference to the energy band views of FIGS. 33A and 33B.

When written information "1" is erased (information "0" is written), one of the first and the second electrodes 124, 126, e.g., the first electrode 124 is grounded, and an about 2 V erase bias voltage Ve which makes a potential of the second electrode 125 negative and whose absolute value is larger than a read bias voltage Vr is applied.

In the state where electrons are accumulated in the floating conducting layer 114, and information "1" is written, a depletion layer is extended from the floating conducting layer 114 to deplete the channel layer 118. Accordingly a current path from the first electrode 124 to the floating conducting layer 114 through the contact layer 122, the thin barrier layer 120 and the channel layer 118 and the barrier layer 132, and a current path from the floating conducting layer 114 to the second electrode 126 through the barrier layer 132 and the channel layers 118.

Figure 33A:
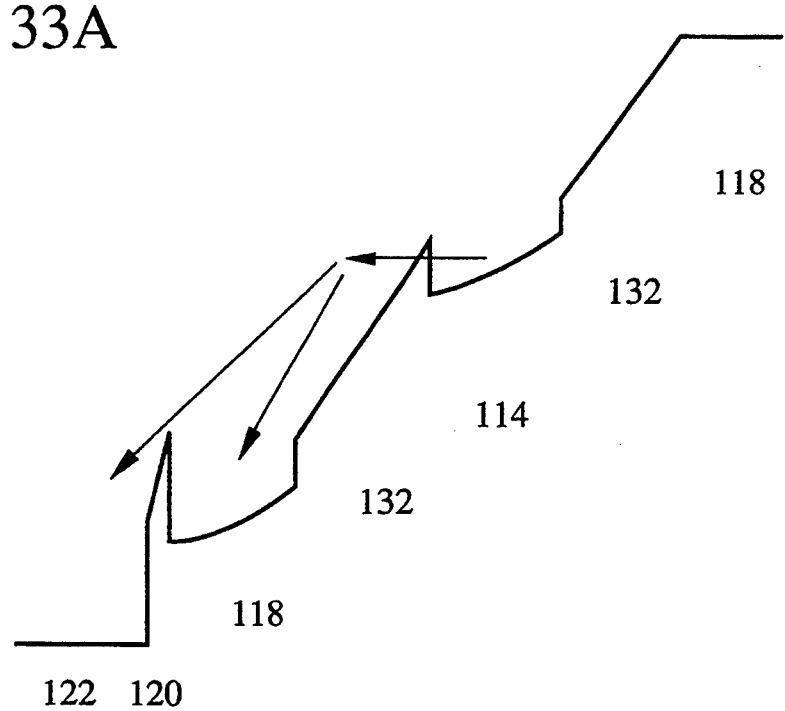
FIGS. 33A and 33B are views of energy bands explaining a method for erasing information "1" in the semiconductor memory device according to the sixteenth embodiment.
Figure 33B:
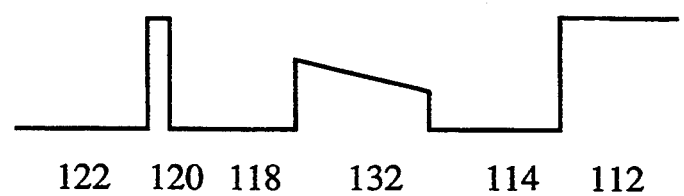

Views of energy bands along the current paths are shown in FIGS. 33A and 33B. Since an erase bias voltage Ve as high as about 3 V is applied, as shown in FIG. 33A, electrons accumulated in the floating conducting layer 114 are discharged into the channel layer 118 beyond the barrier layer 132 and further discharged to the first electrode 124 beyond the thin barrier layer 120 and through the contact layer 122. And written information "1" is erased (information "0" is written). since the barrier layer 132 has a lower barrier height on the side of the floating conducting layer 114, an erase voltage as low as about 2 V can erase information "1" at high speed.

In the state where no electrons are accumulated in the floating conducting layer 114, and information "1" is not written, since the channel layer 118 is not depleted, a current path is formed from the first electrode 124 directly to the second electrode 126 through the contact layer 122, the thin barrier layer 120 and the channel layer 118. A view of an energy band along this current path is shown in FIG. 33B.

Thus the semiconductor memory device according to the sixteenth embodiment can be a high speed electrically programmable ROM (EPROM), or a dynamic RAM (DRAM). Since a barrier height of the barrier layer on the side of the floating conducting layer 114 is lower, information writing and erasing can be conducted at low bias voltages.

Figure 34A:
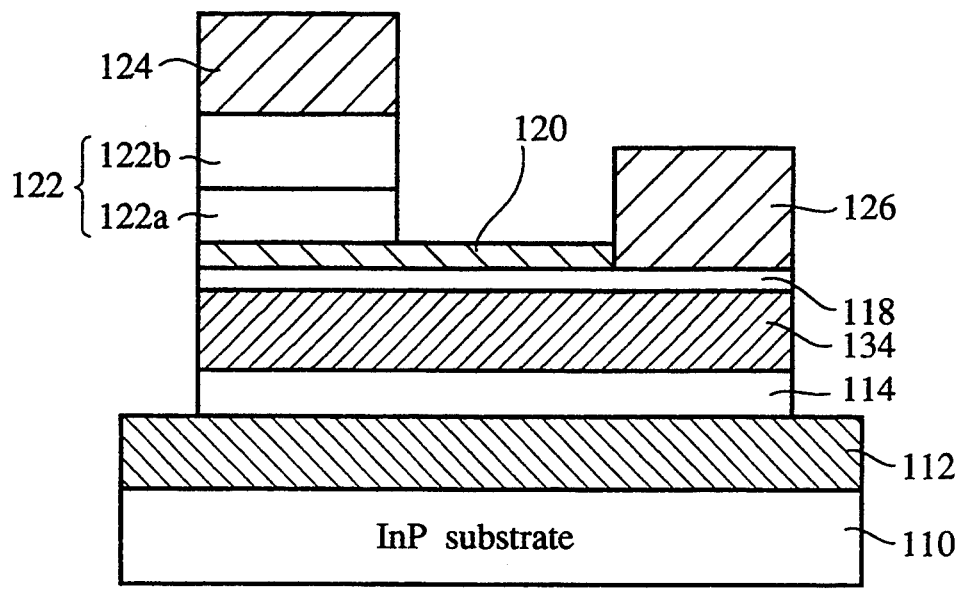
FIGS. 34A to 34C are views of the semiconductor memory device according to a seventeenth embodiment of the present invention.

The semiconductor memory device according to a seventeenth embodiment of the present invention will be explained with reference to FIGS. 34A to 34C. Common members of the semiconductor memory device according to the thirteenth embodiment are represented by common reference numerals not to repeat their explanation.

As in the thirteenth embodiment, an about 300 nm-thickness thick barrier layer 112 of non-doped In$_{0.52}$Al$_{0.48}$As, and an about 200 nm-thickness floating conducting layer 114 of n-In$_{0.53}$Ga$_{0.47}$As doped with a $1 \times 10^{18}$ cm$^{-3}$ dose of silicon are laid on a semi-insulating InP substrate 110 one on another in the stated order.

Figure 34B:
Figure 34C:
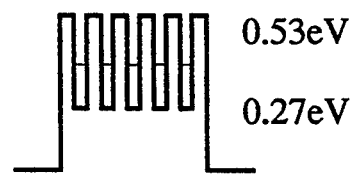

On the floating conducting layer 114, in place of the barrier layer 116 of non-doped i-In$_{0.52}$(Al$_{0.5}$Ga$_{0.5}$)$_{0.48}$As, as shown in FIG. 34B, an about 1.465 nm-thickness superlattice barrier layer 134 of a superlattice having 50 alternate recurrences of an about 1.465 nm-thickness non-doped i-In$_{0.52}$Al$_{0.48}$As layer 134a and an about 1.465 nm-thickness non-doped i-In$_{0.53}$Ga$_{0.47}$As layer 134 is formed. Electrons are accumulated in a multiquantum well in the superlattice barrier layer 134.

On the superlattice barrier layer 134, as in the thirteenth embodiment, a channel layer 118 of n-In$_{0.53}$Ga$_{0.47}$As of doped with a $5 \times 10^{17}$ cm$^{-3}$ dose of silicon, and a contact layer 122 of an about 20 n-In$_{0.53}$Ga$_{0.47}$As layer 122a doped with varied doses of silicon from $1 \times 10^{18}$ cm$^{-3}$ to $5 \times 10^{19}$ cm$^{-3}$, and an about 50 nm-thickness n-In$_{0.53}$Ga$_{0.47}$As layer 122b of doped with a $5 \times 10^{19}$ cm$^{-3}$ dose of silicon are laid one on another.

As shown in FIG. 34, the superlattice barrier layer 134 may be an about 146.5 nm-thickness superlattice including 50 recurrences of an about 1.465 nm-thickness thick non-doped i-In$_{0.52}$Al$_{0.48}$As layer 134a and an about 1.465 nm-thickness thick non-doped i-In$_{0.52}$(Al$_x$Ga$_{1-x}$)$_{0.48}$As layer 134b.

In the seventeenth embodiment, electrons injected from the electrodes are accumulated not only in the floating conducting layer 114 but also in a multiquantum well of the superlattice barrier layer 134, whereby information is stored. The operation of the seventeenth embodiment is the same as the thirteenth embodiment except that electrons are accumulated in the superlattice barrier layer 134, and its explanation is omitted.

According to the seventeenth embodiment, electrons are accumulated in a multiquantum well of the superlattice barrier layer 134. It is relatively easy to form a required special multiquantum well, and accordingly the semiconductor memory device according to the seventeenth embodiment can include well-controllable memory cells.

Figure 35:
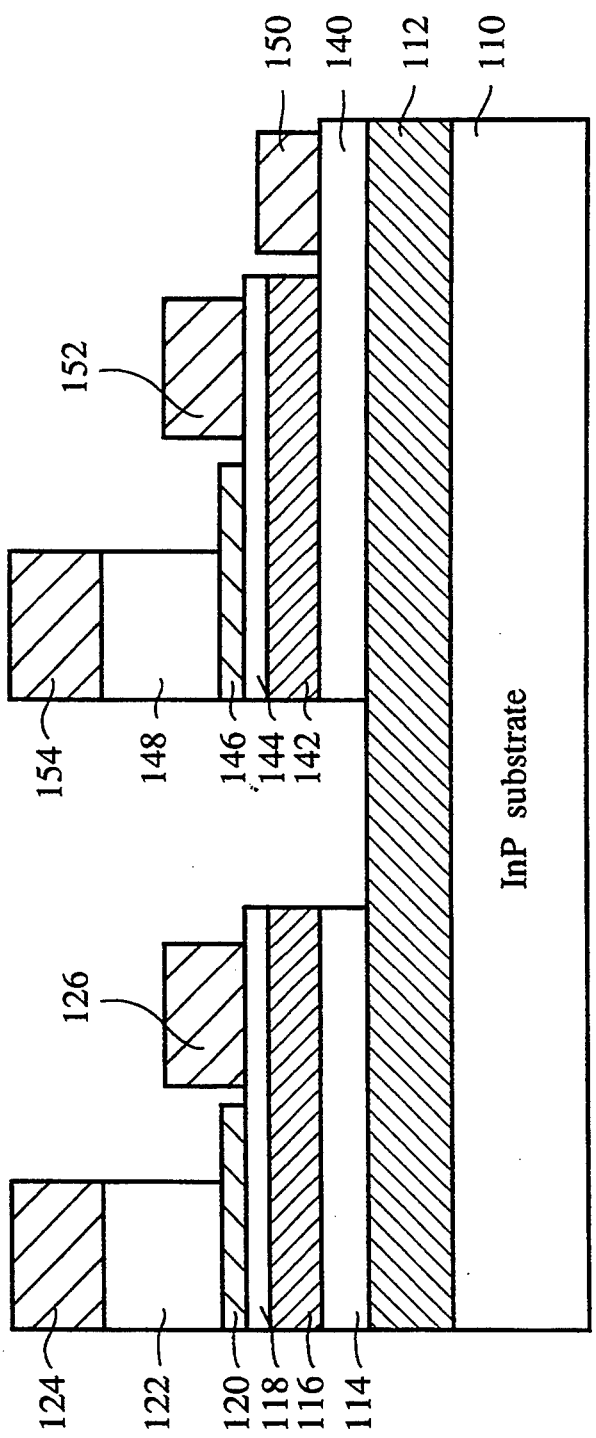
FIG. 35 is a view of the semiconductor memory device according to an eighteenth embodiment of the present invention.

The semiconductor memory device according to an eighteenth embodiment of the present invention will be explained with reference to FIG. 35. Common members with the thirteenth embodiment of FIGS. 18A and 18B are represented by common reference numerals not to repeat their explanation.

An about 300 nm-thickness thick barrier layer 112 of non-doped i-In$_{0.52}$Al$_{0.48}$As is formed on a semi-insulating InP substrate 110. On the thick barrier layer 112 in the region on the left side of FIG. 35, as in the thirteenth embodiment, an 200 nm-thickness floating conducting layer 114 of n-In$_{0.53}$Ga$_{0.47}$As doped with a $1 \times 10^{18}$ cm$^{-3}$ dose of silicon, a barrier layer 116 of non-doped i-In$_{0.52}$(Al$_x$Ga$_{1-x}$)$_{0.48}$As, a channel layer 118 of n-In$_{0.53}$Ga$_{0.47}$As doped with a $5 \times 10^{17}$ cm$^{-3}$ dose of silicon, an about 5 nm-thickness thin barrier layer 120 of non-doped i-In$_{0.52}$Al$_{0.48}$As, and an about 70 nm-thickness contact layer 122 of n-In$_{0.53}$Ga$_{0.47}$As doped with varied doses of silicon from $1 \times 10^{18}$ cm$^{-3}$ to $5 \times 10^{19}$ cm$^{-3}$ are formed in device-isolated, one on another in the stated order. A first electrode 124 is formed on the contact layer 122, and a second electrode 126 is formed on the channel layer 118.

Thus the semiconductor memory device according to the seventeenth embodiment is formed in the region of the left side of the semi-insulating InP substrate 110.

In the region on the right side of the semi-insulating InP substrate 110 a HET or RHET of the same structure as the semiconductor memory device is formed. That is, on the thick barrier layer 112, an about 200 nm-thickness collector layer 140 of n-In$_{0.53}$Ga$_{0.47}$As doped with a $1 \times 10^{18}$ cm$^{-3}$ dose of silicon, a barrier layer 140 of non-doped i-In$_{0.52}$(Al$_x$Ga$_{1-x}$)$_{0.48}$As, a base leading layer 144 of n-In$_{0.53}$Ga$_{0.47}$As doped with a $5 \times 10^{17}$ cm$^{-3}$ dose of silicon, an about 5 nm-thickness thin barrier layer of non-doped i-In$_{0.52}$Al$_{0.48}$As and an about 70 nm-thickness emitter layer 148 doped with varied doses of silicon from $1 \times 10^{18}$ cm$^{-3}$ to $5 \times 10^{19}$ cm$^{-3}$ are formed one on another in steps, device-isolated.

The collector layer is the same layer as the floating conducting layer 114. The barrier layer 142 is the same as the barrier layer 116. The base leading layer 144 is the same layer as the channel layer 118. The base layer 146 is the same as the thin barrier layer 120. The emitter layers 148 is the same as the contact layer 122.

A collector electrode 150 is formed on the collector layer 140. A base electrode 152 is formed on the base leading layer 144. An emitter electrode 154 is formed on the emitter layer 148.

Thus according to the eighteenth embodiment, on the semi-insulating InP substrate 110, in addition to the memory cells, a multi-emitter type InGaAs/In(Al-Ga)As hot electron transistor (HET) or a resonant tunneling hot electron transistor (RHET) can be formed.

Figure 36:
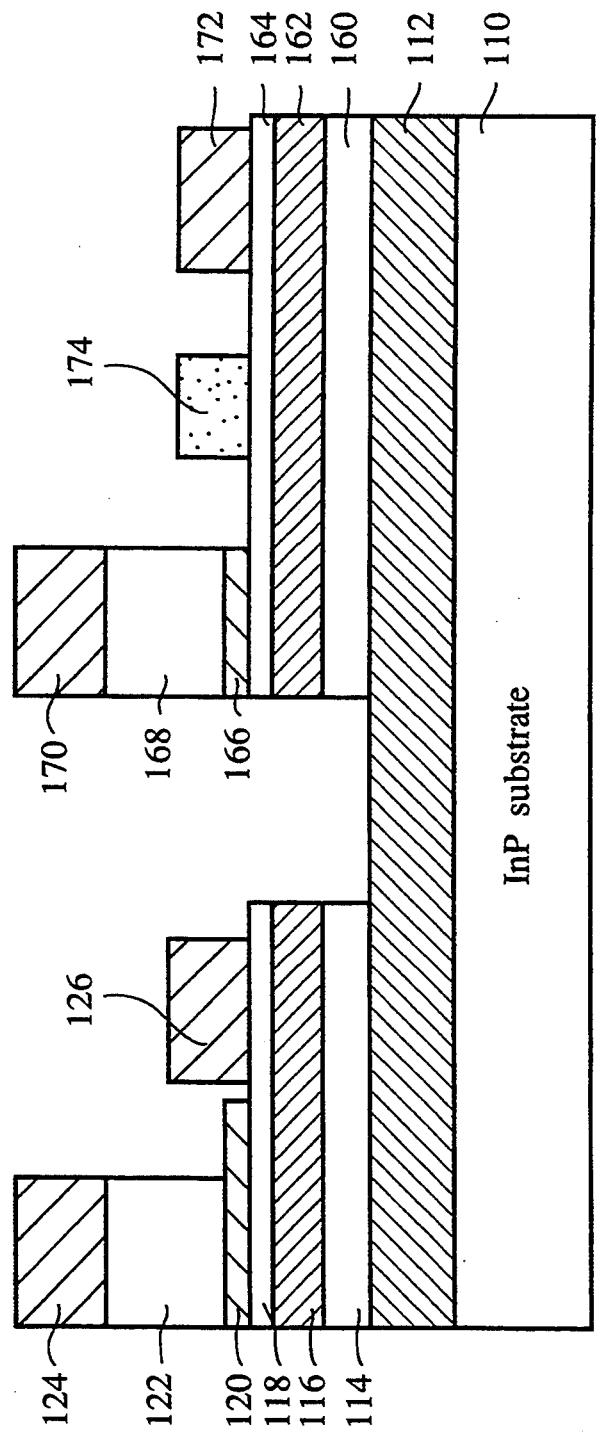
FIG. 36 is a view of the semiconductor memory device according to a nineteenth embodiment of the present invention.

Then the semiconductor memory device according to a nineteenth embodiment of the present invention will be explained with reference to FIG. 36. Common members with the eighteenth embodiment of FIG. 35 are represented by common reference numerals not to repeat their explanation.

In the nineteenth embodiment, in the region on the right side of a semi-insulating InP substrate 110, in place of a HET or RHET, a FET (HEMT) is formed. That is, on a thick barrier layer 112 an about 200 nm-thickness n-In$_{0.53}$GA$_{0.47}$As layer 160 doped with a $1 \times 10^{18}$ cm$^{-3}$ dose of silicon, and a non-doped i-In$_{0.52}$(Al$_x$Ga$_{1-x}$)$_{0.48}$As layer 162, and a channel layer 164 of n-In$_{0.53}$Ga$_{0.47}$As doped with a $5 \times 10^{17}$ cm$^{-3}$ dose of silicon are formed one on another in the stated order, device-isolated.

On the left side of the contact layer 164, a source electrode 170 is formed through an about 5 nm-thickness thin barrier layer 166 of non-doped i-in$_{0.52}$Al$_{0.48}$As and an about 70 nm-thickness contact layer 168 of n-In$_{0.53}$Ga$_{0.47}$As doped with varied doses of silicon from $1 \times 10^{18}$ cm$^{-3}$ to $5 \times 10^{19}$ cm$^{-3}$. A drain electrode 172 is formed on the right side of the contact layer 164. A gate electrode 174 of tungsten silicide (WSi) or aluminium (Al) is formed on a part of the contact layer 164 between the source electrode 170 and the drain electrode 172.

A donor layer 160 is the same as the floating conducting layer 114. An active layer 162 is the same as the barrier layer 116. The contact layer 164 is the same as the channel layer 118. The thin barrier layer 166 is the same as the thin barrier layer 120. the collect layer 168 is the same as the contact layer 122.

Thus the nineteenth embodiment can include not only memory cells but also a FET (HEMT) formed on the semi-insulating InP substrate 110. Peripheral circuits for amplification of stored information, and for the memory cell can be easily formed.

The semiconductor memory device according to a twelfth embodiment of the present invention will be explained with reference to FIGS. 37 to 40.

The twelfth embodiment includes a number of the memory cells according to the first to the nineteenth embodiments arranged in matrices.

Each memory cell MC11, MC12, ..., MC54, MC55 has a first electrode E1 and a second electrode E2. Word lines WL1, WL2, ..., WL5 are formed of Ti/Pt/Au or others and interconnect the first electrodes E1 of those of the memory cells horizontally adjacent to each other. Bit lines BL1, BL2, ..., BL5 normally intersecting the word lines WL1, WL2, ..., WL5 are formed of Ti/Pt/AU or others and interconnect the second electrodes E2 of those of the memory cells MC11, MC12, ..., MC54, MC55 vertically adjacent to each other.

One example of the method for storing information in the semiconductor memory device according to the twelfth embodiment will be explained with reference to FIGS. 37 and 38.

First the method for writing information "1" in a specific memory cell in the memory cell array will be explained with reference to FIG. 37.

When information "1" is written in a specific memory cell of the memory array, e.g., in the memory cell MC15, 0 V (ground) is applied to the word line WL1, and +1 V is applied to the word lines WL2, WL3, WL4, WL5, 0 V (ground) is applied to the bit lines BL1, BL2, BL3, BL4, and +1 V is applied to the bit line BL5. Only the memory cell MC 15 alone has the first electrode E1 supplied with +1 V and the second electrode E2 with 0 V. Accordingly stored contents do not change.

Then the method for erasing information "1" (writing information "0") in a specific memory cell of the memory cell array will be explained with reference to FIG. 37.

When information "1" of a specific memory cell of the memory cell array, e.g., the memory cell MC 15 is erased (write information "0"), 0 V is applied to the word line WL1, $-1.5$ V is applied to the word lines WL2, WL3, WL4, WL5, and −3 V is applied to the bit lines BL1, BL2, BL3, BL4. The memory cell MC 15 alone has the first electrode E1 supplied with 0 V and the second electrode E2 supplied with −3 V, and information "1" is erased (information "0" is written).

As regards the other memory cells, the memory cells MC11, MC12, MC13, MC14 have the first electrode E1 supplied with 0 V ad the second electrodes E2 supplied with −2 V, and stored contents do not change. The other memory cells MC21, MC22, MC23, MC24, MC31, MC32, MC33, MC34, MC41, MC42, MC43, MC44, MC51, MC52, MC53, MC54 have the first electrodes E1 supplied with −1.5 V and the second electrodes supplied with −1 V. Stored contents do not change.

The method for reading information from a specific memory cell of the memory cell array will be explained with reference to FIG. 37.

When information is read from specific memory cells, e.g., memory cells MC11, MC12, MC13, MC14, MC15 of the memory cell array, the word line WL1 is supplied with 0 V (ground), the word lines WL2, WL3, WL4, WL5 are supplied with −1 V, and the bit lines BL1, BL2, BL3, BL4, BL5 are supplied with −1 V. Only the memory cells MC11, MC12, MC13, MC14, MC15 have the first electrode E1 supplied with 0 V and the second electrodes E1 and E2 supplied with −1 V, and stored contents of the memory cells MC11, MC12, MC13, MC14, MC15 are read.

As regards the other memory cells, the memory cells MC21, MC22, MC23, MC24. MC25, MC31, MC32, MC33, MC34, MC35, MC41, MC421, MC43, MC44, MC45, MC51, MC52, MC53, MC55 have both the first and the second electrodes E1 and E2 supplied with −1 V. Accordingly their stored contents are neither read nor change.

When information "1" of a specific area of the memory cell array, e.g., nine memory cells MC22, MC23, MC24, MC32, MC33, MC34, MC42, MC43, MC44 is erased in a block (information "0" is written in a block), the word lines WL1 is supplied with −1.5 V, the word lines WL2, WL3, WL4 are supplied with 0 V (ground), the word line WL5 is supplied with −1.5 V, the bit line BL1 is supplied with 0 V, the bit lines BL2, BL3, BL4 are supplied with −3 V, and the bit line BL5 is supplied with 0 V. The nine memory cells MC22, MC23, MC24, MC32, MC33, MC34, MC42, MC43. MC44 have the first electrodes E1 supplied with 0 V and the second electrode E2 supplied with −3 V, and information "1" is erased (information "0" is written).

The memory cells MC11, MC12, MC13, MC14, MC15, MC21, MC22, MC23, MC24, MC25 outside the specific area have the first electrode E1 supplied with −1.5 V and the second electrode E2 supplies with 0 V or −3 V, and stored contents do not change. The memory cells MC21, MC31, MC41, MC25, MC35 and MC45 have the first electrode E1 with 0 V and the second electrode E2 with 0 V, and stored contents do not change.

Figure 39:
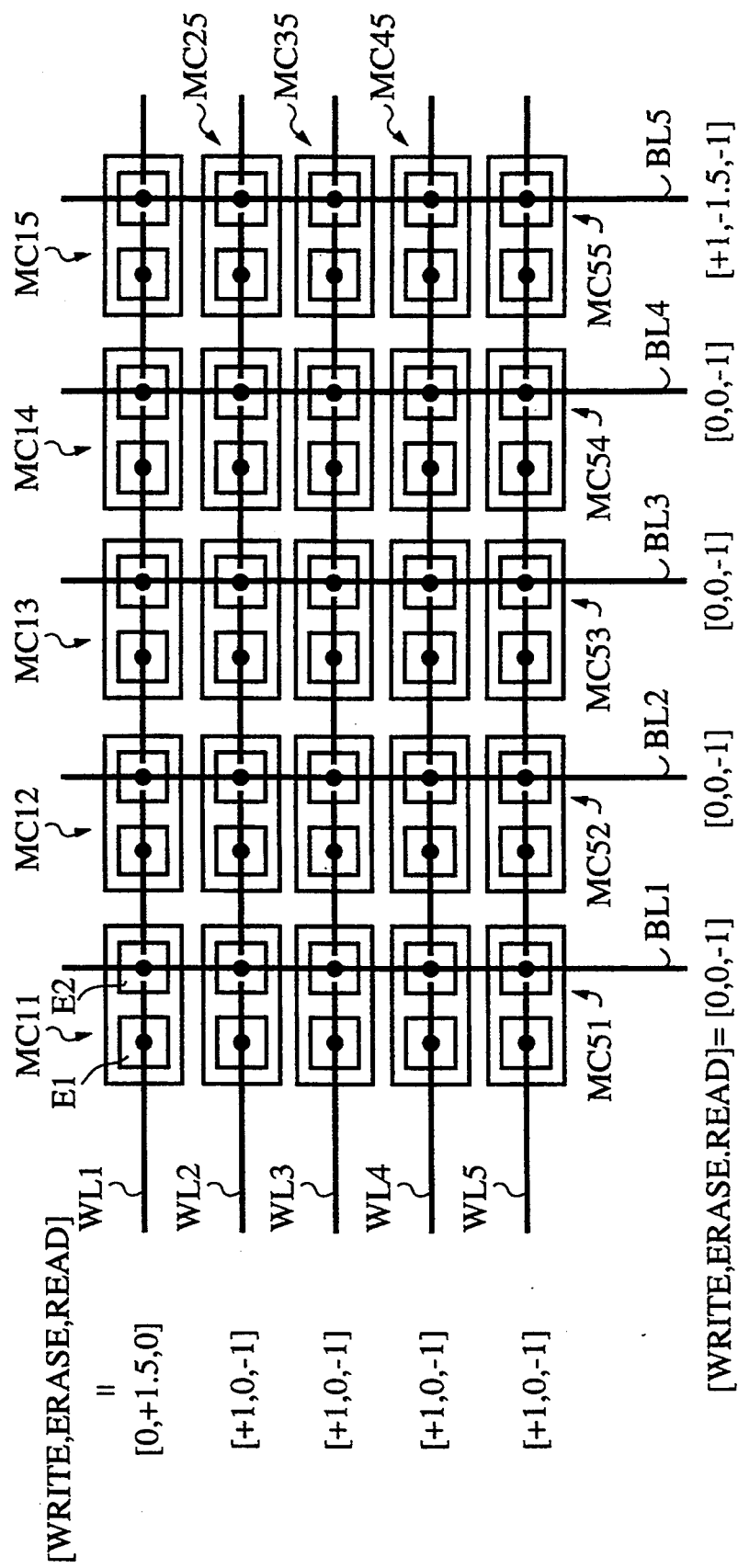
FIG. 39 is a view of another example of the method for storing information in the semiconductor memory device according to the twelfth embodiment.
Figure 40:
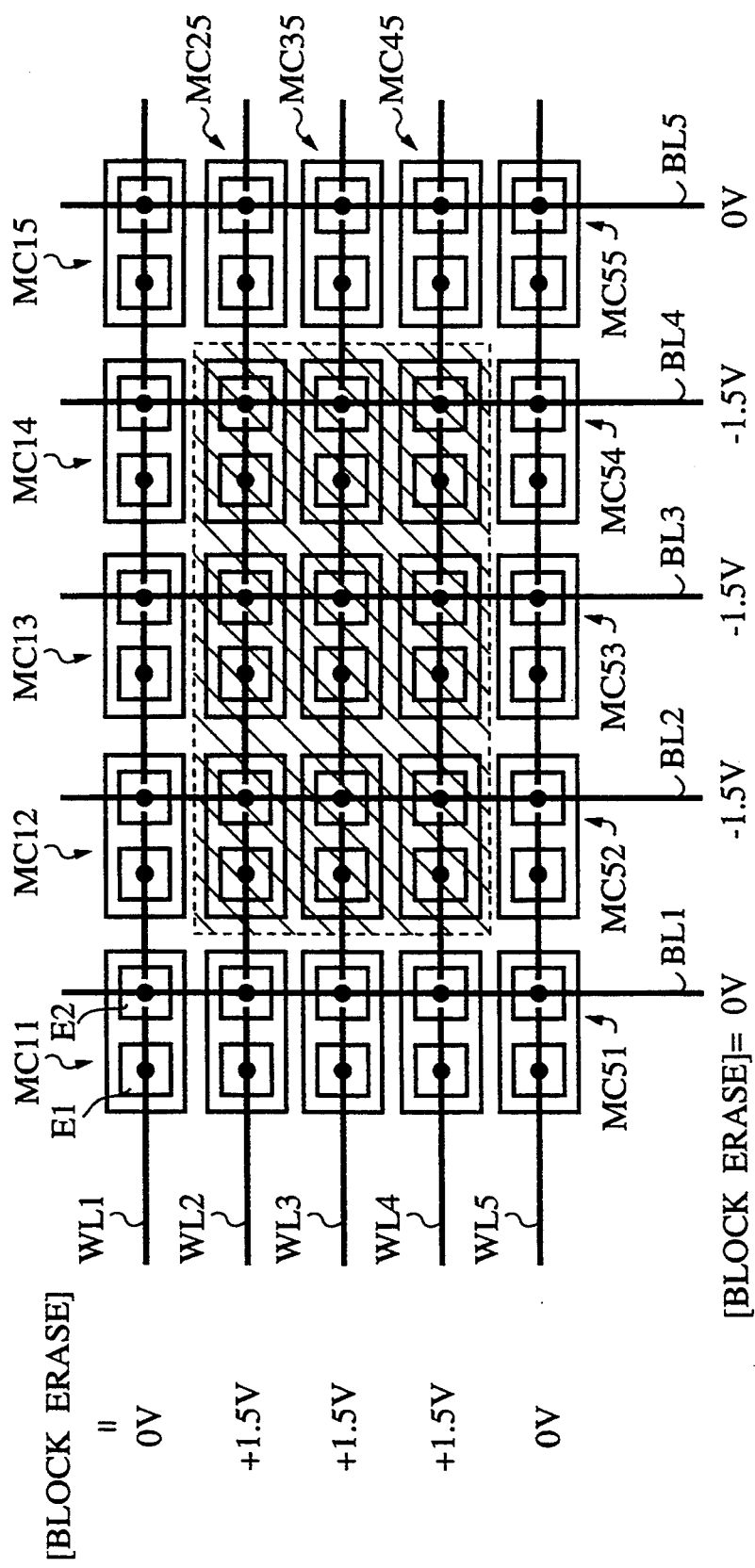
FIG. 40 is a view of further another example of the method for storing information in the semiconductor memory device according to the twelfth embodiment.

Then another example of the method for storing information in the semiconductor memory device according to the twelfth embodiment will be explained with reference to FIGS. 39 and 40.

Figure 37:
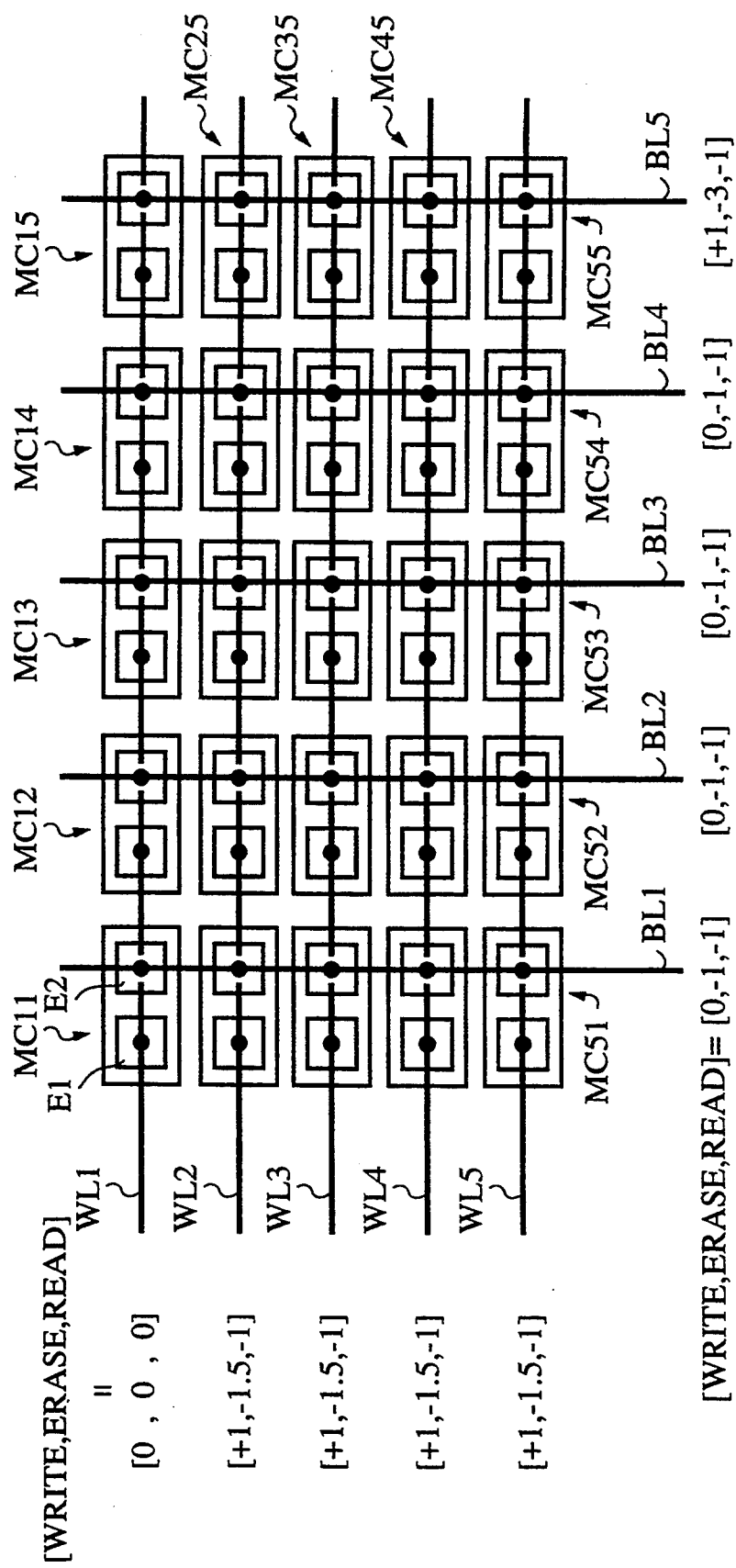
FIG. 37 is a view explaining one example of the method for storing information in the semiconductor memory device according to a twelfth embodiment of the present invention.
Figure 38:
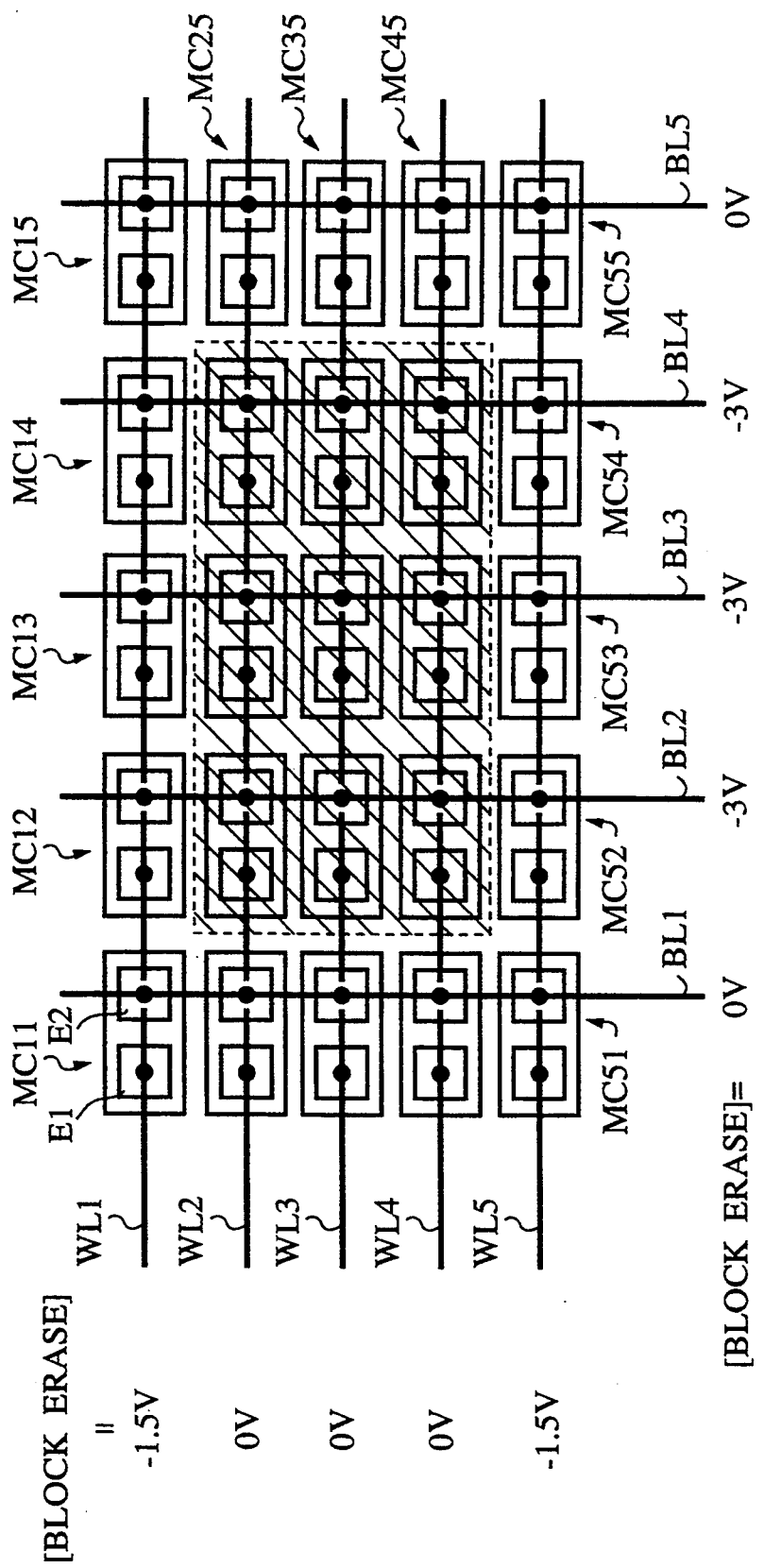
FIG. 38 is a view explaining one example of the method for storing information in the semiconductor memory device according to the twelfth embodiment.

This example is different form the example of FIGS. 37 and 38 in the method for erasing information "1" (writing information "0"). The example of FIGS. 37 and 38 requires a 3 V maximum voltage when information "1" is erased. But this example only requires a 1.5 maximum voltage. The method for writing information "1" in the memory cells, and the method for reading information from the memory cells are the same, and their explanation is omitted.

The method for erasing information "1" in a specific memory cell of the memory cell array (writing information "0") will be explained with reference to FIG. 39.

When information "1" in a specific memory cell of the memory cell array, e.g., the memory cell MC15 is erased, the word line WL1 is supplied with +1.5 V, the word lines WL2, WL3, WL4, WL5 are supplied with 0 V, the bit lines BL1, BL2, BL3, BL4 are supplied with 0 V, and the bit line BL5 is supplied with −1.5 V. The memory cell MC15 alone has the first electrode E1 supplied with +2642 1.5 V and the second electrode E2 with −1.5 V, and information "1" is erased (information "0" is written).

As regards the other memory cells, the memory cells MC11, MC12, MC13, MC14 have the first electrode E1 supplied with +1.5 V and the second electrode E2 supplied with 0 V, and stored contents do not change. The memory cells MC25, MC35, MC45, MC55 have the first electrode E1 supplied with 0 V and the second electrode E2 supplied with −1.5 V, and stored contents do not change. The memory cells MC21, MC22, MC23, MC24, MC31, MC32, MC34, MC41, MC42, MC43, MC44, MC51, MC52, MC53, MC54 have the first electrode E1 supplied with 0 V and the second electrode E2 supplied with 0 V, and stored contents do not change.

Then, the method for erasing in a block information "1" in a specific area of the memory cell array (writing information "0" in a block) will be explained with reference to FIG. 40.

When information "1" in a specific area of the memory cell array, e.g., none memory cells MC22, MC 23, MC24, MC32, MC33, MC34, MC42, MC43, MC44 in a block (write information "0" in a block), the word line WL1 is supplied with 0 V, the word lines WL2, WL3, WL4 are supplied with +1.5 V, the word line WL5 is supplied with +1.5 V, the bit line BL1 is supplied with 0 V, the bit lines BL2, BL3, BL4 are supplied with −1.5 V and the bit line BL5 is supplied with 0 V. The nine memory cells MC22, MC23, MC24, MC32, MC33, MC34, MC42, MC43, MC44 have the first electrode E1 supplied with +1.5 V and the second electrode E2 supplied with −1.5 V, and information "1" is erased (information "0" is written).

As regards the memory cells outside the specific region, the memory cells MC11, MC12, MC13, MC14, MC15, MC21, MC22, MC23. MC24, MC25 have the first electrodes E1 supplied with 0 V and the second electrode E2 supplied with 0 V or −1.5 V, and stored contents do not change. The memory cells MC21, MC31, MC41, MC25, MC35, MC45 have the first electrodes E1 supplied with +1.5 V and the second electrodes E2 supplied with 0 V, and stored contents do not change.

Thus according to the twentieth embodiment, two lines are provided for one memory cell, which enables stored information to be written or read at high speed. The conventional semiconductor memory device, e.g., 1 MOS cell-type DRAMs including silicon MOSFETs and capacitors have an about 2 $\mu m^2$ cell area in 0.6 $\mu m$ rule, whereas the twentieth embodiment can reduce the cell area to about 1 $\mu m^2$.

The twentieth embodiment does not require capacitors of large areas, which simplifies its fabrication process.

In a case that more micronization is necessary, DRAms using silicon have a problem of noise margins due to capacities of the capacitors, whereas the semiconductor memory device according to the twentieth embodiment is free from special substantive problems involved in micronization, and further micronization is possible.

The semiconductor memory device according to a twenty-first embodiment of the present invention will be explained with reference to FIGS. 41, 42A to 42C, 43A to 43C, and 44A to 44C. Common members of the thirteenth embodiment of FIGS. 18A and 18B are represented by common reference numerals not to repeat their explanation.

Figure 41:
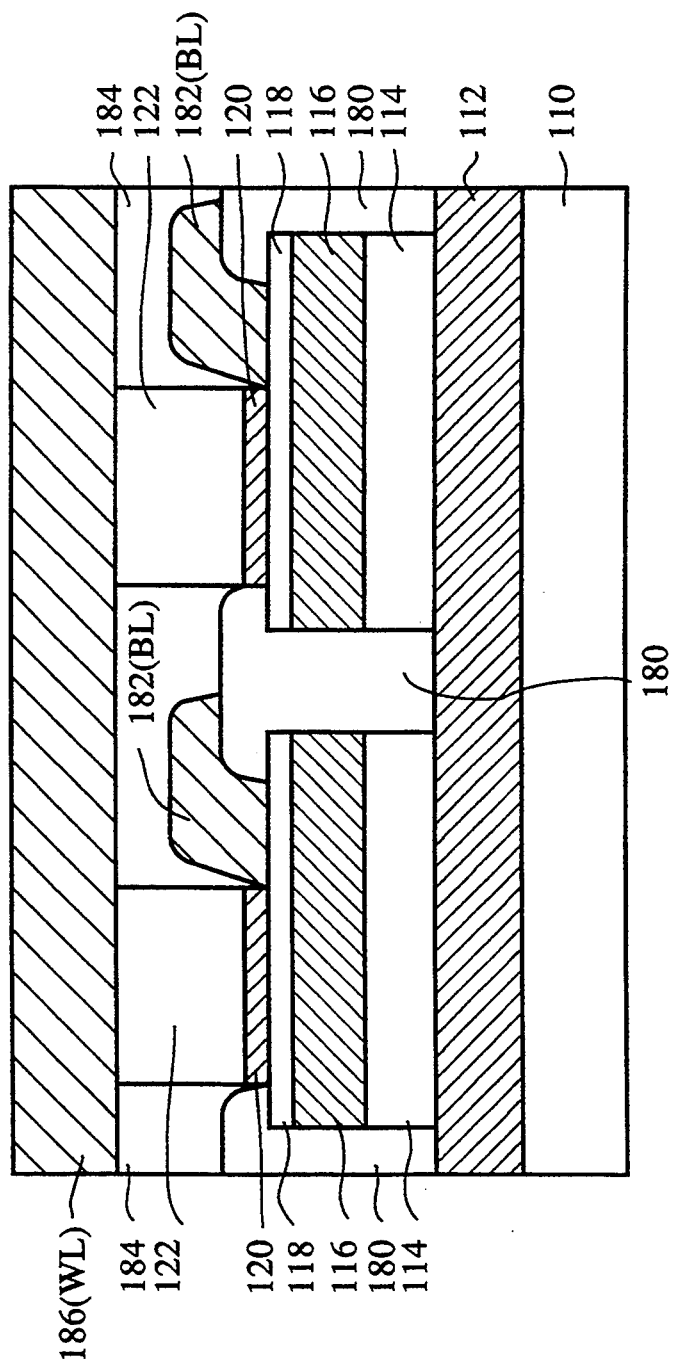
FIG. 41 is a view of the semiconductor memory device according to a 21th embodiment of the present invention.

The semiconductor memory device according to the twenty-first embodiment will be explained with reference to FIG. 41. This embodiment is characterized by its structure suitable to be arranged in a matrix of FIG. 36.

As in the thirteenth embodiment, an about 300 nm-thickness thick barrier layer 112 of non-doped i-In$_{0.52}$Al$_{0.48}$As is formed on a semi-insulating InP substrate 110. On the thick barrier layer 112, an about 200 nm-thickness floating conducting layer 114 of n-In$_{0.53}$Ga$_{0.47}$As doped with a $1 \times 10^{18}$ cm$^{-3}$ dose of silicon, a barrier layer 116 of non-doped i-In$_{0.52}$(Al$_x$Ga$_{1-x}$)$_{0.48}$As, and a channel layer of n-In$_{0.53}$Ga$_{0.47}$As doped with a $5 \times 10^{17}$ cm$^{-3}$ dose of silicon are formed one on another in the stated order, isolated for each memory cell by an oxide film 180.

In the region on the left side of the channel layer 118 of each memory cell an about 5 nm-thickness thin barrier layer 120 of non-doped i-In$_{0.52}$Al$_{0.48}$As, and an about 70 nm-thickness contact layer 122 of n-In$_{0.53}$Ga$_{0.47}$As doped with varied doses of silicon from $1 \times 10^{18}$ cm$^{-3}$ to $5 \times 10^{19}$ cm$^{-3}$ are formed one on another.

In the region on the right side of each memory cell second electrode 182 is formed. The second electrode 182 is extended, as viewed in FIG. 41, from the front side of the sheet of FIG. 41 backward through the back side of the sheet, and functions as a bit line BL commonly connecting the second electrode of each memory cell. The bit line BL is buried in an oxide film 184.

A first electrode 186 is formed on the contact layer 122 of each memory cell. The first electrode 186 is extended to the left and right on the sheet of FIG. 41 and functions as a word line WL commonly connecting the first electrode of each memory cell.

Thus in the twenty-first embodiment, a matrix array of memory cells horizontally and vertically connected by word lines and bit lines without the necessity of additional lines commonly connecting the first and the second electrodes of the respective memory cells can be realized.

Next, the process for fabricating the semiconductor memory device according to the twenty-first embodiment will be explained with reference to FIGS. 42A to 42C, 43A to 43C, and 44A to 44C.

Figure 42A:
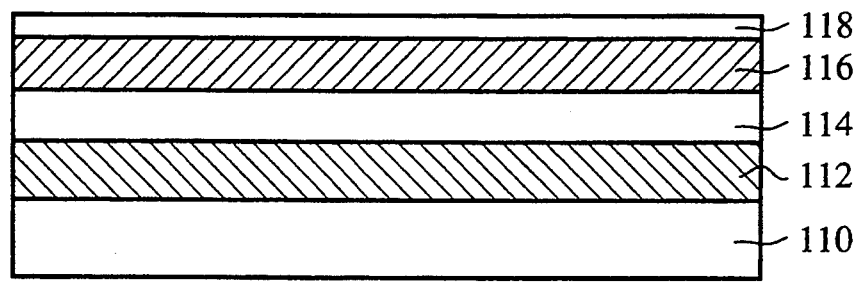
FIGS. 42A to 42C are sectional views (1) illustrative of the steps of the process for fabricating the semiconductor memory device according to the 21th embodiment of the present invention.

An about 300 nm-thickness thick barrier layer 112 of non-doped i-In$_{0.52}$Al$_{0.48}$As, an about 200 nm-thickness floating conducting layer 114 of n-In$_{0.53}$Ga$_{0.47}$As doped with a $1 \times 10^{13}$ cm$^{-3}$ dose of silicon, an about 50 nm-thickness barrier layer 116 of non-doped i-In$_{0.52}$Ga$_{0.47}$As, and an about 30 nm-thickness channel layer 118 of n-In$_{0.53}$Ga$_{0.47}$As doped with a $5 \times 10^{17}$ cm$^{-3}$ dose of silicon are deposited on a semi-insulating InP substrate 110 in the stated order by molecular beam epitaxy (MBE) (FIG. 42A).

Figure 42B:
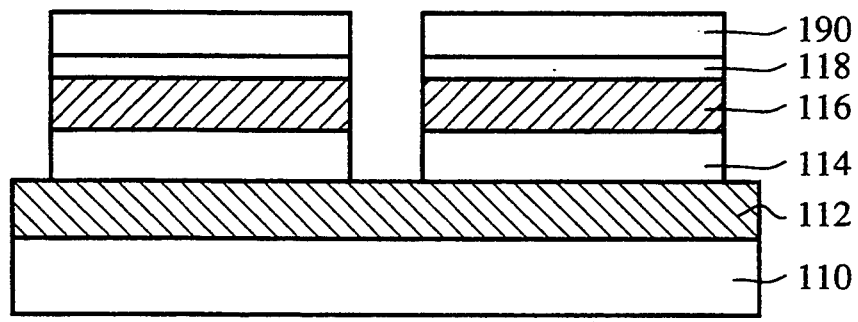

The a resist layer 190 is applied to the entire surface and is patterned in a shape of the memory cells. With the patterned resist layer 190 as a mask, the floating conducting layer 114, the barrier layer 116, the channel layer 118 are etched in a mesa (FIG. 42B).

Figure 42C:
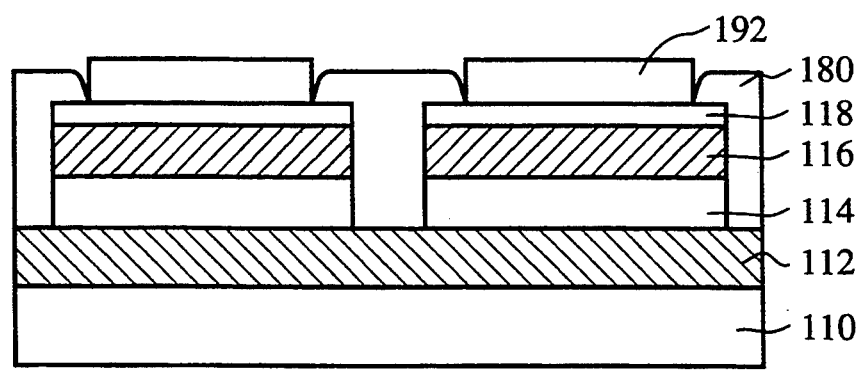

Then a resist layer 192 is applied onto the entire surface. The resist layer 192 is patterned so as to mask regions on the mesas of the memory cells for first electrodes and second electrodes to be formed which will be described later. Then the oxide film 180 is deposited on the entire surface to device-isolate the memory cells (FIG. 42C).

Figure 43A:
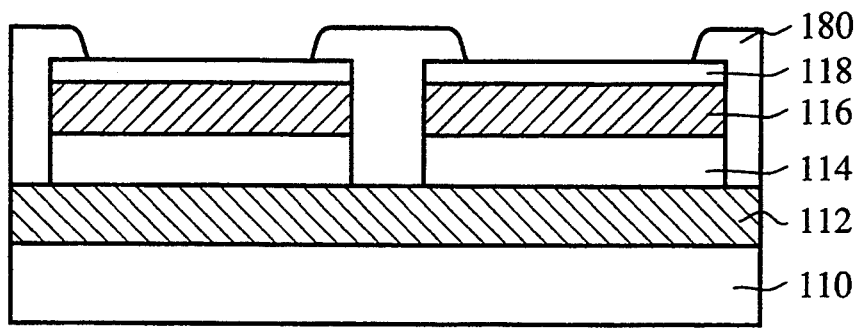
FIGS. 43A to 43C are sectional views (2) illustrative of the steps of the process for fabricating the semiconductor memory device according to the 21th embodiment of the present invention.
Figure 43B:
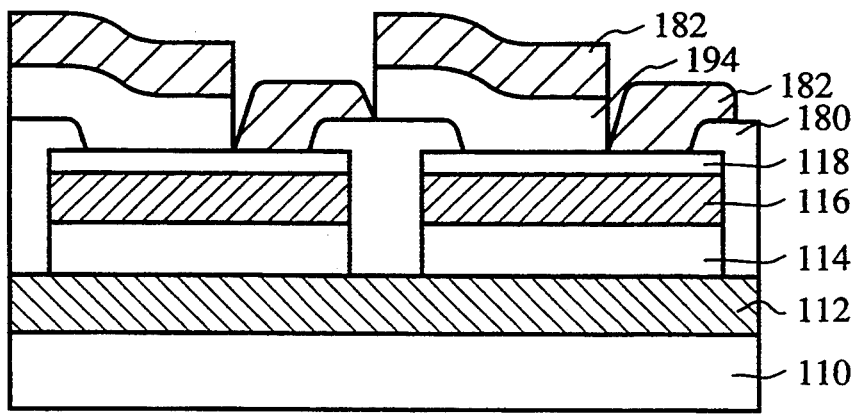

Next, the resist layer 192 is removed (FIG. 43A), and then a resist layer 194 is applied onto the entire surface and patterned to open regions for the second electrodes (bit lines) to be formed (FIG. 43B). Subsequently a tungsten silicide layer 82 forming the second electrodes 182 (bit lines BL) is deposited (FIG. 43B).

Figure 43C:
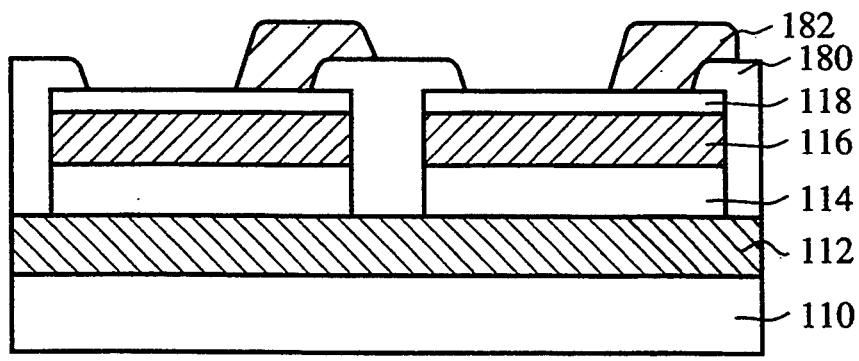

Then the resist layer 194 is removed, and excessive parts of the tungsten silicide layer is removed by lift-off. The surface of the channel layer 18 is exposed (FIG. 43C).

Figure 44A:
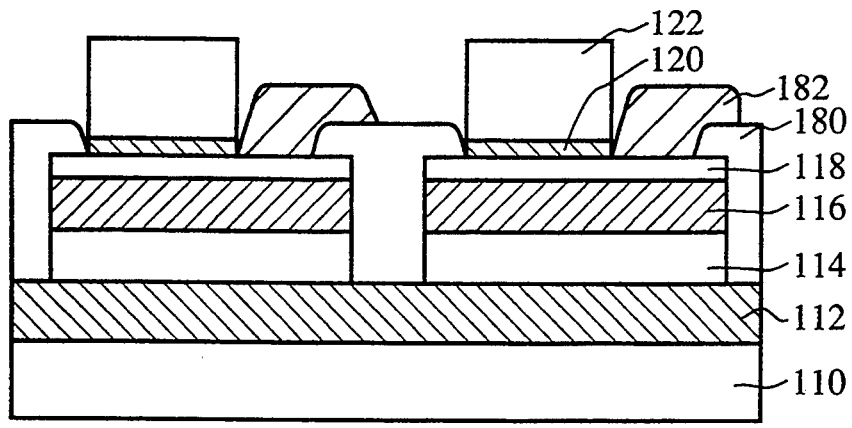
FIGS. 44A to 44C are sectional views (3) illustrative of the steps of the process for fabricating the semiconductor memory device according to the 21th embodiment of the present invention.

A crystal is grown again on the exposed surface of the channel layer 118 by molecular beam epitaxy (MBE). An about 5 nm-thickness thin barrier layer 120 of non-doped i-In$_{0.52}$Al$_{0.48}$As, and an about 70 nm-thickness contact layer 122 of n-In$_{0.53}$Ga$_{0.47}$As doped with varied doses of silicon from $1 \times 10^{19}$ cm$^{-3}$ to $5 \times 10^{19}$ cm$^{-3}$ are deposited in the stated order (FIG. 44A).

Figure 44B:
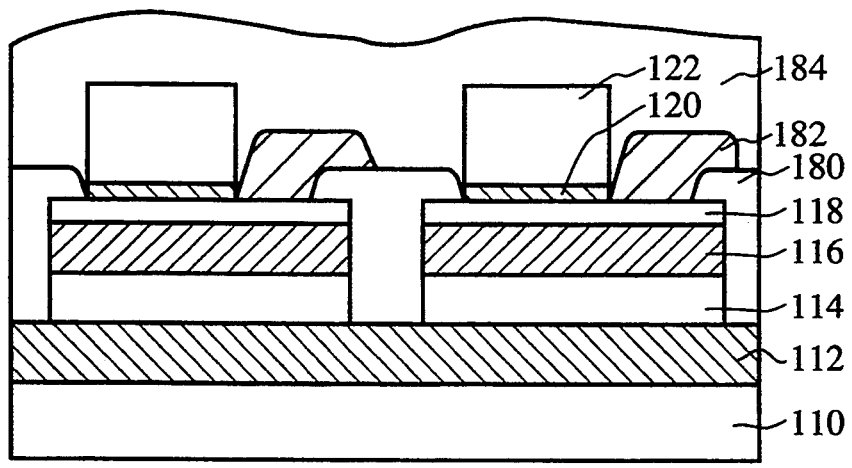

Then the oxide film 184 is formed on the entire surface so as to cover the respective whole memory cells including the second electrodes (bit lines) 82 (FIG. 44B).

Figure 44C:
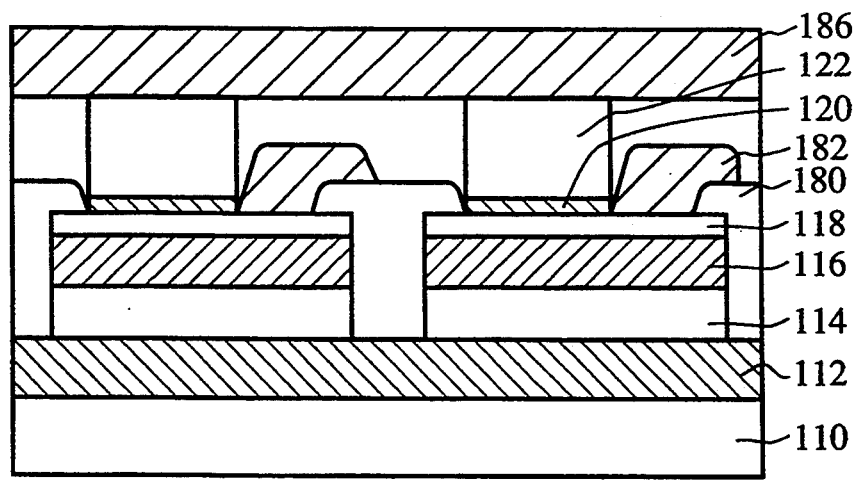

Next, the oxide film 184 is etched with a mixed etching gas of CF$_4$ and O$_2$, and the etching is set on until the oxide film 184 is planarized to expose the supper surface of the contact layer 122 (FIG. 44C). Subsequently a Cr/Au layer or a Pd/Ge layer which is to be the first electrodes (word lines) is deposited on the entire surface and is patterned to form the first electrodes 186 (world lines WL). and the fabrication of the semiconductor memory device is completed (FIG. 44C).

Thus the semiconductor memory device according to the twenty-first embodiment can be formed by a small number of steps.

Figure 45:
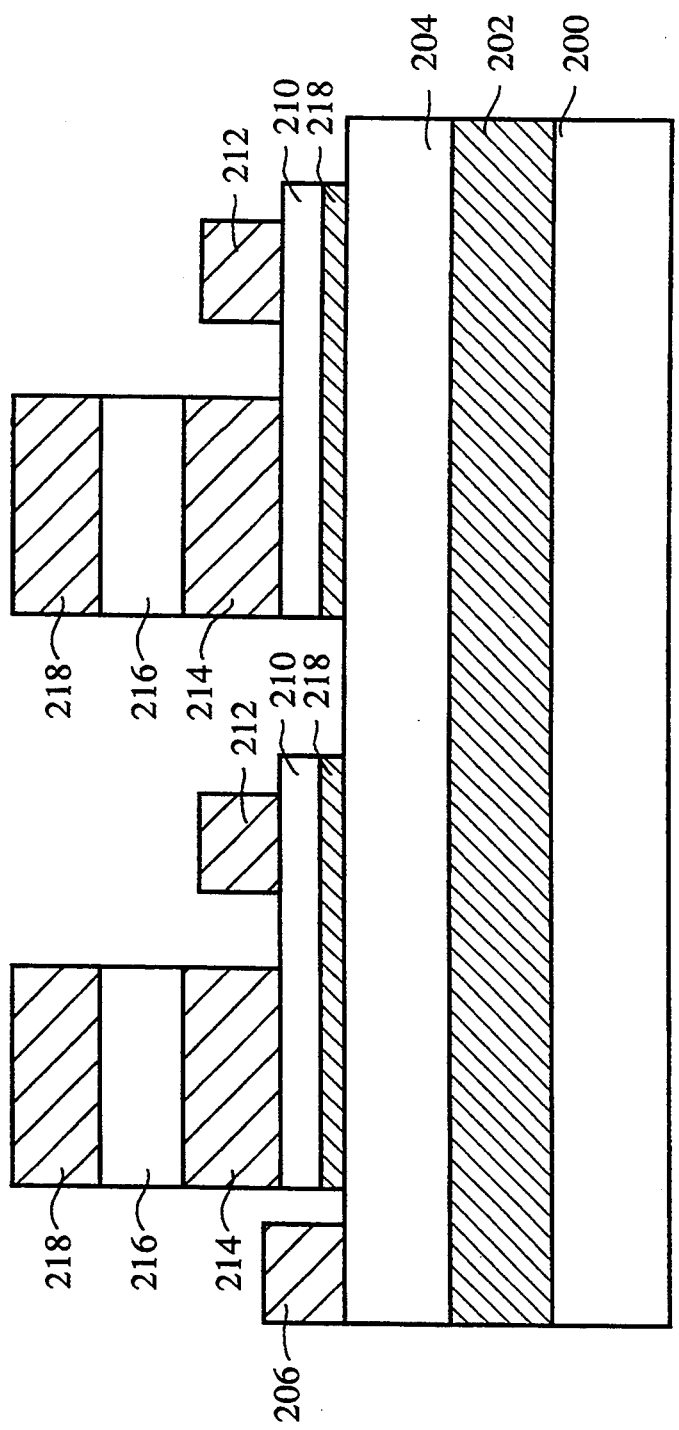
FIG. 45 is a view of the semiconductor memory device according to a 22th embodiment of the present invention.

Next the semiconductor memory device according to a twenty-second embodiment of the present invention will be explained with reference to FIG. 45. The twenty-second embodiment is also suitable to be arranged in a matrix of FIG. 36. This embodiment is characterized by the reversed structure of the semiconductor memory device according to the first to the 21st embodiments, and in that the second electrodes are buried in the substrates as common lines (word lines).

An about 200 nm-thickness thick buffer layer 202 of non-doped i-In$_{0.52}$Al$_{0.48}$As is formed on an semi-insulating InP substrate 200. On the buffer layer 202, an about 200 nm-thickness emitter layer 204 of n-In$_{0.53}$Ga$_{0.47}$As doped with a $1 \times 10^{19}$ cm$^{-3}$ dose of silicon is formed. The emitter layers 204 of the memory cells arranged horizontally as viewed in FIG. 45 are commonly connected to function as the word lines WL. First electrodes 206 which are common with the respective memory cells are provided on an end of the emitter layer 204.

An about 5 nm-thickness thin barrier layer 208 of non-doped i-In$_{0.52}$Al$_{0.48}$As, and an about 30 nm-thickness channel layer 210 of n-In$_{0.53}$Ga$_{0.47}$As doped with a $1\times10^{17}$ cm$^{-3}$ dose of silicon are formed one on another, isolated from the respective memory cell on the emitter layer 204.

In the region on the right side of the channel layer 210 of each memory cell a second electrode 212 of an about 200 nm-thickness tungsten silicide (WSi) layer is formed. The second electrodes 212 are extended, as viewed in FIG. 45, from the front side of the sheet backward through the back side of the sheet and function as bit lines BL commonly connecting the second electrodes of the respective memory cells.

In the region on the left side of the channel layer 210 of each memory cell an about 200 nm-thickness thick barrier layer 214 is formed of non-doped i-In$_{0.52}$(Al$_x$-Ga$_{1-x}$)$_{0.48}$As. On the thick barrier layer 214 an about 200 nm-thickness floating conducting layer 216 is formed of n-In$_{0.53}$Ga$_{0.47}$As doped with a $1\times10^{18}$ cm$^{-3}$ dose of silicon (Si). On the floating conducting layer 216 an about 5 nm-thickness barrier layer 218 is formed of non-doped i-In$_{0.52}$Al$_{0.48}$As.

Thus in the twenty-second embodiment, the first electrodes of the respective memory cells, and the second electrodes thereof are interconnected without additional lines commonly connecting the first electrodes, and the second electrodes, in a matrix layout of the memory cells interconnected horizontally and vertically by the word lines and the bit lines.

The present invention is not limited to the above-described embodiments and includes other various modifications. For example, in the above-described embodiments InGaAs/In(AlGa)As compound semiconductor materials are used, but GaAs/AlGaAs compound, InGaAs/InP compound, InAs/AlGaAsSb compound and other compound semiconductor materials, Si and SiGe, Si and SiO$_2$, and other semiconductor materials, metal and insulating material combinations, such as CaF and CoSi, etc., superconducting materials, such as Nb, NbO, etc., oxide superconductors, such as MgO, SrTiO$_3$, etc., and other materials may be used.

What is claimed is:

1. A semiconductor memory device comprising:
   a semiconductor substrate;
   a non-doped thick barrier layer formed on the semiconductor substrate;
   an impurity doped floating conducting layer formed on the thick barrier layer;
   a thin barrier layer formed on the floating conducting layer and having an asymmetric barrier whose barrier height is higher on the side of the floating conducting layer;
   a channel layer formed on the thin barrier layer; and
   a first electrode and a second electrode formed on the channel layer.

2. A semiconductor memory device comprising:
   a semiconductor substrate;
   a non-doped thick barrier layer formed on the semiconductor substrate;
   an impurity doped floating conducting layer formed on the thick barrier layer;
   a thin barrier layer formed on the floating conducting layer and having an asymmetric resonant tunneling barrier whose resonance level is higher on the side of the floating conducting layer;
   a channel layer formed on the thin barrier layer; and
   a first electrode and a second electrode formed on the channel layer.

3. A semiconductor memory device comprising:
   a semiconductor substrate;
   a non-doped thick barrier layer formed on the semiconductor substrate;
   an impurity doped floating conducting layer formed on the thick barrier layer;
   an intermediate barrier layer formed on the floating conducting layer and having an asymmetric barrier whose barrier height is lower on the side of the floating conducting layer;
   a channel layer formed on the intermediate barrier layer;
   a thin barrier layer formed on the channel layer and having a symmetric barrier whose barrier height is substantially constant; and
   a first electrode and a second electrode formed on the thin barrier layer.

4. A semiconductor memory device comprising:
   a semiconductor substrate;
   a non-doped thick barrier layer formed on the semiconductor substrate;
   an impurity doped floating conducting layer formed on the thick barrier layer;
   an intermediate barrier layer formed on the floating conducting layer and having an asymmetric barrier whose barrier height is lower on the side of the floating conducting layer;
   a channel layer formed on the intermediate barrier layer;
   a thin barrier layer formed on the channel layer and having a resonant tunneling barrier; and
   a first electrode and a second electrode formed on the thin barrier layer.

5. A semiconductor memory device comprising:
   a semiconductor substrate;
   a non-doped thick barrier layer formed on the semiconductor substrate;
   an impurity doped floating layer formed on the thick barrier layer;
   a thin barrier layer formed on the floating conducting layer and having an asymmetric barrier whose barrier height is lower on the side of the floating conducting layer;
   a channel layer formed on the thin barrier layer; and
   a first electrode and a second electrode formed on the channel layer.

6. A semiconductor memory device according to claim 1, wherein
   the thin barrier layer is non-doped semiconductor layer; and
   the channel layer is a impurity-doped semiconductor layer.

7. A semiconductor memory device according to claim 2, wherein
   the thin barrier layer is non-doped semiconductor layer; and
   the channel layer is a impurity-doped semiconductor layer.

8. A semiconductor memory device according to claim 3, wherein
   the thin barrier layer is non-doped semiconductor layer; and
   the channel layer is a impurity-doped semiconductor layer.

9. A semiconductor memory device according to claim 4, wherein
   the thin barrier layer is non-doped semiconductor layer; and the channel layer is a impurity-doped semiconductor layer.

10. A semiconductor memory device according to claim 5, wherein
the thin barrier layer is non-doped semiconductor layer; and
the channel layer is a impurity-doped semiconductor layer.

11. A semiconductor memory device according to claim 1, wherein
the thin barrier layer has a part thereof on the side of the channel layer doped with a impurity;
the channel layer is a non-doped semiconductor layer; and
a two-dimensional electron channel is formed in the channel layer by electron supplied by the thin barrier layer.

12. A semiconductor memory device according to claim 2, wherein
the thin barrier layer has a part thereof on the side of the channel layer doped with a impurity;
the channel layer is a non-doped semiconductor layer; and
a two-dimensional electron channel is formed in the channel layer by electron supplied by the thin barrier layer.

13. A semiconductor memory device according to claim 3, wherein
the thin barrier layer has a part thereof on the side of the channel layer doped with a impurity;
the channel layer is a non-doped semiconductor layer; and
a two-dimensional electron channel is formed in the channel layer by electron supplied by the thin barrier layer.

14. A semiconductor memory device according to claim 4, wherein
the thin barrier layer has a part thereof on the side of the channel layer doped with a impurity;
the channel layer is a non-doped semiconductor layer; and
a two-dimensional electron channel is formed in the channel layer by electron supplied by the thin barrier layer.

15. A semiconductor memory device according to claim 5, wherein
the thin barrier layer has a part thereof on the side of the channel layer doped with a impurity;
the channel layer is a non-doped semiconductor layer; and
a two-dimensional electron channel is formed in the channel layer by electron supplied by the thin barrier layer.

16. A method for storing information in a semiconductor memory device having a semiconductor substrate, a non-doped thick barrier layer formed on the semiconductor substrate, an impurity doped floating conducting layer formed on the thick barrier layer, a thin barrier layer formed on the floating conducting layer and having an asymmetric barrier whose barrier height is higher on the side of the floating conducting layer, a channel layer formed on the thin barrier layer, and a first electrode and a second electrode formed on the channel layer, said method comprising the steps of:
applying a write bias voltage which makes a potential of the second electrode higher than that of the first electrode so as to inject electrons from the first electrode to the floating conducting layer through the thin barrier layer, thereby writing information in the floating conducting layer; and
applying a read bias voltage lower than the write bias voltage between the first and the second electrodes to read the information stored in the floating conducting layer based on whether or not a current flows in the channel layer.

17. A method for storing information in a semiconductor memory device having a semiconductor substrate, a non-doped thick barrier layer formed on the semiconductor substrate, an impurity doped floating conducting layer formed on the thick barrier layer, a thin barrier layer formed on the floating conducting layer and having an asymmetric resonant tunneling barrier whose resonance level is higher on the side of the floating conducting layer, a channel layer formed on the thin barrier layer, and a first electrode and a second electrode formed on the channel layer, said method comprising the steps of:
applying a write bias voltage which makes a potential of the second electrode higher than that of the first electrode so as to inject electrons from the first electrode to the floating conducting layer through the thin barrier layer, thereby writing information in the floating conducting layer;
applying a read bias voltage lower than the write bias voltage between the first and the second electrodes to read the information stored in the floating conducting layer based on whether or not a current flows in the channel layer; and
applying an erase bias voltage higher than the write bias voltage between the first and the second electrodes so as to discharge the electrons accumulated in the floating conducting layer from the second electrode through the thin barrier layer, thereby erasing the information stored in the floating conducting layer.

18. A method for storing information in a semiconductor memory device having a semiconductor substrate, a non-doped thick barrier layer formed on the semiconductor substrate, an impurity doped floating conducting layer formed on the thick barrier layer, an intermediate barrier layer formed on the floating conducting layer and having an asymmetric barrier whose barrier height is lower on the side of the floating conducting layer, a channel layer formed on the intermediate barrier layer, a thin barrier layer formed on the channel layer and having a symmetric barrier whose barrier height is substantially constant, and a first electrode and a second electrode formed on the thin barrier layer, said method comprising the steps of:
applying a write bias voltage which makes a potential of the second electrode higher than that of the first electrode so as to inject electrons from the first electrode to the floating conducting layer through the thin barrier layer, thereby writing information in the floating conducting layer;
applying a read bias voltage lower than the write bias voltage between the first and the second electrodes to read the information stored in the floating conducting layer based on whether or not a current flows in the channel layer; and
applying an erase bias voltage higher than the write bias voltage between the first and the second electrodes so as to discharge the electrons accumulated in the floating conducting layer from the second electrode through the thin barrier layer, thereby erasing the information stored in the floating conducting layer.

19. A method for storing information in a semiconductor memory device having a semiconductor substrate, a non-doped thick barrier layer formed on the semiconductor substrate, an impurity doped floating conducting layer formed on the thick barrier layer, an intermediate barrier layer formed on the floating conducting layer and having an asymmetric barrier whose barrier height is lower on the side of the floating conducting layer, a channel layer formed on the intermediate barrier layer, a thick barrier layer formed on the channel layer and having a resonant tunneling barrier, and a first electrode and a second electrode formed on the thin barrier layer, said method comprising the steps of:
- applying a write bias voltage which makes a potential of the second electrode higher than that of the first electrode so as to inject electrons from the first electrode to the floating conducting layer through the thin barrier layer, thereby writing information in the floating conducting layer;
- applying a read bias voltage lower than the write bias voltage between the first and the second electrodes to read the information stored in the floating conducting layer based on whether or not a current flows in the channel layer; and
- applying an erase bias voltage higher than the write bias voltage between the first and the second electrodes so as to discharge the electrons accumulated in the floating conducting layer from the second electrode through the thin barrier layer, thereby erasing the information stored in the floating conducting layer.

20. A method for storing information in a semiconductor memory device having a semiconductor substrate, a non-doped thick barrier layer formed on the semiconductor substrate, an impurity doped floating conducting layer formed on the thick barrier layer, a thin barrier formed on the floating conducting layer and having a asymmetric barrier whose barrier height is lower on the side of the floating conducting layer, a channel layer formed on the thin barrier layer, and a first electrode and a second electrode formed on the channel layer, said method comprising the steps of:
- applying a write bias voltage which makes a potential of the second electrode higher than that of the first electrode so as to discharge electrons from the floating conducting layer through the thin barrier layer and form an electron accumulated layer in the channel layer, thereby writing information in the floating conducting layer;
- applying a read bias voltage lower than the write bias voltage between the first and the second electrodes to read the information stored in the floating conducting layer, based on whether or not a current flows in the channel layer; and
- applying an erase bias voltage lower than the write bias voltage and higher than the read bias voltage between the first and the second electrodes so as to inject electrons into the floating conducting layer from the electron accumulated layer in the channel layer through the thin barrier layer, thereby erasing the information stored in the floating conducting layer.

21. A semiconductor memory device according to any one of claims 1 to 5, further comprising:
- means for applying forward or reverse bias voltages to the thin barrier layer to thereby accumulate electrons in the impurity doped floating conducting layer or to discharge the electrons in the impurity doped floating conducting layer.

* * * * *